(12) United States Patent
Peng et al.

(10) Patent No.: US 12,501,658 B2
(45) Date of Patent: Dec. 16, 2025

(54) MULTI-GATE FIELD-EFFECT TRANSISTORS AND METHODS OF FORMING THE SAME

(71) Applicant: Taiwan Semiconductor Manufacturing Company, Ltd., Hsin-Chu (TW)

(72) Inventors: Yu-Fan Peng, Hsinchu (TW); Yuan-Ching Peng, Hsinchu (TW); Yu-Bey Wu, Hsinchu (TW); Yu-Shan Lu, Hsinchu County (TW); Hung Yu Lai, Hsinchu (TW); Chen-Yu Chen, Taipei (TW); Wen-Yun Wang, Taipei (TW); Tang Ming Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 699 days.

(21) Appl. No.: 17/401,067

(22) Filed: Aug. 12, 2021

(65) Prior Publication Data

US 2023/0049938 A1  Feb. 16, 2023

(51) Int. Cl.
*H10D 30/67*  (2025.01)
*H10D 30/00*  (2025.01)
(Continued)

(52) U.S. Cl.
CPC ....... *H10D 30/6735* (2025.01); *H10D 30/014* (2025.01); *H10D 30/501* (2025.01); *H10D 30/6757* (2025.01); *H10D 62/118* (2025.01); *H10D 62/121* (2025.01); *H10D 64/017* (2025.01); *H10D 84/0135* (2025.01); *H10D 84/0151* (2025.01); *H10D 84/0153* (2025.01);
(Continued)

(58) Field of Classification Search
CPC ......... H01L 29/42392; H01L 29/78696; H01L 29/66545; H01L 29/0665; H01L 29/00; H01L 27/2454; H01L 3/1136; H01L 21/82348; H10D 30/014; H10D 30/501; H10D 30/6735; H10D 62/121; H10D 64/017; H10D 84/0135; H10D 84/0151; H10D 84/0153; H10D 84/832
USPC ....................................................... 257/401
See application file for complete search history.

(56) References Cited

U.S. PATENT DOCUMENTS 8,294,159 B2 * 10/2012  Or-Bach ............. H01L 27/0688
                                                              257/74
8,669,596 B2 *  3/2014  Tamaru ............... H01L 29/4238
                                                              257/206
(Continued)

*Primary Examiner* — Marcos D. Pizarro
(74) *Attorney, Agent, or Firm* — HAYNES AND BOONE, LLP

(57) ABSTRACT

A semiconductor structure includes a fin extending from a substrate and oriented lengthwise in a first direction, where the fin includes a stack of semiconductor layers, an isolation feature disposed over the substrate and oriented lengthwise in a second direction perpendicular to the first direction, where the isolation feature is disposed adjacent to the fin, and a metal gate structure having a top portion disposed over the stack of semiconductor layers and a bottom portion interleaved with the stack of semiconductor layers. Furthermore, a sidewall of the bottom portion of the metal gate structure is defined by a sidewall of the isolation feature, and the top portion of the metal gate structure laterally extends over a top surface of the isolation feature.

20 Claims, 47 Drawing Sheets

(51) Int. Cl.
*H10D 30/01* (2025.01)
*H10D 62/10* (2025.01)
*H10D 64/01* (2025.01)
*H10D 84/01* (2025.01)
*H10D 84/03* (2025.01)
*H10D 84/83* (2025.01)

(52) U.S. Cl.
CPC ......... *H10D 84/038* (2025.01); *H10D 84/832* (2025.01)

(56) References Cited

U.S. PATENT DOCUMENTS

| | | | |
|---|---|---|---|
| 9,997,618 B2* | 6/2018 | Cheng | H01L 21/0217 |
| 2021/0028068 A1* | 1/2021 | Dentoni Litta | H01L 29/6656 |
| 2021/0098594 A1* | 4/2021 | Chen | H01L 21/31053 |
| 2021/0217860 A1* | 7/2021 | Ha | H01L 29/1033 |
| 2021/0257359 A1* | 8/2021 | Lai | H01L 29/66795 |
| 2021/0336019 A1* | 10/2021 | Su | H01L 21/76897 |
| 2021/0366908 A1* | 11/2021 | Pan | H01L 29/78696 |
| 2022/0013662 A1* | 1/2022 | Shen | H01L 29/41791 |
| 2022/0093521 A1* | 3/2022 | Ma | H01L 23/49838 |
| 2022/0130991 A1* | 4/2022 | Yu | H01L 29/78696 |
| 2022/0173097 A1* | 6/2022 | Yang | H01L 27/0886 |
| 2022/0328649 A1* | 10/2022 | Chen | H01L 27/0886 |
| 2022/0352334 A1* | 11/2022 | Yang | H01L 29/78618 |

* cited by examiner

MULTI-GATE FIELD-EFFECT TRANSISTORS AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

A nanosheet field-effect transistor (NS FET or alternatively referred to as a gate-all-around, or GAA, FET), which is a type of a multi-gate transistor, may generally include a stack of channel layers (such as Si layers) disposed over an active region (e.g., a fin), source/drain (S/D) features formed over or in the active region, and a metal gate stack interleaved with the stack of channel layers and interposed between the S/D features. While existing methods of forming NS FETs have been generally adequate, they have not been entirely satisfactory in all aspects. For example, inadvertent overlay shift during the patterning of dummy gate stacks may cause structural defects that lead to degradation of device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
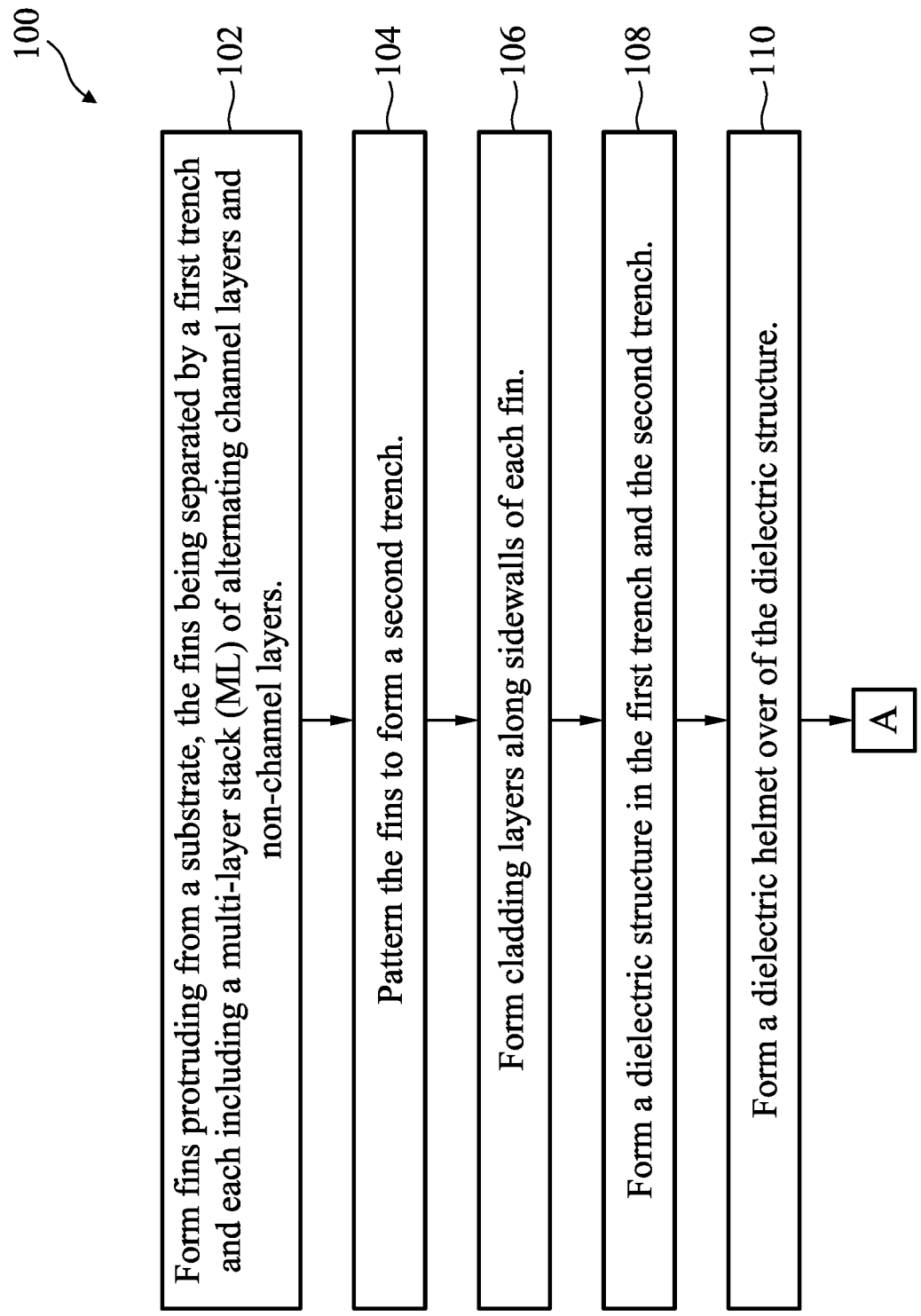
FIGS. 1A and 1B illustrate a flowchart of an example method for fabricating a semiconductor structure according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to FETs, such as three-dimensional NS FETs, in memory and/or standard logic cells of an IC structure. Generally, an NS FET includes a plurality of vertically stacked sheets (e.g., nanosheets), wires (e.g., nanowires), or rods (e.g., nanorods) in a channel region of the FET. The present disclosure includes multiple embodiments. Different embodiments may have different advantages, and no particular advantage is necessarily required of any embodiment.

Figure 1B:
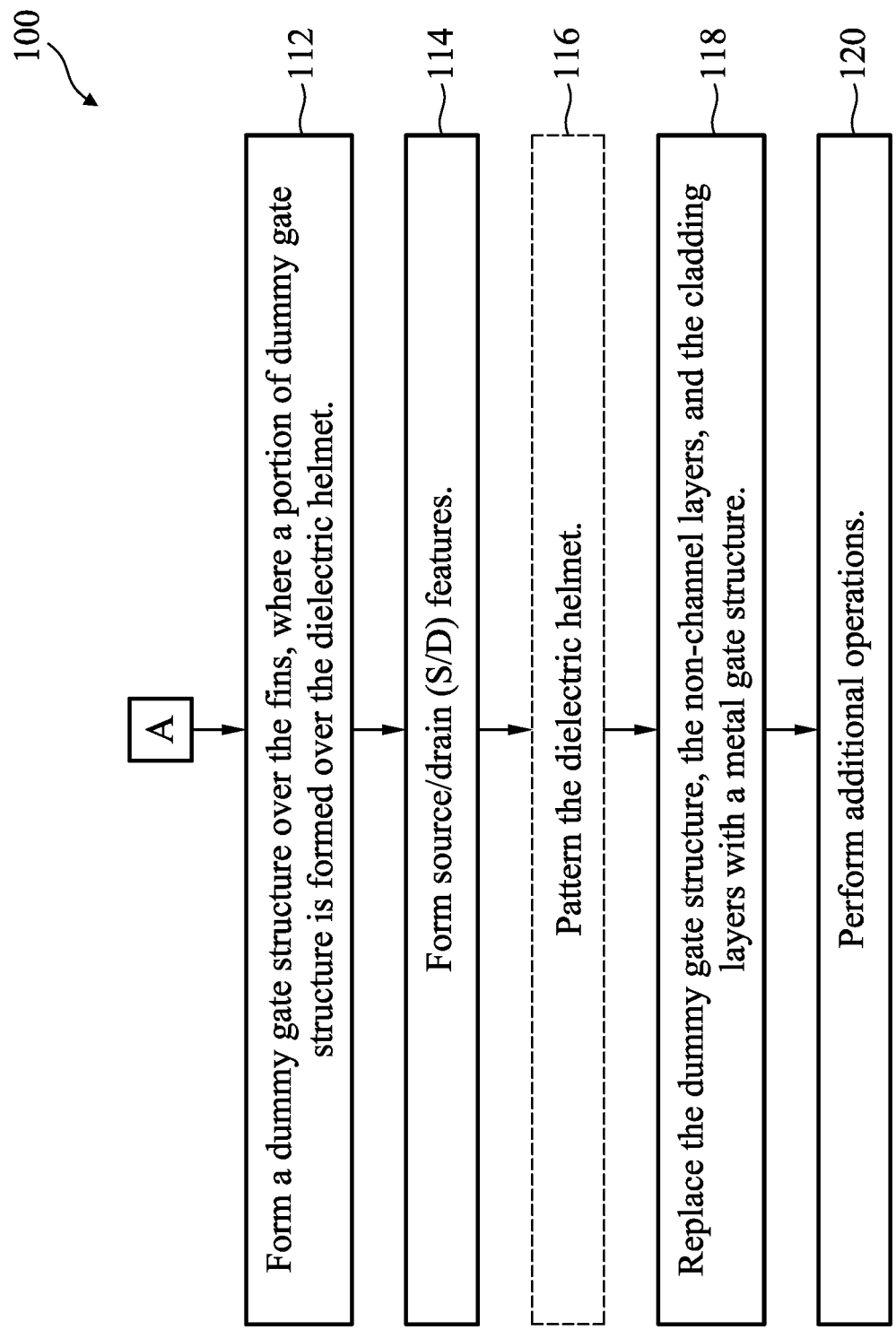
Figure 14:
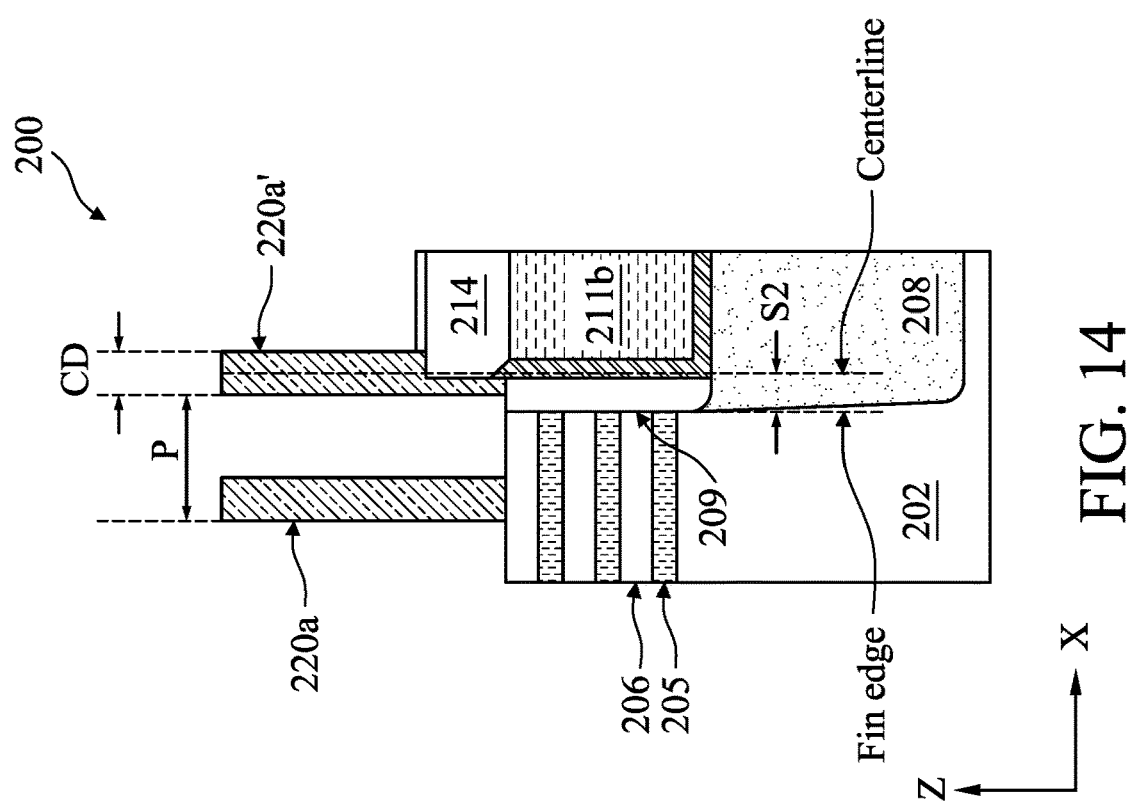
FIGS. 13 and 14 are cross-sectional views of an example semiconductor structure according to various embodiments of the present disclosure.

Referring now to FIGS. 1A and 1B collectively, a flowchart of a method 100 of forming a semiconductor structure (hereafter simply referred to as the structure) 200 is illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 2A-16D, where FIGS. 2A, 3A, 4A, 5A, 6A, 7A, 8A, 9A-1, 9A-2, 10A, 11A-1, 11A-2, 12, 15A, and 16A are planar top views of the structure 200 according to some embodiments; FIGS. 2B, 3B, 4B, 5B, 6B, 7C, 8C, 9B, 10B, 11B, 15C, and 16C are cross-sectional views of the structure 200 taken along line AA' as shown in FIGS. 2A, 3A, 4A, 5A, 6A, 7A, 8A, 9A-1, 10A, 11A-1, 15A, and 16A, respectively, according to some embodiments; FIGS. 2C, 3C, 4C, 5C, 6C, 7D, 8D, 15D, and 16D are cross-sectional views of the structure 200 taken along line BB' as shown in FIGS. 2A, 3A, 4A, 5A, 6A, 7A, 8A, 15A, and 16A, respectively, according to some embodiments; FIGS. 8E, 9C, 10C, and 11C are cross-sectional views of the structure 200 taken along line CC' as shown in FIGS. 8A, 9A-1, 10A, and 11A-1, respectively, according to some embodiments; FIGS. 8F, 9D, 10D, and 11D are cross-sectional views of the structure 200 taken along line DD' as shown in FIGS. 8A, 9A-1, 10A, and 11A-1, respectively, according to some embodiments; FIGS. 7B, 8B, 15B, and 16B are three-dimensional perspective views of a portion of the structure 200 as shown in FIGS. 7A, 8A, 15A, and 16A, respectively, according to some embodiments; and FIGS. 13 and 14 are cross-sectional views of the structure 200 according to some embodiments. In the present embodiments, lines AA' are DD' are taken through an active three-dimensional device region (e.g., fin 204) along the X axis; line BB' is taken through a channel region of the fin along the Y axis; and line CC' is taken through a cladding layer (e.g., cladding layer 209) along the X axis.

The structure 200 may be an intermediate device fabricated during processing of an IC, or a portion thereof, that may comprise static random-access memory (SRAM) and/or logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the structure 200 includes one or more NS FETs. The present disclosure is not limited to any particular number of devices or device regions, or to any particular device configurations. Additional features can be added to the structure 200, and some of the features described below can be replaced, modified, or eliminated in other embodiments of the structure 200.

Figure 2A:
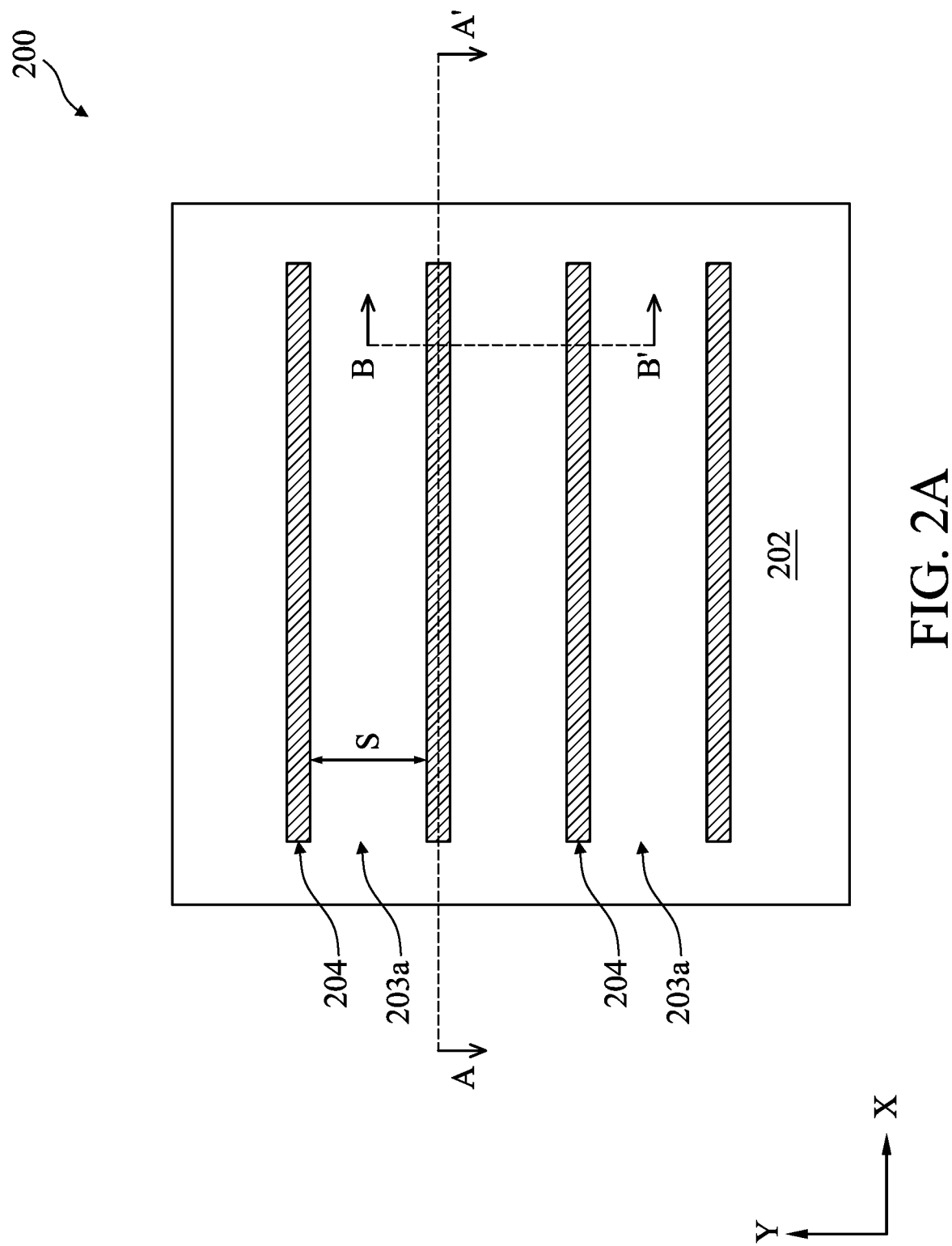
FIGS. 2A, 3A, 4A, 5A, 6A, 7A, 8A, 9A-1, 9A-2, 10A, 11A-1, 11A-2, 12, 15A, and 16A are planar top views of an example semiconductor structure according to various embodiments of the present disclosure.
Figure 2C:
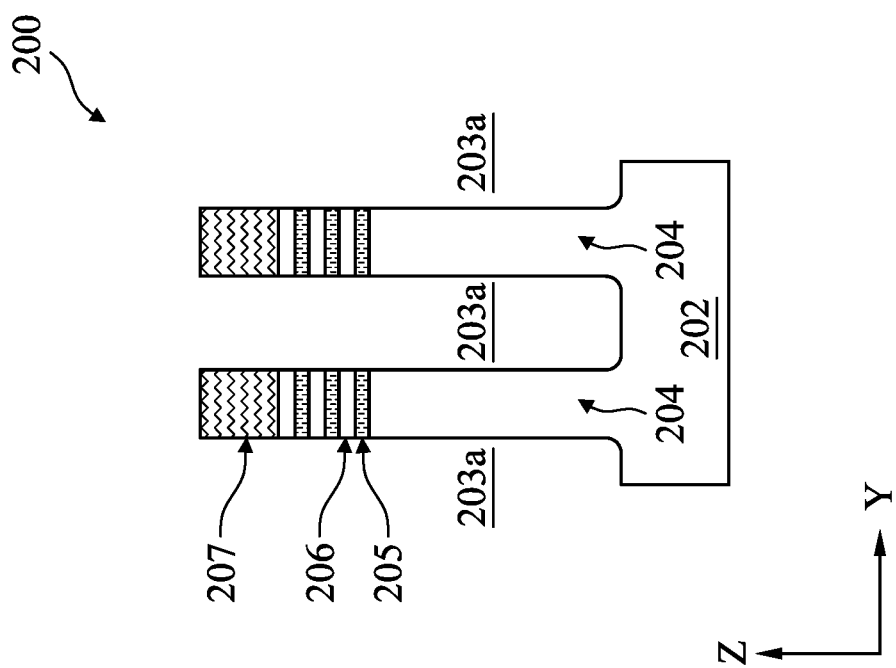
FIGS. 2C, 3C, 4C, 5C, 6C, 7D, 8D, 15D, and 16D are cross-sectional views of the semiconductor structure taken along line BB' as shown in FIGS. 2A, 3A, 4A, 5A, 6A, 7A, 8A, 15A, and 16A, respectively, during intermediate stages of the method shown in FIGS. 1A and/or 1B according to various embodiments of the present disclosure.
Figure 2B:
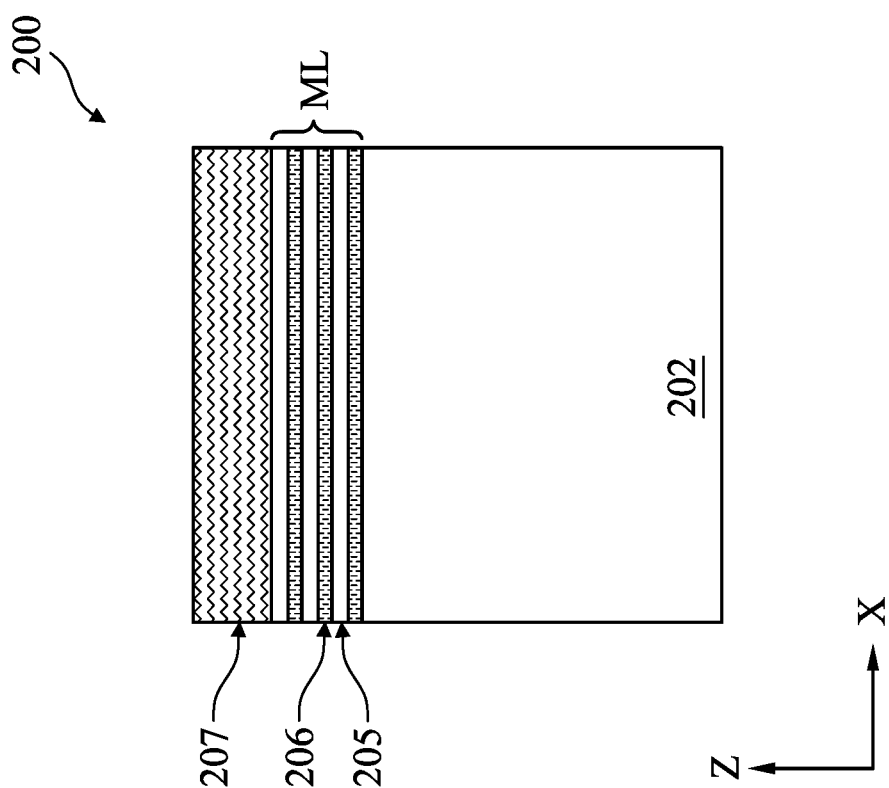
FIGS. 2B, 3B, 4B, 5B, 6B, 7C, 8C, 9B, 10B, 11B, 15C, and 16C are cross-sectional views of the semiconductor structure taken along line AA' as shown in FIGS. 2A, 3A, 4A, 5A, 6A, 7A, 8A, 9A-1, 10A, 11A-1, 15A, and 16A, respectively, during intermediate stages of the method shown in FIGS. 1A and/or 1B according to various embodiments of the present disclosure.

At operation 102, referring to FIGS. 2A-2C, method 100 forms the structure 200 that includes multiple active three-dimensional device regions 204 (hereafter referred to as fins 204) protruding from a semiconductor substrate 202 (hereafter referred to as the substrate 202), where adjacent fins 204 are separated by a trench 203a having a width S defined along the Y axis.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In the present embodiments, referring to FIGS. 2B and 2C, each fin 204 includes a multi-layer structure (ML) of alternating non-channel layers (or sacrificial layers) 205 and channel layers 206 stacked vertically over protruding portions of the substrate 202, as well as a hard mask layer 207 over the ML. In the present embodiments, the non-channel layers 205 are sacrificial layers configured to be removed at a subsequent processing step, thereby providing openings between the channel layers 206 for forming a metal gate stack therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layer 206 may include elemental Si and the non-channel layer 205 may include elemental Ge. In some examples, each fin 204 may include a total of three to ten pairs of alternating non-channel layers 205 and channel layers 206. Other configurations may also be applicable depending upon specific design requirements.

In the present embodiments, the hard mask layer 207 is a sacrificial layer configured to facilitate the formation of a gate isolation feature (discussed in detail below) and subsequently be removed from the structure 200. As such, a thickness of the hard mask layer 207 may be adjusted based on the desired thickness of the gate isolation feature. In some embodiments, the thickness of the hard mask layer 207 is greater than a thickness of the non-channel layers 205 and the channel layers 206. The hard mask layer 207 may include any suitable material, such as a semiconductor material, so long as its composition is different from that of the subsequently-formed gate isolation feature and the channel layer 206 disposed thereunder to allow selective removal by an etching process. In some embodiments, the hard mask layer 207 has a composition similar to or the same as that of the non-channel layers 205 and includes, for example, SiGe.

In the present embodiments, forming the ML includes alternatingly growing the non-channel layers 205 and the channel layers 206 in a series of epitaxy processes. The epitaxy processes may be implemented by chemical vapor deposition (CVD) techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate stack is subsequently formed in the openings, thereby providing an NS FET. For embodiments in which the hard mask layer 207 has the same composition as the non-channel layers 205, the hard mask layer 207 may also be formed by a similar epitaxy process as discussed herein.

In the present embodiments, the fins 204 are fabricated from the ML (and the hard mask layer 207 disposed thereover) using a series of photolithography and etching processes. For example, the photolithography process may include forming a photoresist layer overlying the ML, exposing the photoresist layer to a pattern, performing post-exposure bake processes, and developing the exposed photoresist layer to form a patterned masking element (not depicted). The ML is then etched using the patterned masking element as an etch mask, thereby leaving the fins 204 protruding the substrate 202. The etching process may include dry etching, wet etching, reactive ion etching (RIE), other suitable processes, or combinations thereof. The patterned masking element is subsequently removed from the ML using any suitable process, such as ashing and/or resist stripping.

Numerous other embodiments of methods to form the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 202 and patterned using a photolithography process. Spacers are formed alongside the patterned sacrificial layer using a self-aligned process. The sacrificial layer is then removed, and the remaining spacers, or mandrels, may then be used to pattern the fins 204.

Figure 3A:
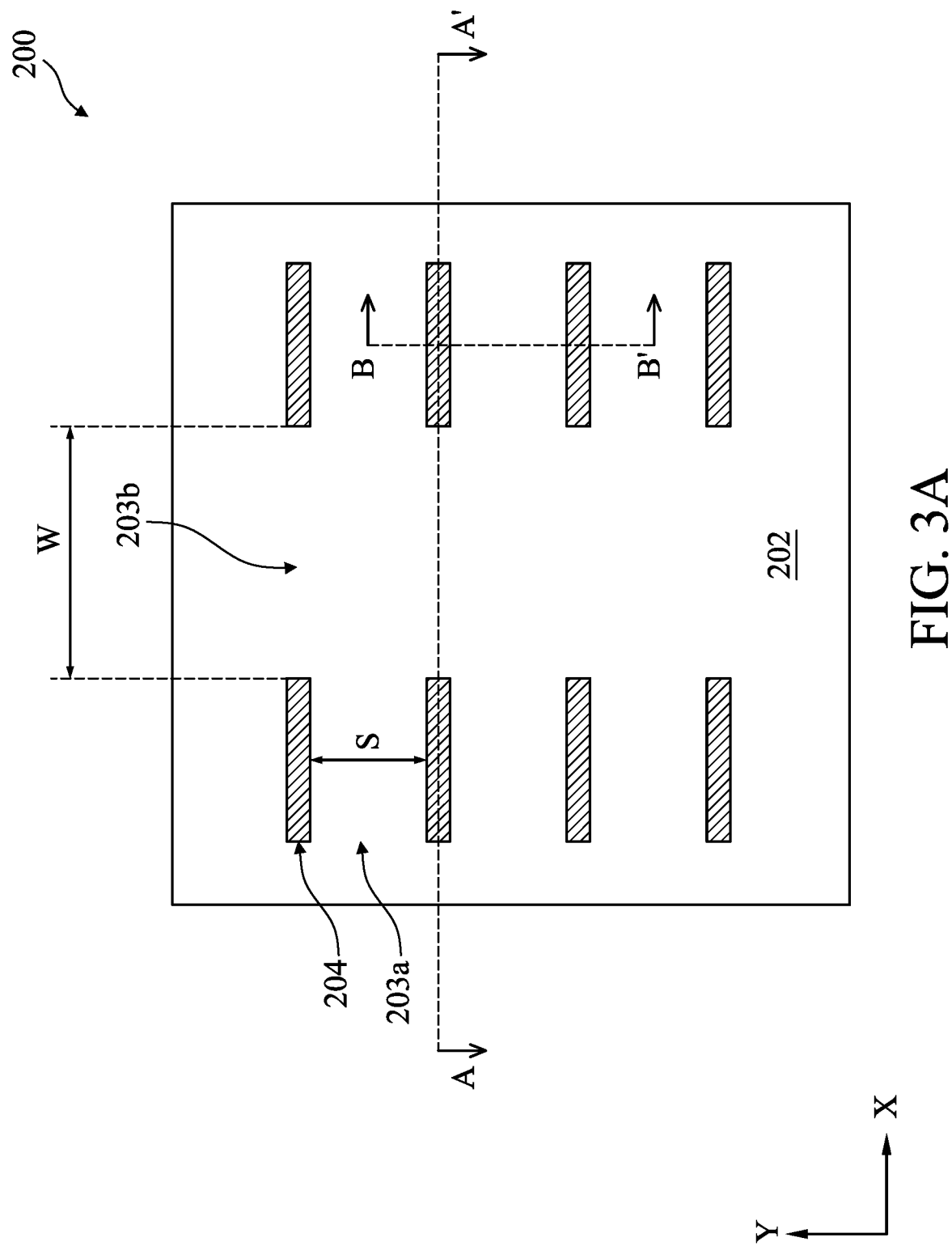
Figure 3C:
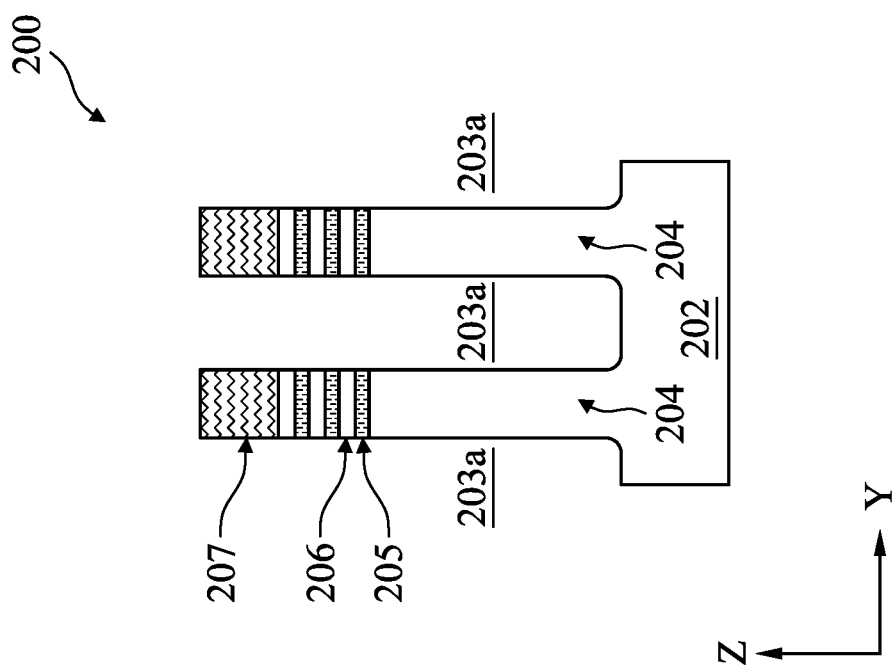
Figure 3B:
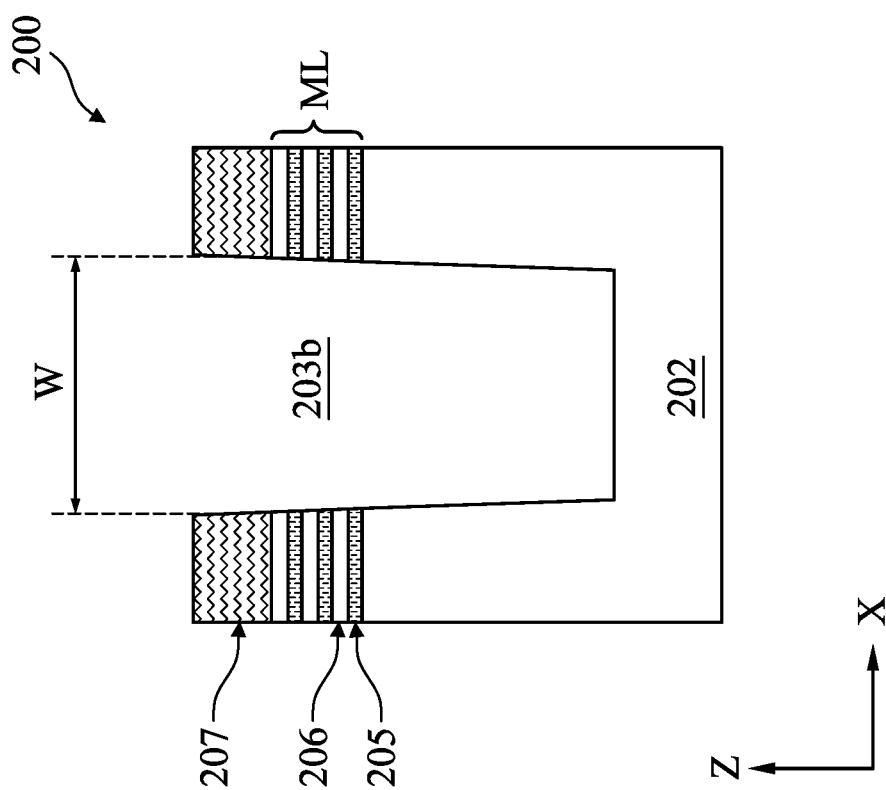

At operation 104, referring to FIGS. 3A-3C, method 100 patterns the fins 204 to from a trench 203b across the fins 204. The trench 203b extends through multiple fins 204 along a direction (e.g., the Y axis) that is substantially perpendicular to a lengthwise direction (e.g., the X axis) of the fins 204, thereby cutting (or separating) the fins 204. Method 100 at operation 104 may implement a series of lithography and etching processes similar to those implemented for forming the fins 204. For example, a patterned resist layer (not depicted) may first be formed over the fins 204 by a lithography patterning process, and an etching process is applied to the fins 204 to form the trench 203b using the patterned resist layer (and any hard mask layers disposed thereunder that is subsequently patterned) as an etch mask. After the formation of the trench 203b, the patterned resist layer is removed from the structure 200 by resist stripping or plasma ashing. In the present embodiments, the trench 203b is defined by a width W measured along the X axis. In the present embodiments, the width W is related to a pitch P between two adjacent dummy gate stacks (e.g., gate stacks 220a/220a') as discussed in detail below. Because dielectric features (e.g., dielectric structures 211 and dielectric helmet 214) to be formed in the trench 203b join ends of two adjacent fins 204 together and serve as a portion of a substrate over which the dummy gate stacks (and subsequently, metal gate stacks) are formed by a series of photolithography and etching processes, the width of the trench 203b is configured such that an ordered arrangement of the dummy gate stacks may be maintained. In this regard, the width W is generally configured as a multiple of the pitch P, or W~nP, where n is a positive integer such as 1, 2, 3, and so on. In the present disclosure, the notation "~" indicates two quantities being substantially the same, i.e., being within +/−10% of each other. In some embodiments, the width W is greater than the width S; though the present embodiments are not limited as such.

Figure 4A:
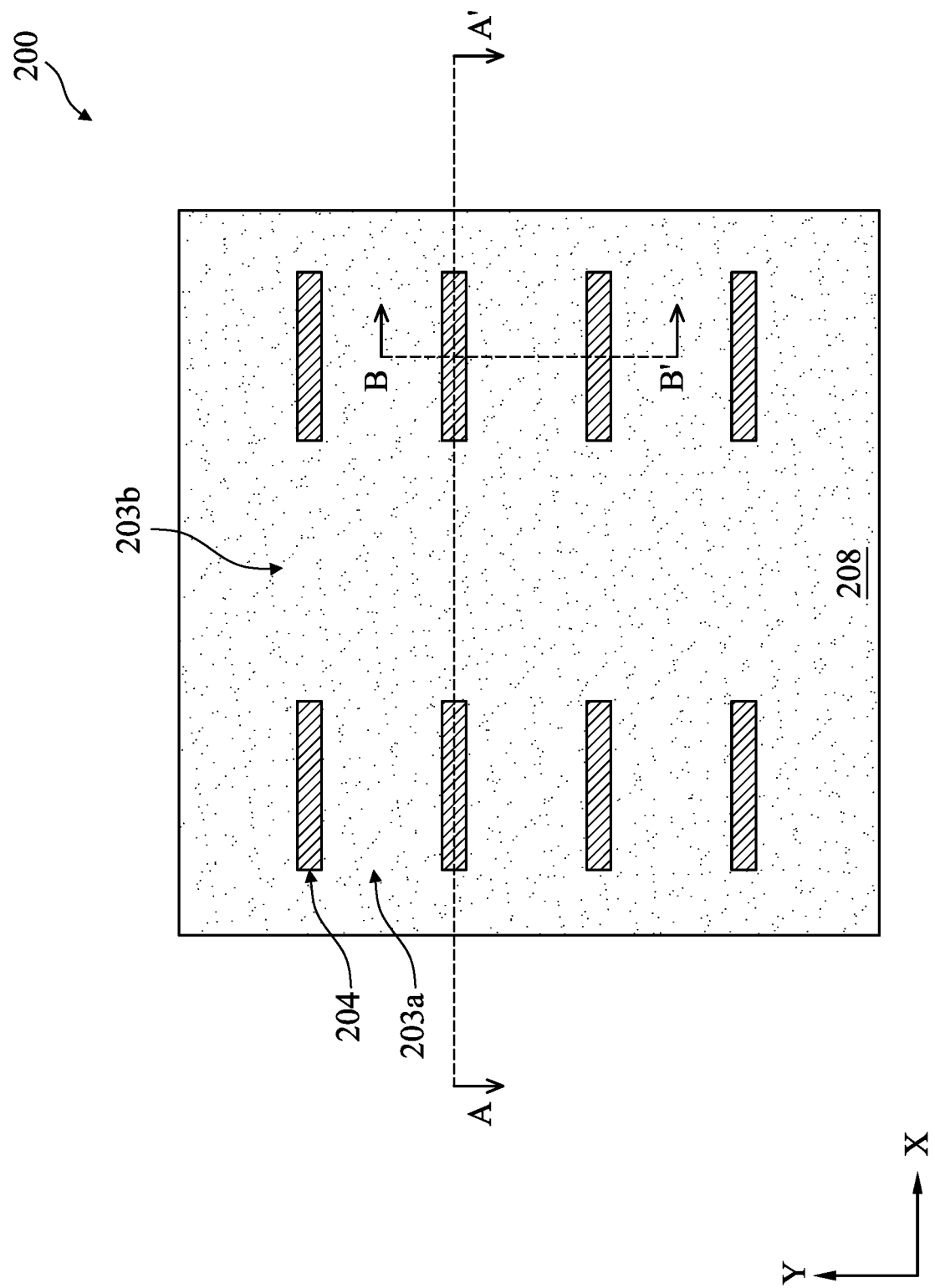
Figure 4C:
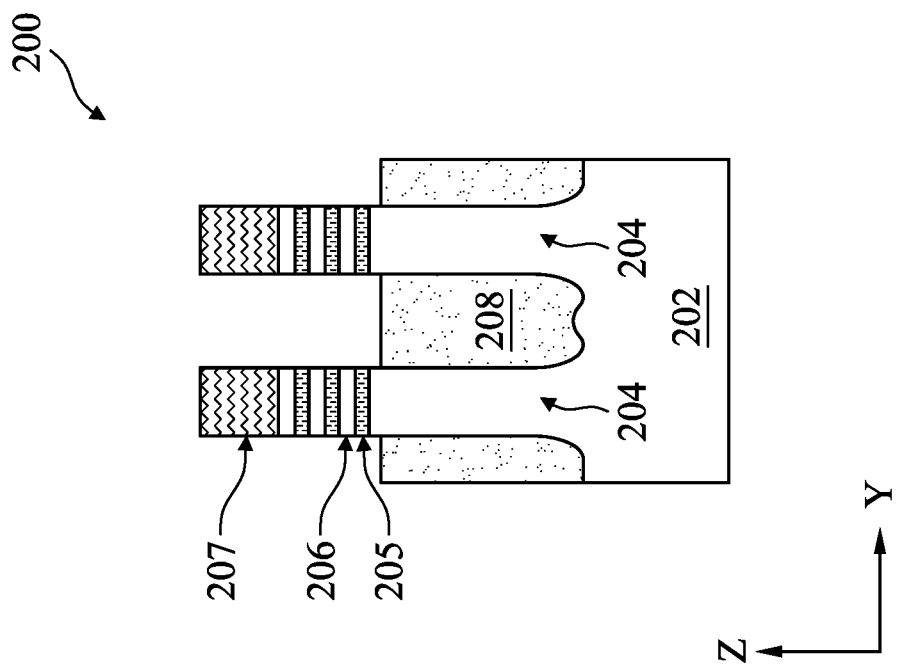
Figure 4B:
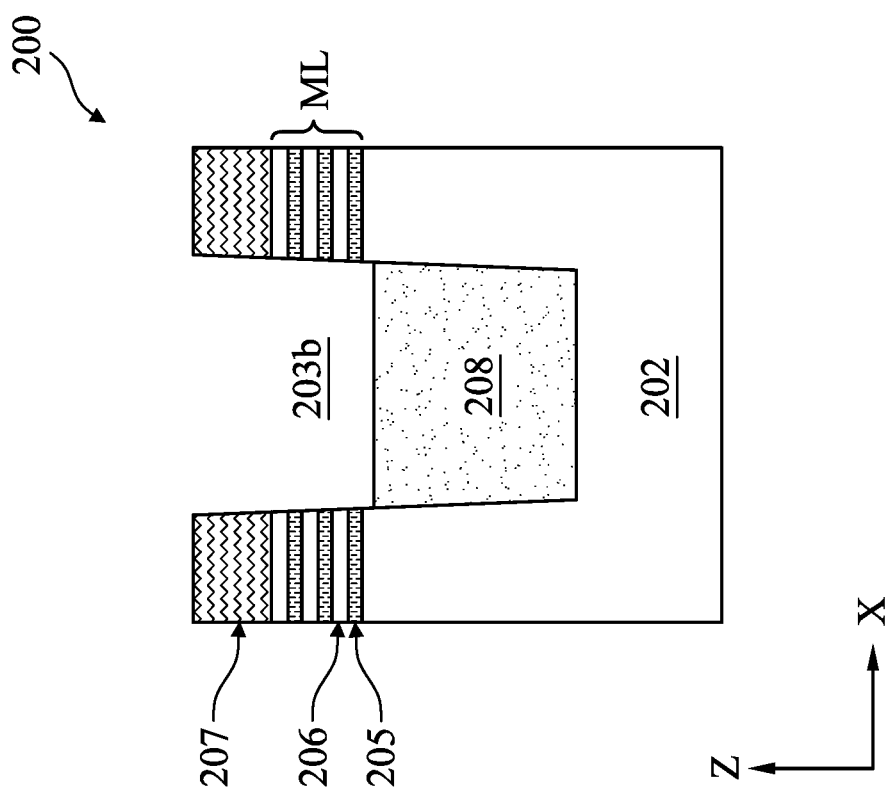

Subsequently, referring to FIGS. 4A-4C, method 100 at operation 104 forms isolation features 208, thereby partially filling the trenches 203a and 203b, where a top surface of the isolation features 208 is below the bottommost non-channel layer 205. The isolation features 208 may include silicon oxide (SiO and/or $SiO_2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation features 208 may include shallow trench isolation (STI) features. In some embodiments, the isolation features 208 are formed by filling trenches that separate the fins 204 with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 208. The isolation features 208 may include a single-layer structure or a multi-layer structure.

Figure 5A:
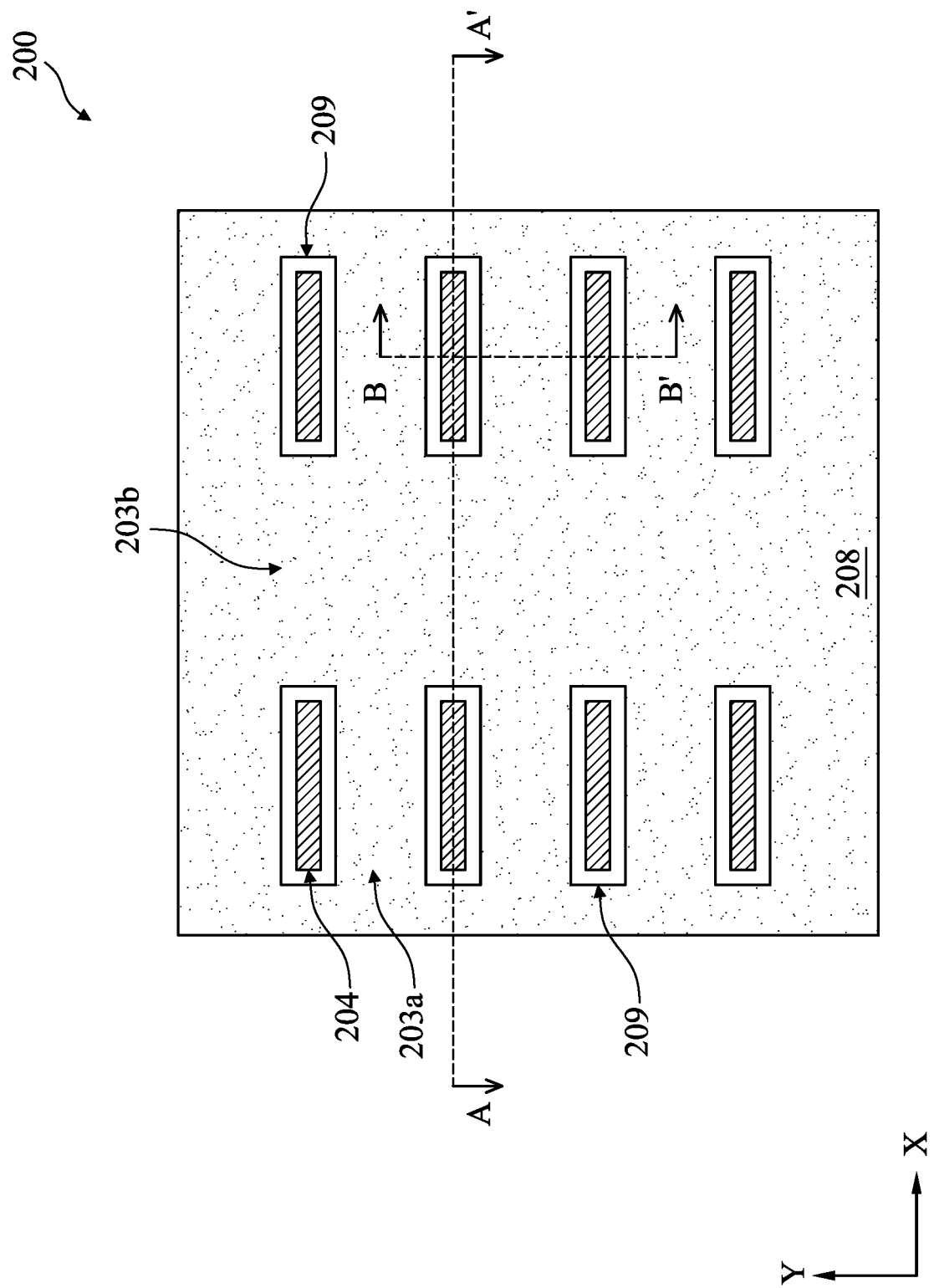
Figure 5C:
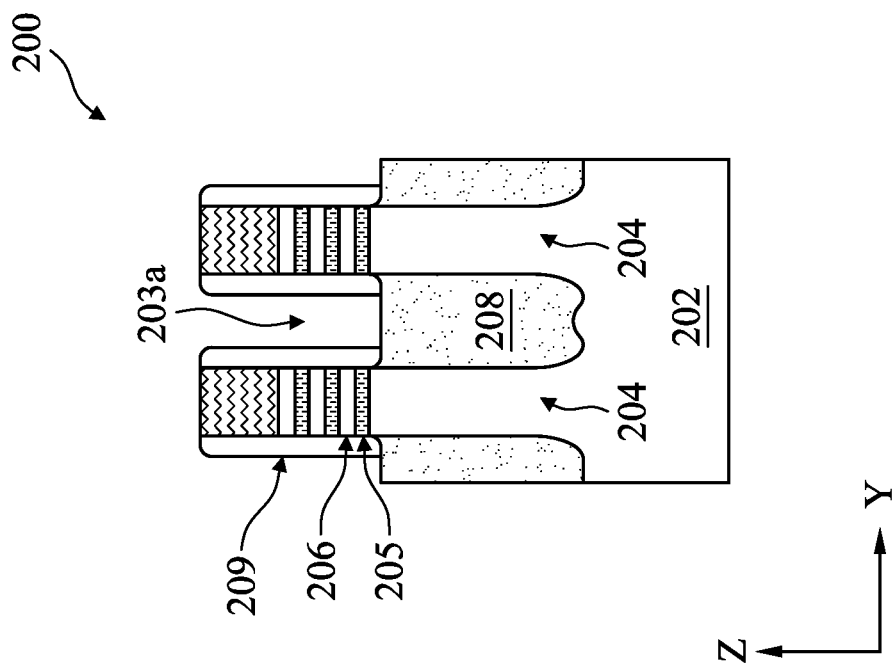
Figure 5B:
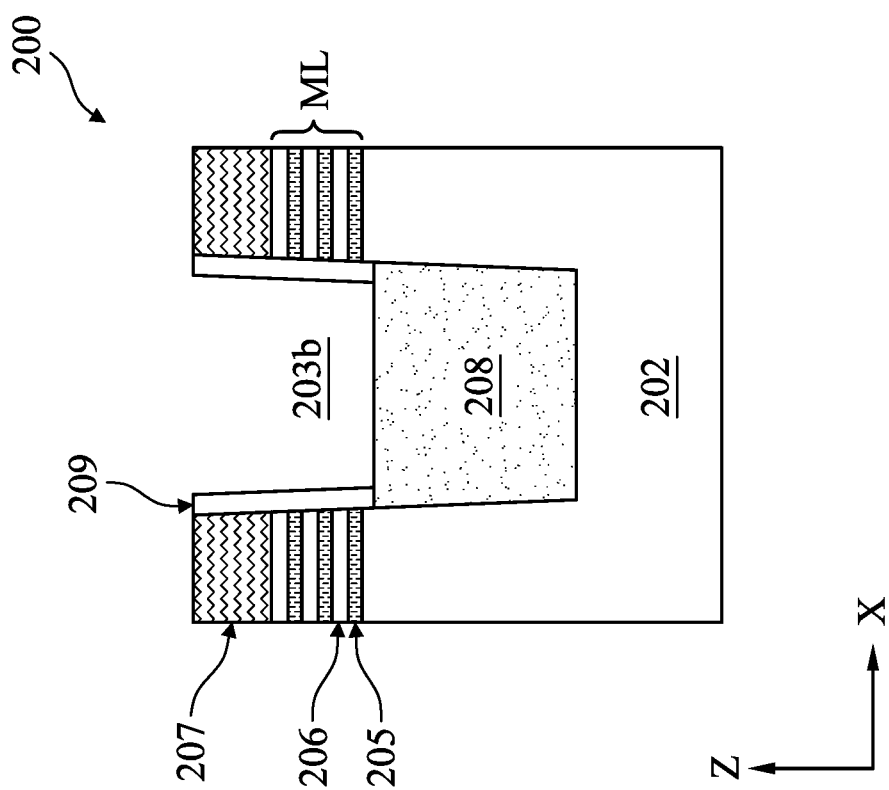

At operation 106, referring to FIGS. 5A-5C, method 100 forms cladding layers 209 along sidewalls of the fins 204 and over the isolation features 208 in the trenches 203a and 203b. In the present embodiments, the cladding layers 209 and the non-channel layers 205 are sacrificial layers configured to be replaced with a metal gate stack in a channel region of the fin 204. In the present embodiments, the cladding layers 209 have the same composition as the non-channel layers 205 and include SiGe. In some embodiments, the cladding layers 209 are grown epitaxially by a suitable method discussed above with respect to forming the ML. In some embodiments, the cladding layers 209 are deposited conformally, rather than grown epitaxially, over surfaces of the structure 200 as a blanket amorphous layer. In some examples, the cladding layers 209 may be formed to a thickness of about 5 nm to about 10 nm. Subsequently, method 100 performs an etching process to selectively remove portions of the cladding layer 209, thereby exposing portions of the isolation features 208 and a top surface of the hard mask layer 207. The etching process may include a dry etching process, a wet etching process, an RIE process, or combinations thereof.

Figure 6A:
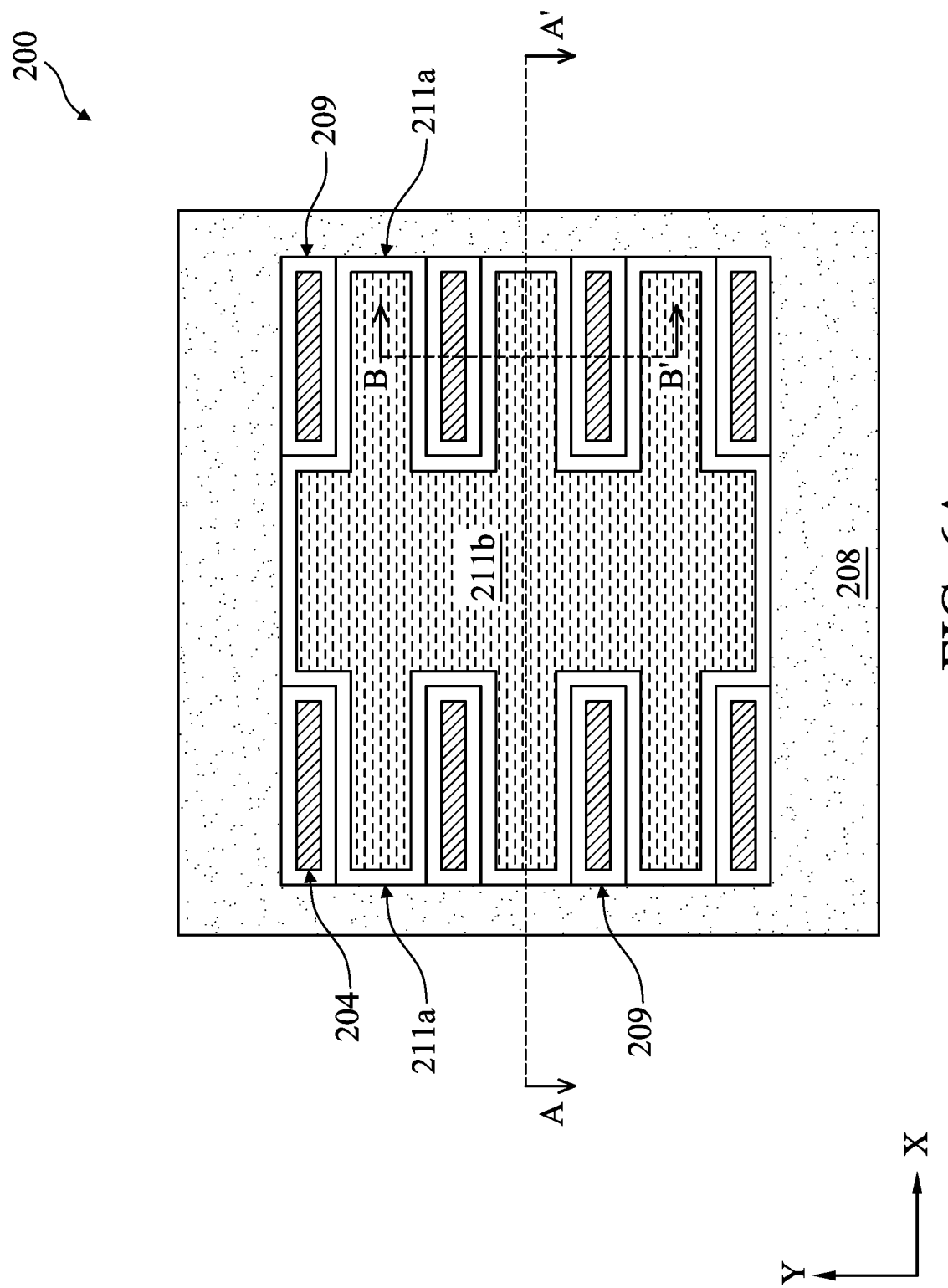
Figure 6B:
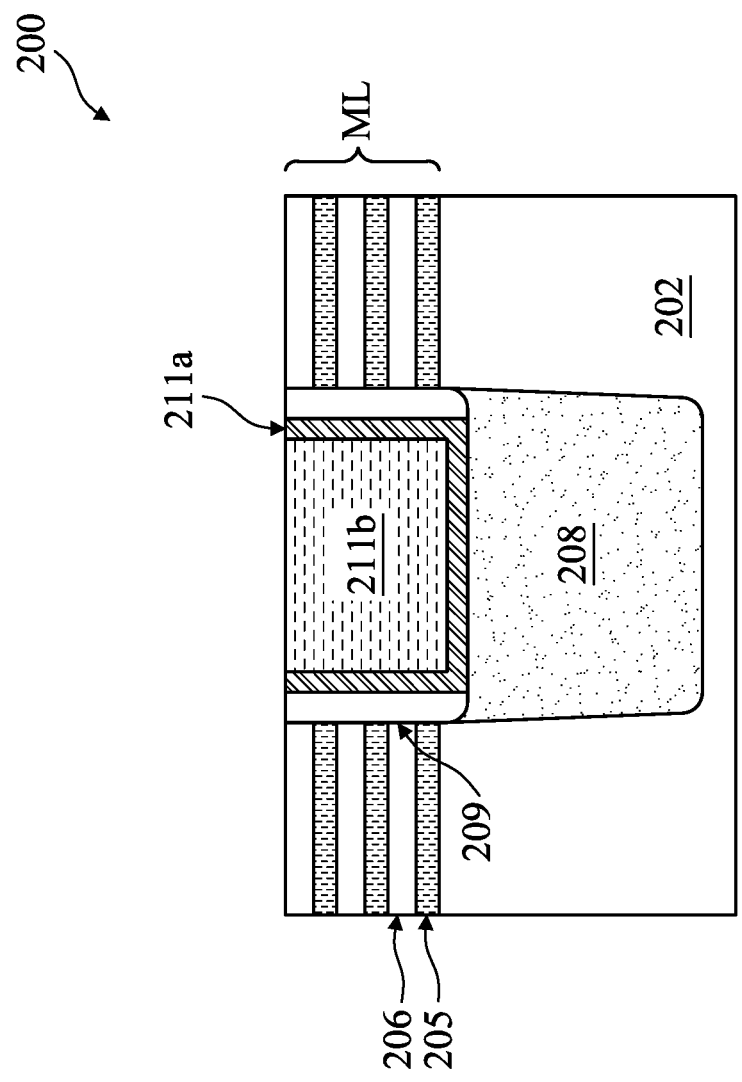
Figure 6C:
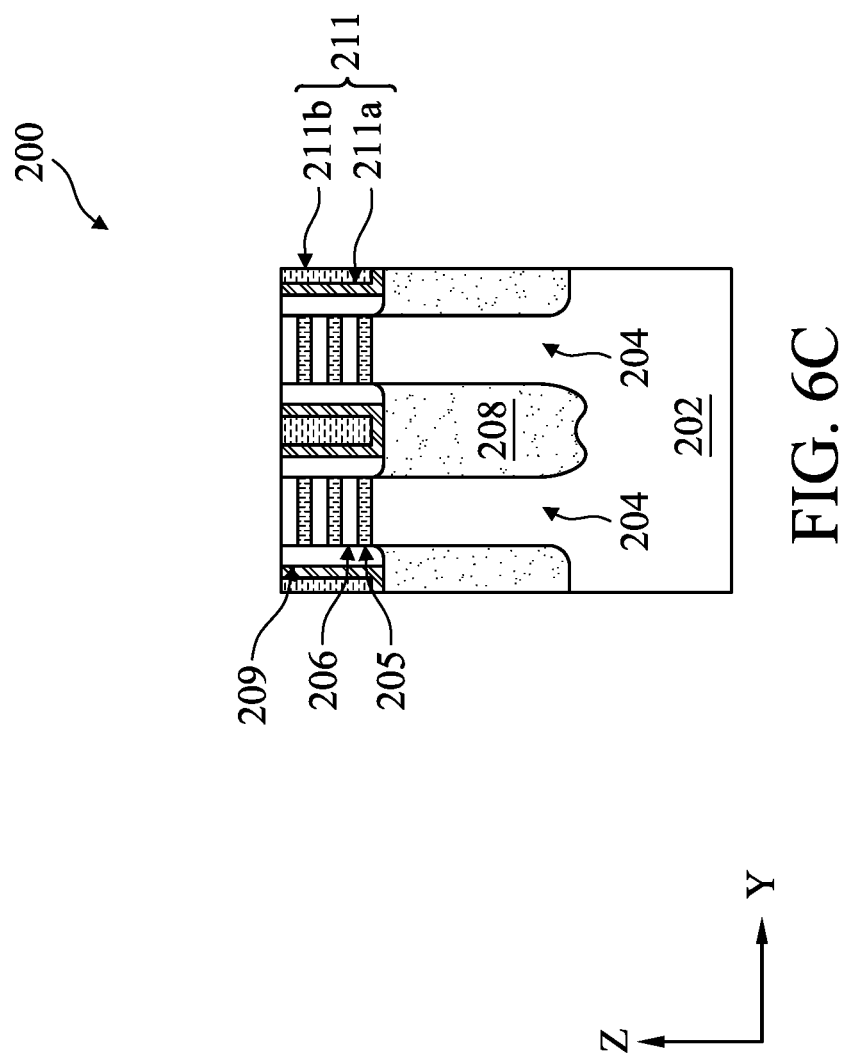
Figure 7A:
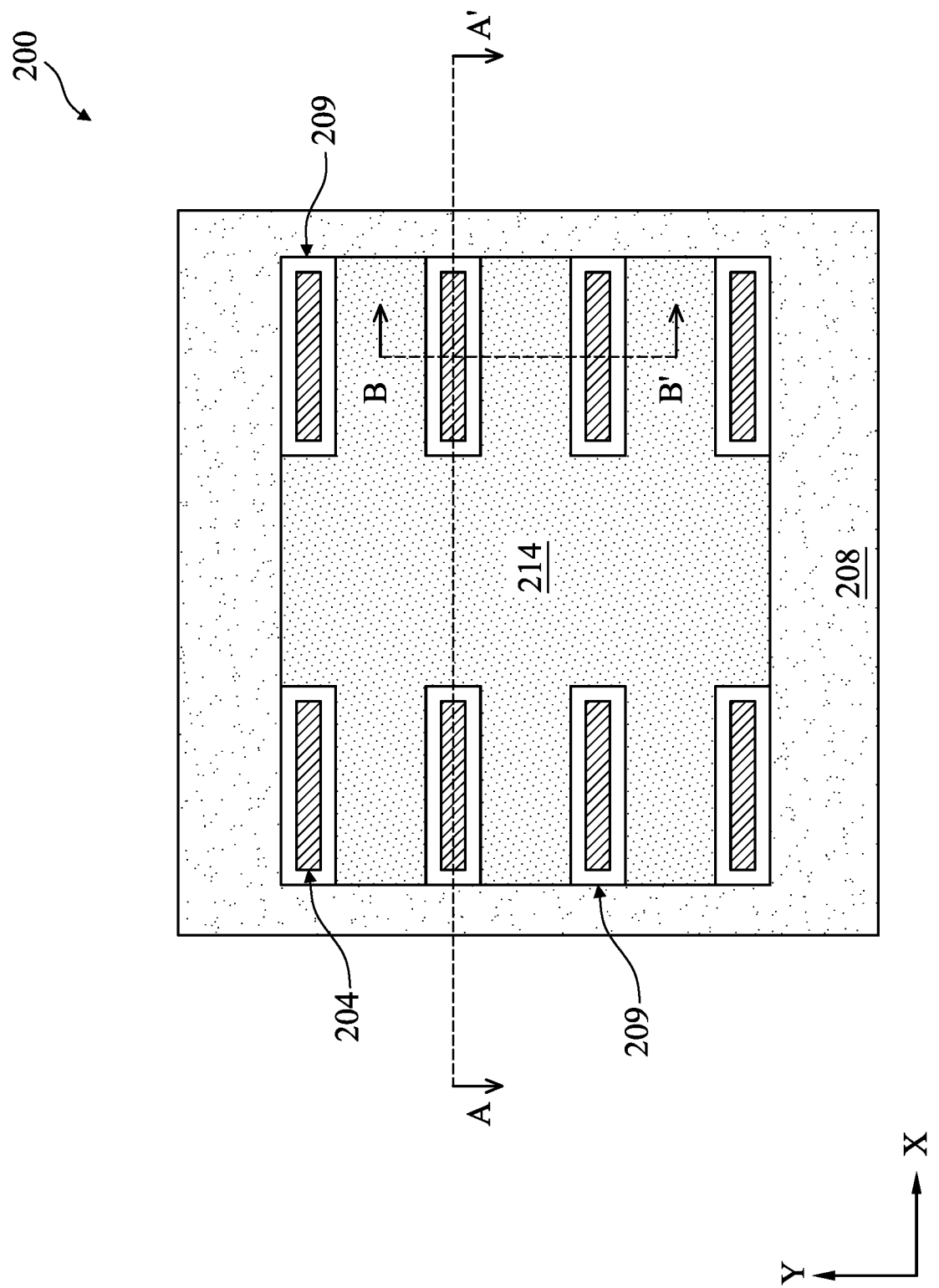
Figure 7B:
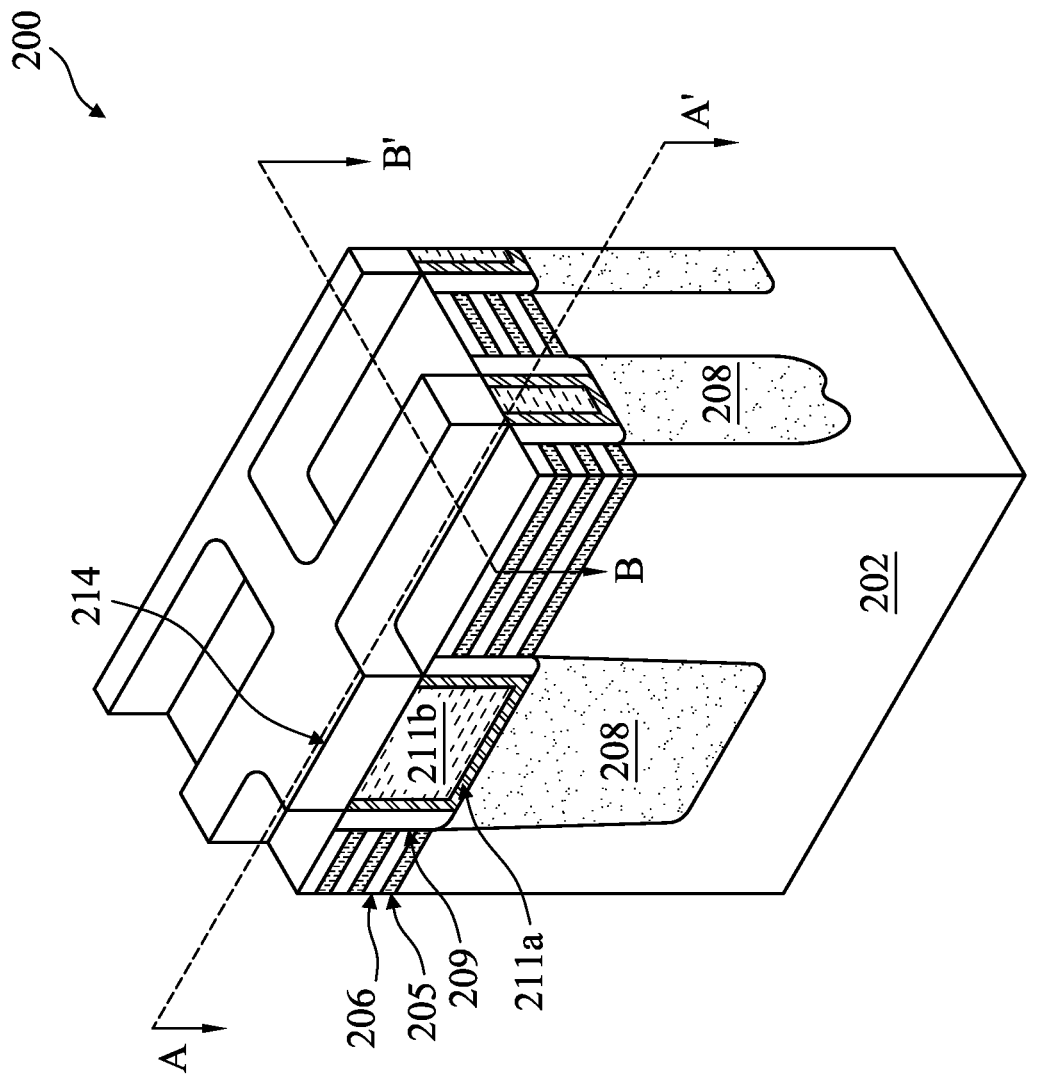
FIGS. 7B, 8B, 15B, and 16B are three-dimensional perspective views of a portion of the semiconductor structure as shown in FIGS. 7A, 8A, 15A, and 16A, respectively, according to various embodiments of the present disclosure.
Figure 7C:
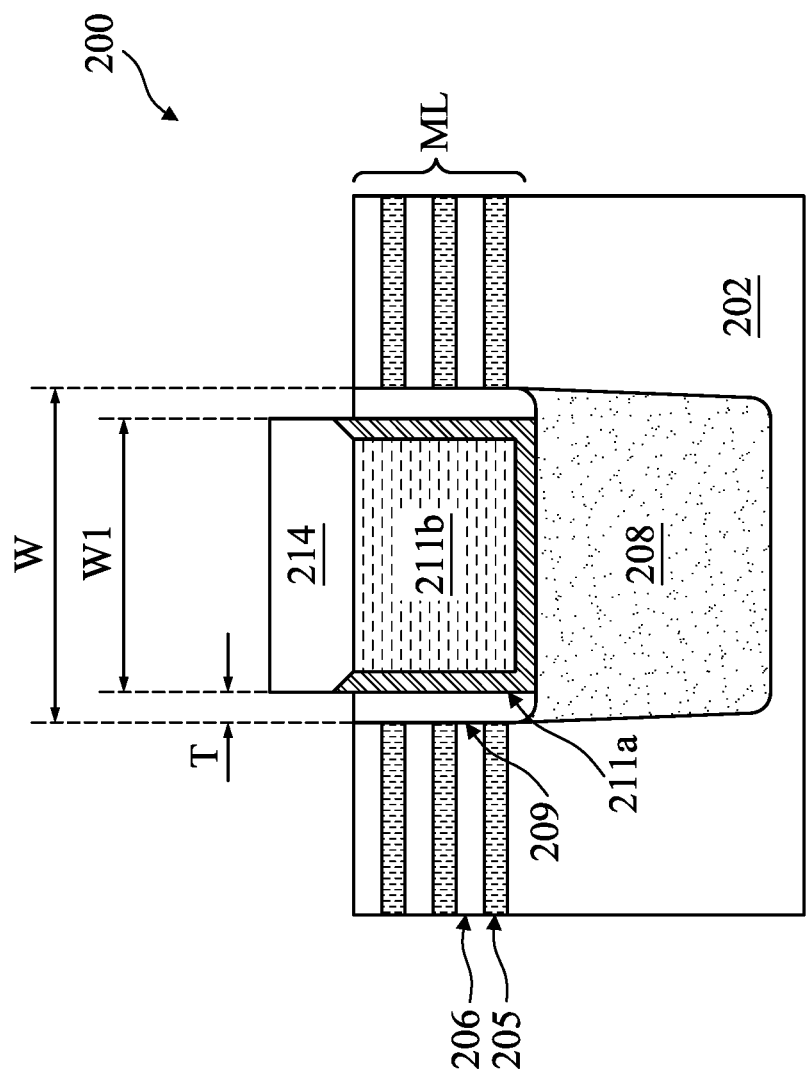
Figure 7D:
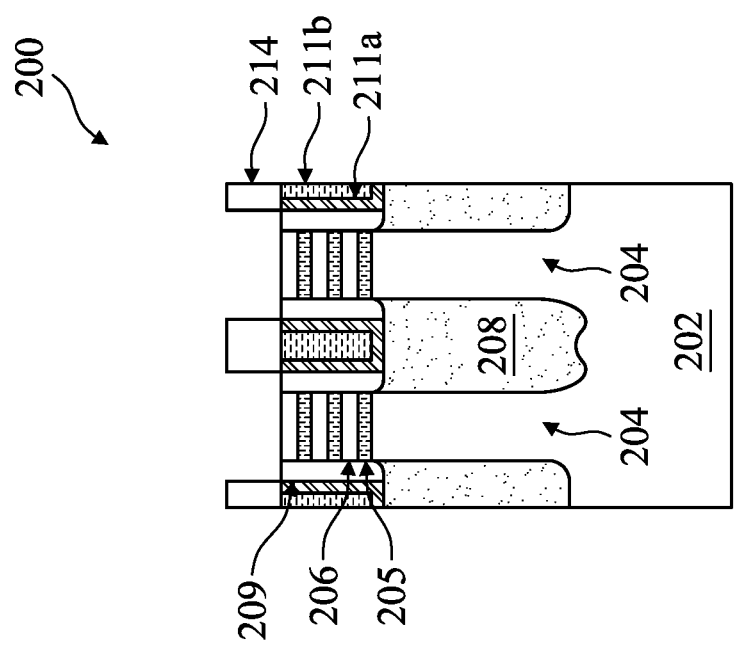

At operation 108, referring to FIGS. 6A-6C, method 100 forms a dielectric structure 211 over the isolation features 208 to completely fill the trenches 203a and 203b. The dielectric structure 211 is configured to isolate adjacent fins 204 and to provide a substrate over which the dielectric helmet 214 may be formed before forming dummy gate structure. The dielectric structure 211 may include any suitable material, such as SiO and/or $SiO_2$, silicon nitride (SiN), silicon carbide (SiC), oxygen-containing silicon nitride (SiON), oxygen-containing silicon carbide (SiOC), carbon-containing silicon nitride (SiCN), FSG, a low-k dielectric material, other suitable materials, or combinations thereof. The dielectric structure 211 may include a single-layer structure or a multi-layer structure as depicted herein, where the dielectric structure 211 includes a sub-layer 211b disposed over a sub-layer 211a. In some embodiments, the sub-layer 211a includes a nitrogen-containing dielectric material, such as SiN and/or SiCN, and the sub-layer 211b includes an oxygen-containing dielectric material, such as SiO and/or $SiO_2$. In some embodiments, the dielectric structure 211 and the isolation features 208 differ in composition. The dielectric structure 211 (or each sub-layer thereof) may be deposited by any suitable method, such as CVD, FCVD, SOG, other suitable methods, or combinations thereof, and subsequently planarized by one or more CMP processes, such that a top surface of the dielectric structure 211 is substantially co-planar with a top surface of the hard mask layer 207.

Subsequently, at operation 110, referring to FIGS. 7A-7D, method 100 forms the dielectric helmet 214 over the dielectric structure 211. The dielectric helmet 214 may include SiN, SiC, SiON, SiOC, SiCN, $Al_2O_3$, SiO and/or $SiO_2$, a high-k dielectric material (having a k value greater than that of silicon oxide, which is about 3.9), other suitable materials, or combinations thereof. In the present embodiments, the dielectric helmet 214 includes a high-k dielectric material for enhancing the etching resistance of the dielectric helmet 214 during the subsequent processing steps. The dielectric helmet 214 may include a single-layer structure or a multi-layer structure. In some embodiments, a dielectric constant of the dielectric helmet 214 is greater than that of the dielectric structure 211 and the isolation features 208. In the present embodiments, the dielectric helmet 214 is formed to a width W1, which is less than the width W of the trench 203b due to the presence of the cladding layers 209. In this regard, the width W is about the sum of the width W1 and thickness T of each cladding layer 209, or W~(W1+2T).

Method 100 may form the dielectric helmet 214 by first recessing a top portion of the dielectric structure 211 to form trenches, such that a top surface of the recessed dielectric structure 211 is substantially co-planar with the topmost channel layer 206. In other words, the resulting trenches (not depicted) formed over the recessed dielectric structure 211 each have a thickness corresponding to the thickness of the hard mask layer 207. The etching process may include any suitable process, such as a dry etching process, a wet etching process, an RIE process, other suitable processes, or combinations thereof. Then, method 100 proceeds to depositing one or more dielectric materials in the trenches and performing a CMP process to form the dielectric helmet 214. The one or more dielectric materials may be deposited by any suitable method, such as CVD, FCVD, ALD, other suitable methods, or combinations thereof. Subsequently, method 100 removes the hard mask layer 207 from the structure 200 to expose the topmost channel layer 206 of the ML. As such, the dielectric helmet 214 protrude from top surfaces of the fins 204. In the present embodiments, method 100 selectively removes the hard mask layer 207 without removing, or substantially removing, the dielectric helmet 214 and the topmost channel layer 206 of the ML.

In the present embodiments, the dielectric helmet 214 is configured to provide isolation between the subsequently-formed metal gate stacks over the fins 204. In other words, portions of the dielectric helmet 214 may be configured to truncate a metal gate stack into multiple portions. In this regard, the dielectric helmet 214 may be patterned to form one or more gate isolation features (or a gate cut feature) that are self-aligned with the underlying dielectric structure 211 and between fins 204.

Now referring to FIGS. 8A-8F, method 100 at operation 112 forms a dummy gate structure 220 over the substrate 202. In the present embodiments, the dummy gate structure 220 includes gate stacks 220a each disposed over a channel region of the fin 204 to form an NS FET, gate stacks 220a' disposed along edges of the fins 204 and over portions of the cladding layers 209, where the gate stacks 220a and 220a' are oriented lengthwise substantially along the Y axis, i.e., substantially perpendicular to the lengthwise direction of the fins 204, and a bridge structure 220b connecting two adjacent gate stacks 220a', where the bridge structure 220b is oriented lengthwise substantially along the X axis, i.e., substantially parallel to the lengthwise direction of the fins 204. In other words, the bridge structure 220b spans laterally (i.e., along the X axis) across a top surface of the dielectric helmet 214 disposed between the ends of two fins 204 separated along the X axis, thereby physically or directly connecting one gate stack 220a' to an adjacent gate stack 220a'. In this regard, the bridge structure 220b may be considered a "jog structure" to the gate stacks 220a'. In some embodiments, referring to FIGS. 8A and 8F, other than the portions being connected by the bridge structure 220b, the adjacent gate stacks 220a' are separated from each other by the dielectric helmet 214.

Figure 8A:
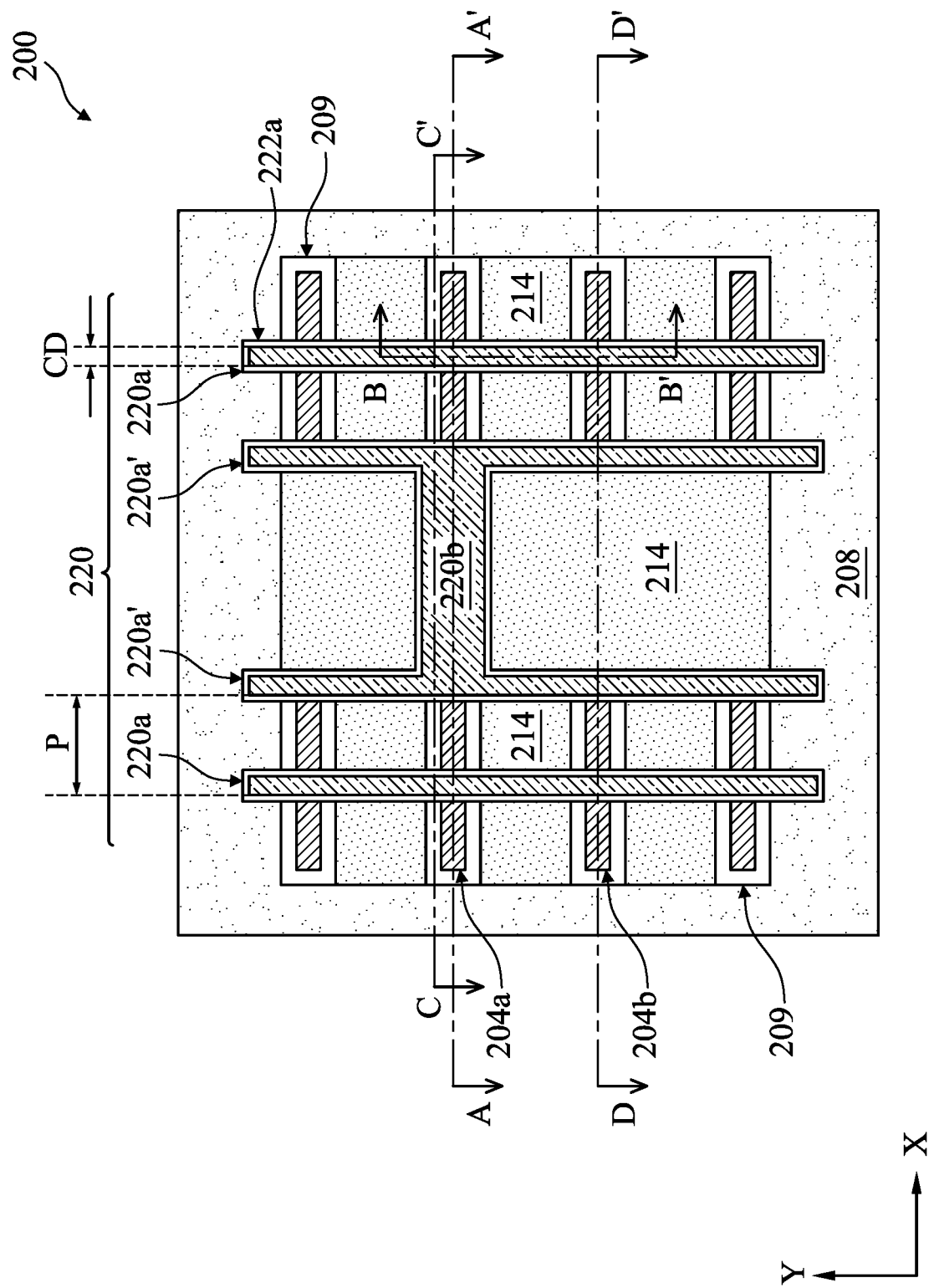
Figure 8B:
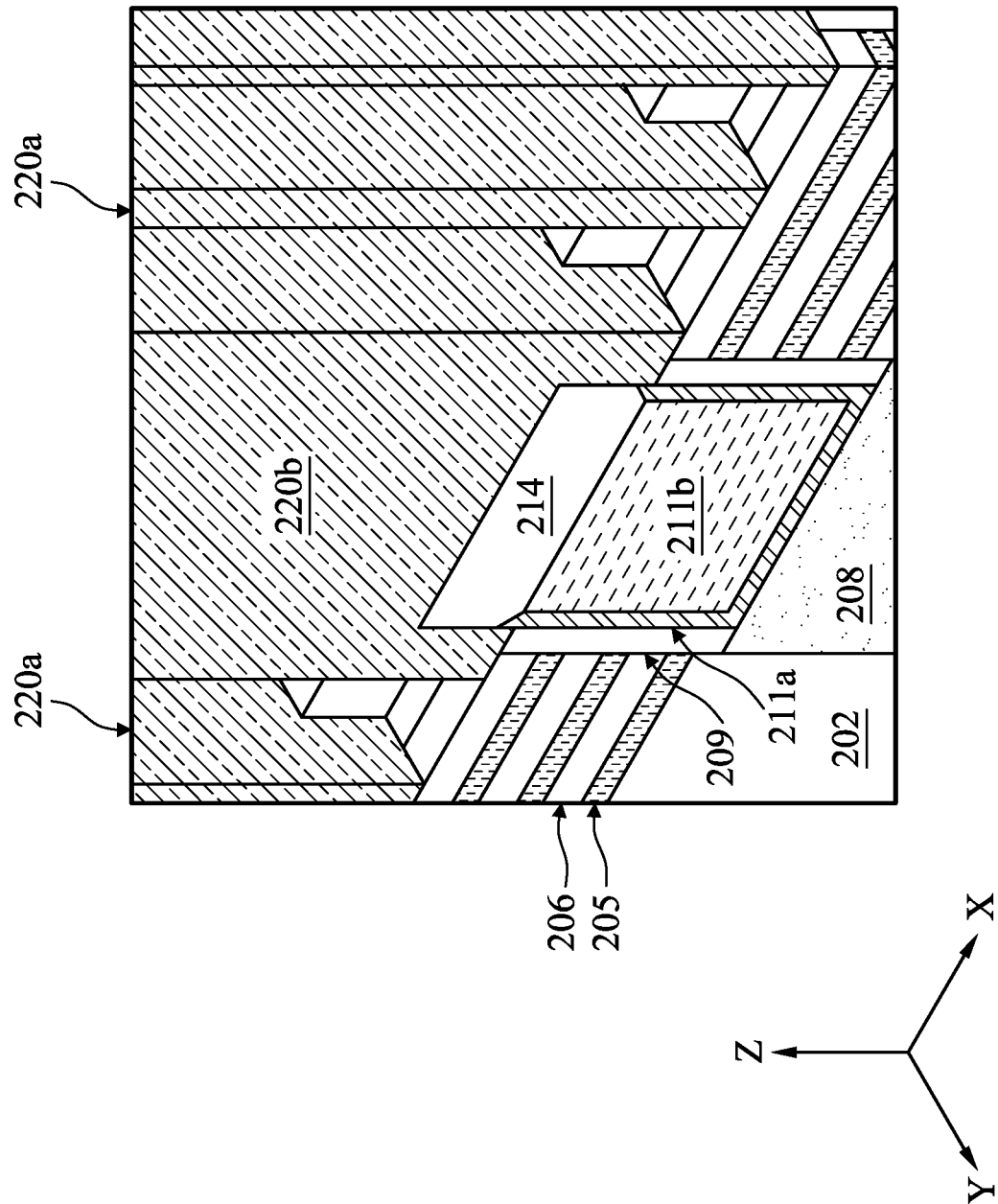
Figure 8C:
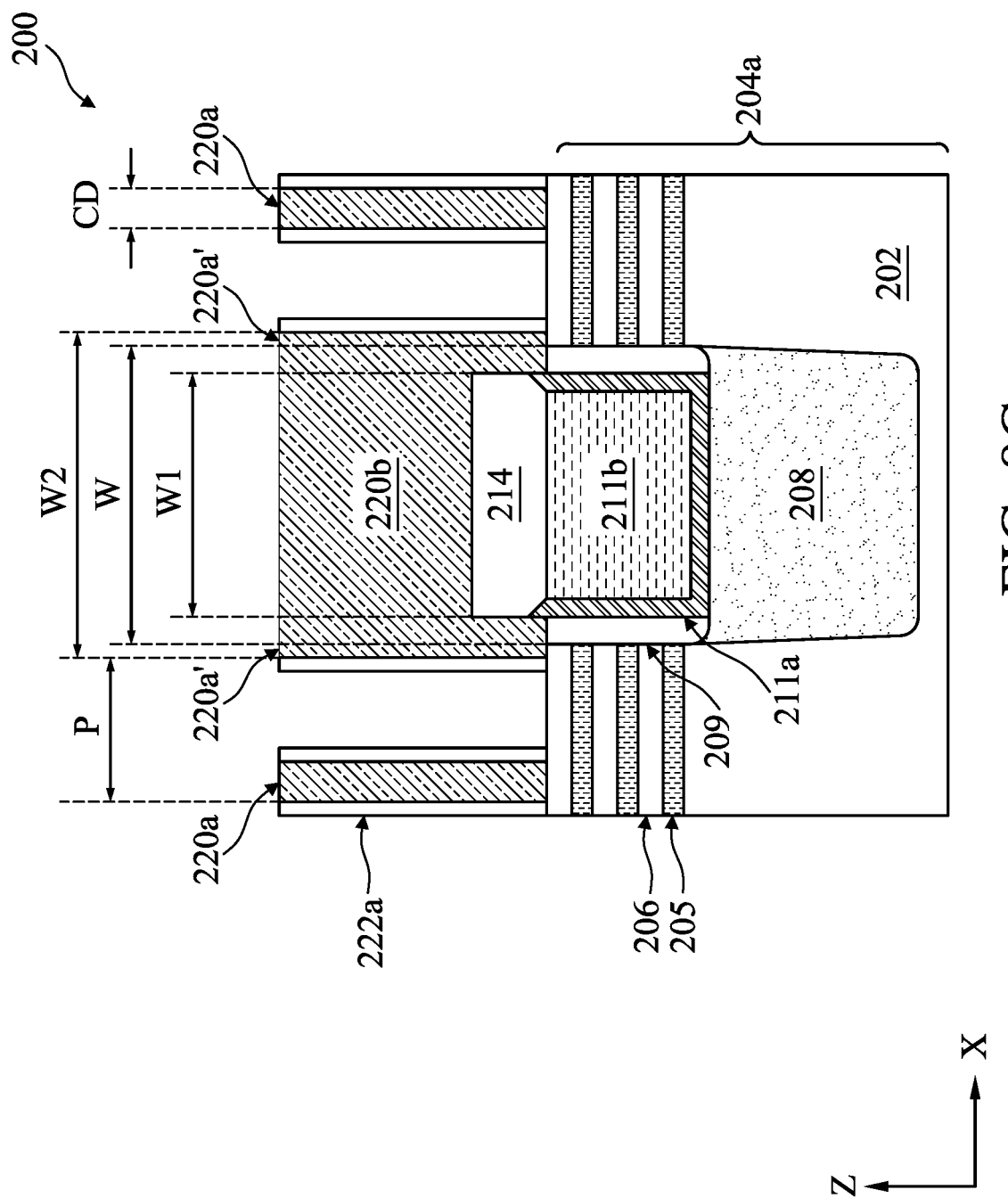
Figure 8D:
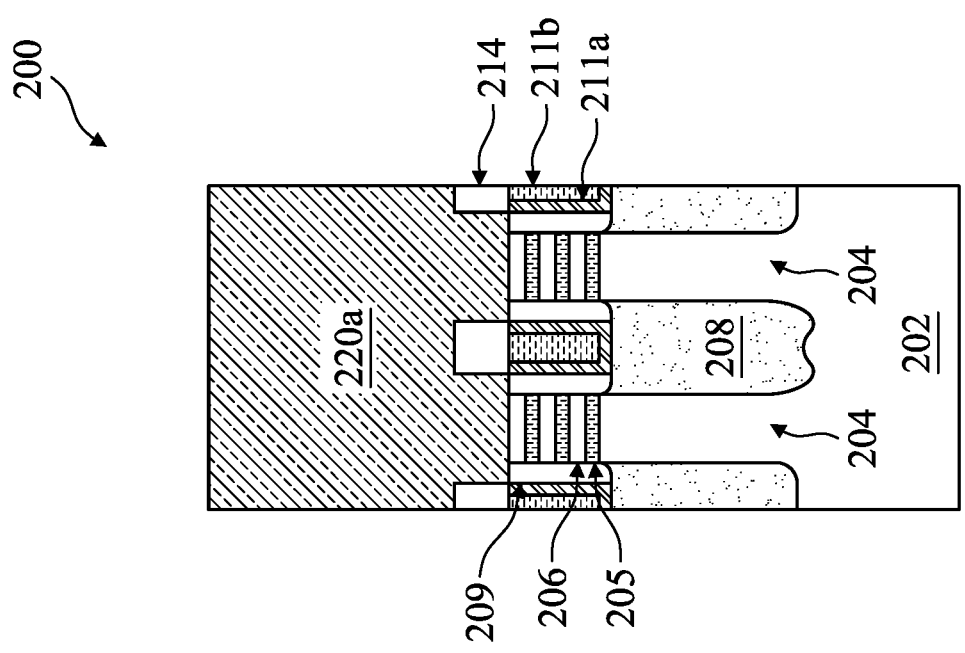

Referring to FIGS. 8A and 8C, in the present embodiments, the pitch (i.e., separation distance) between two adjacent gate stacks 220a and between a gate stack 220a and an adjacent gate stack 220a' is defined by P, a width (alternatively referred to as a gate length) of each of the gate stacks 220a and 220a' is defined by CD (i.e., critical dimension), and a distance between two outer sidewalls of the gate stacks 220a' is defined by W2, which is greater than the width W1 of the dielectric helmet 214 over which the bridge structure 220b is formed. In other words, referring to FIG. 8C, the bridge structure 220b is formed to cover the top and sidewall surfaces of the dielectric helmet 214 and is defined by the width W1 along the X axis. In the embodiments depicted in FIGS. 8A-8F, the width W, which is defined at operation 104, is about twice the pitch P, or W~2P, and the width W2 is greater than the width W. In some embodiments, the width W2 is about the sum of the width W and the width CD, or W2~(W+CD). Furthermore, the widths W1, W2, and CD may be related by the following equation: W2~(W1+2CD). In some examples, which are not limiting in the present disclosure, the width CD may be about 6 nm to about 11 nm and the pitch P may be about 39 nm to about 81 nm.

Figure 8E:
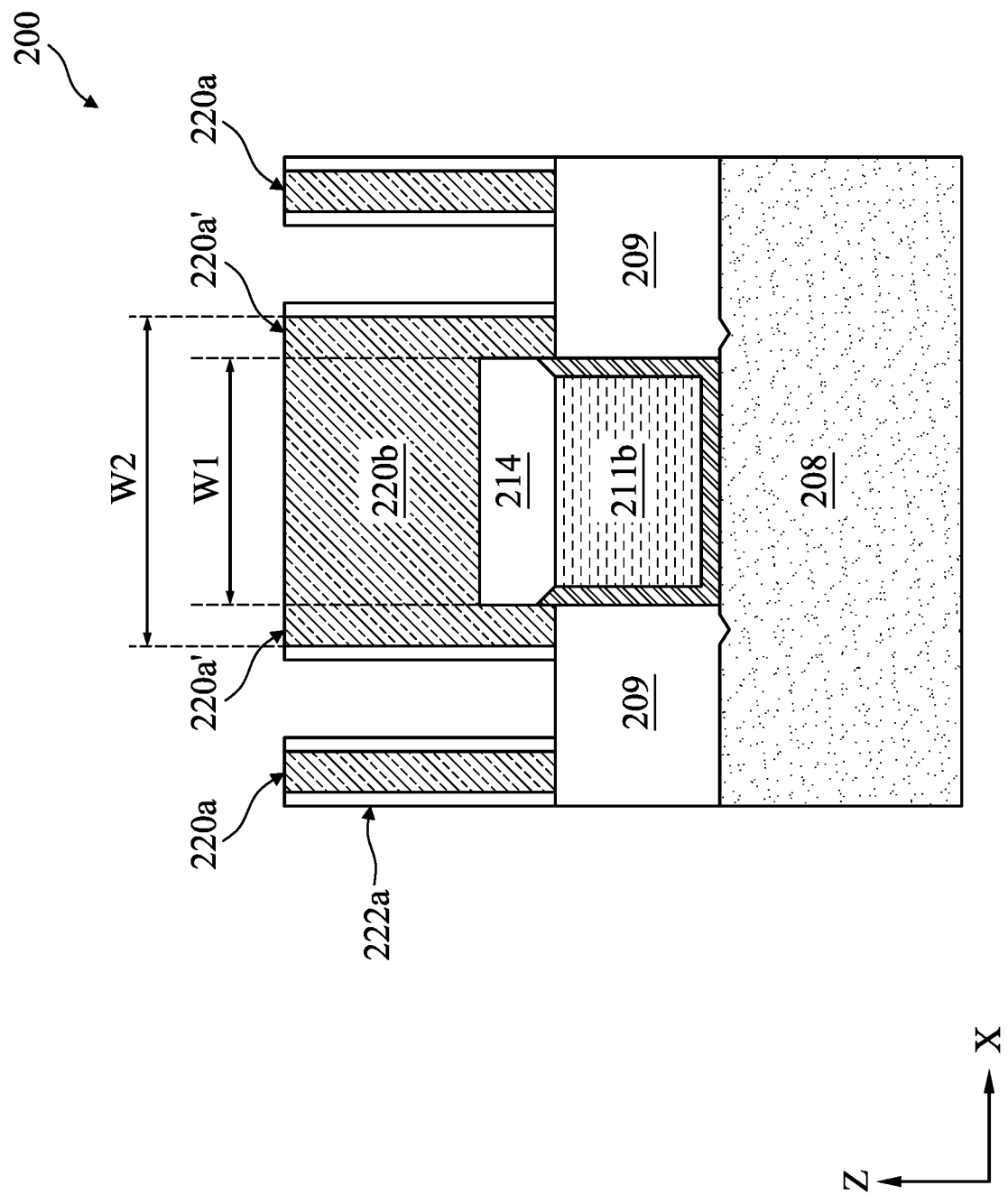
FIGS. 8E, 9C, 10C, and 11C are cross-sectional views of the semiconductor structure taken along line CC' as shown in FIGS. 8A, 9A-1, 10A, and 11A-1, respectively, during intermediate stages of the method shown in FIGS. 1A and/or 1B according to various embodiments of the present disclosure.

In some embodiments, referring to FIGS. 8A and 8E, the bridge structure 220b extends along the Y axis to cover portions of the cladding layers 209. In some embodiments, the bridge structure 220b does not extend to cover portions of the cladding layers 209 along the Y axis. In some embodiments, referring to FIG. 8F, the bridge structure 220b is not formed along a length of each gate stack 220a'. In other words, comparing FIG. 8C with FIG. 8F, the bridge structure 220b is not formed over the top surface of the dielectric helmet 214 as seen along line DD', which is offset from line CC' along the Y axis.

Figures 1, 9A:
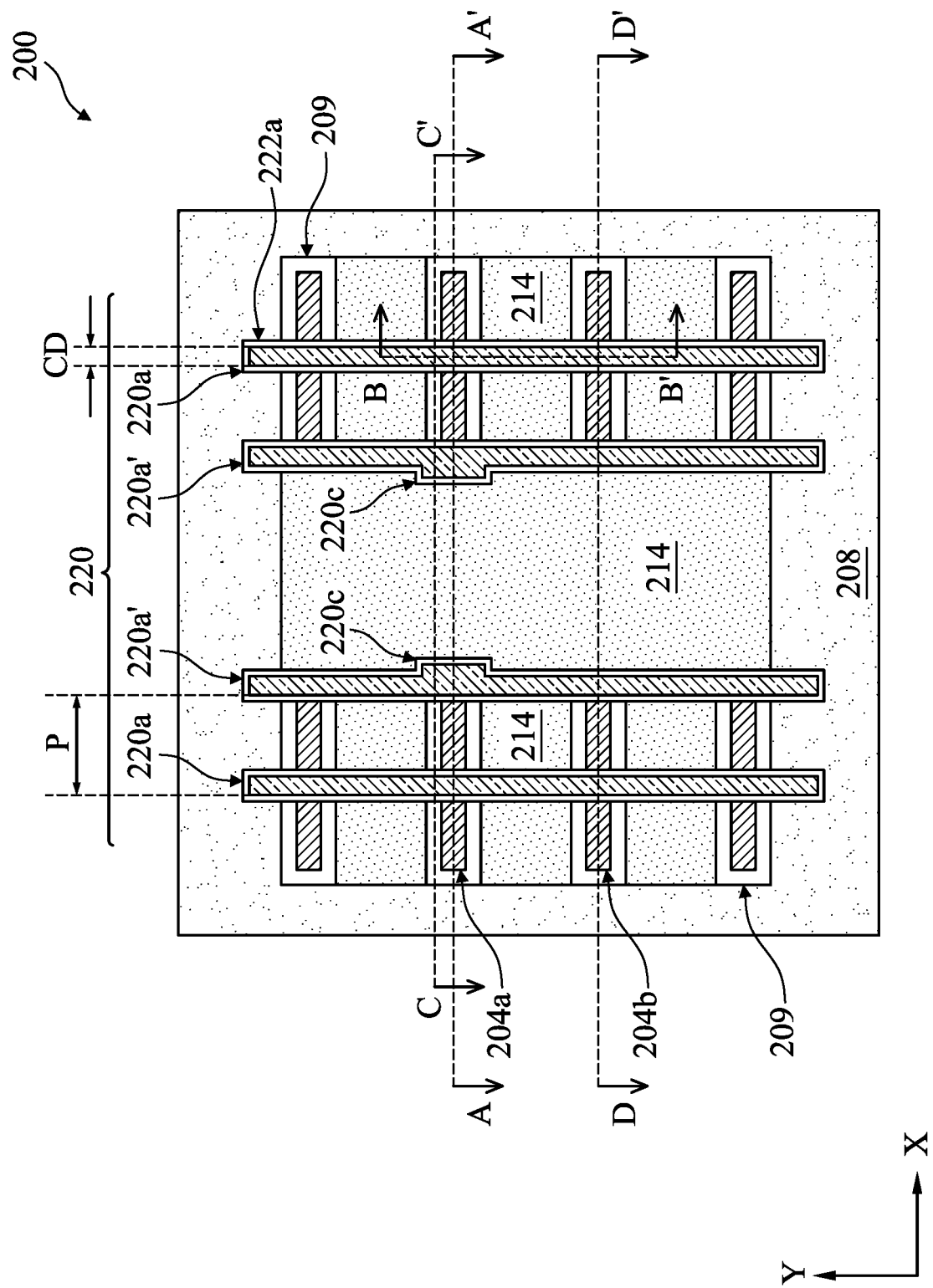
Figures 2, 9A:
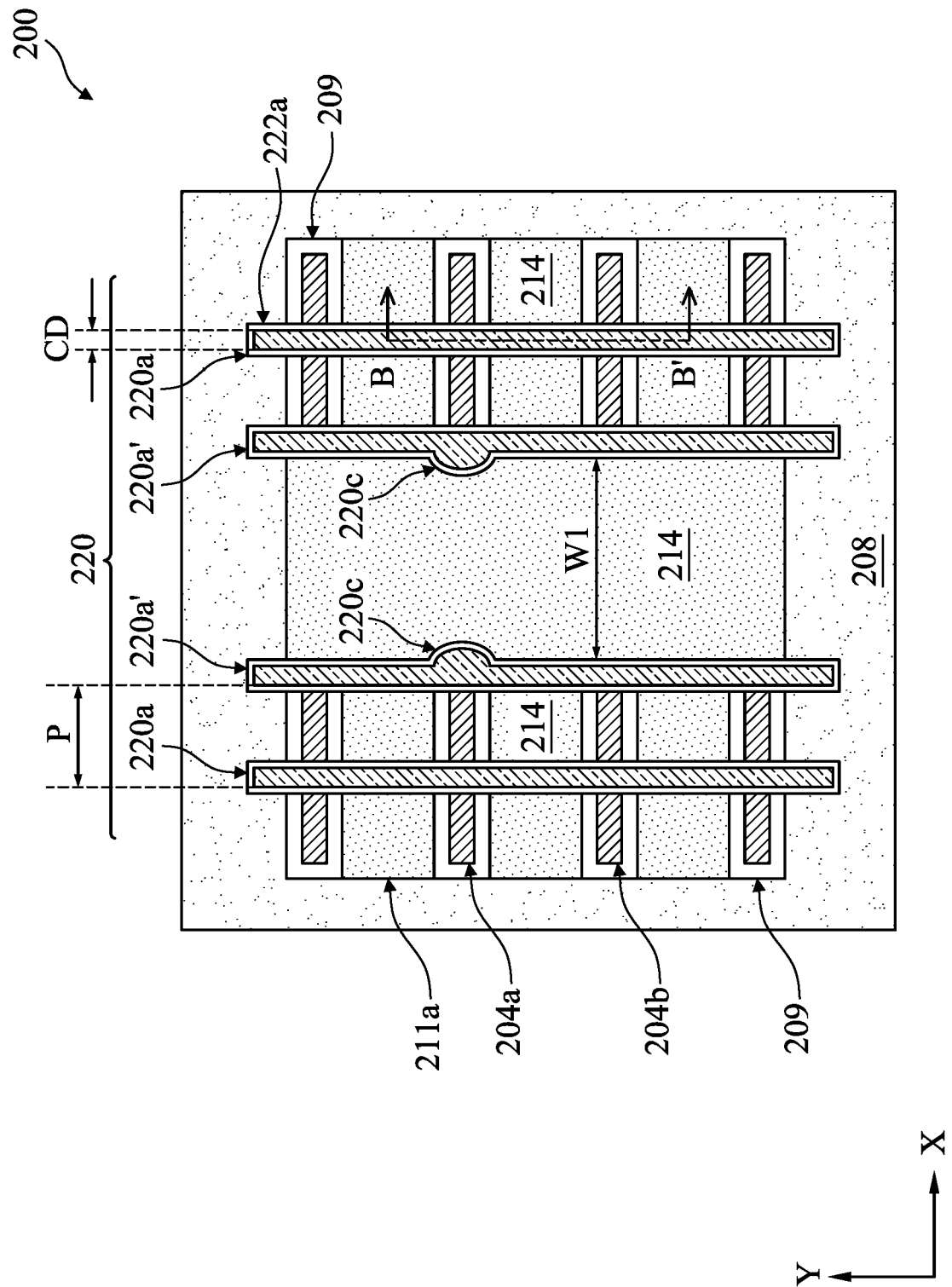

In some embodiments, referring to FIGS. 9A-1 and 9A-2, rather than including the bridge structure 220b to connect two adjacent gate stacks 220a', the dummy gate structure 220 includes portions 220c that protrude from the gate stacks 220a' and extend laterally toward each other over the top surface of the dielectric helmet 214 without coalescing to join the gate stacks 220a'. Similar to the bridge structure 220b, each protruding portion 220c is considered a "jog structure" to the gate stack 220a' as it laterally extends the gate stack 220a' to contact the top surface of the dielectric helmet 214. In some embodiments, referring to FIG. 9A-1, the protruding portions 220c are configured to have sharp corners and edges, thereby each being formed to a substantially rectangular shape. In some embodiments, referring to FIG. 9A-2, the protruding portions 220c are formed to include rounded corners, which may result from an etching process used to define the dummy gate structure 220. In the present embodiments, the opposing protruding portions 220c are substantially symmetrically positioned about the dielectric helmet 214, i.e., they are substantially equal in width.

Figure 9B:
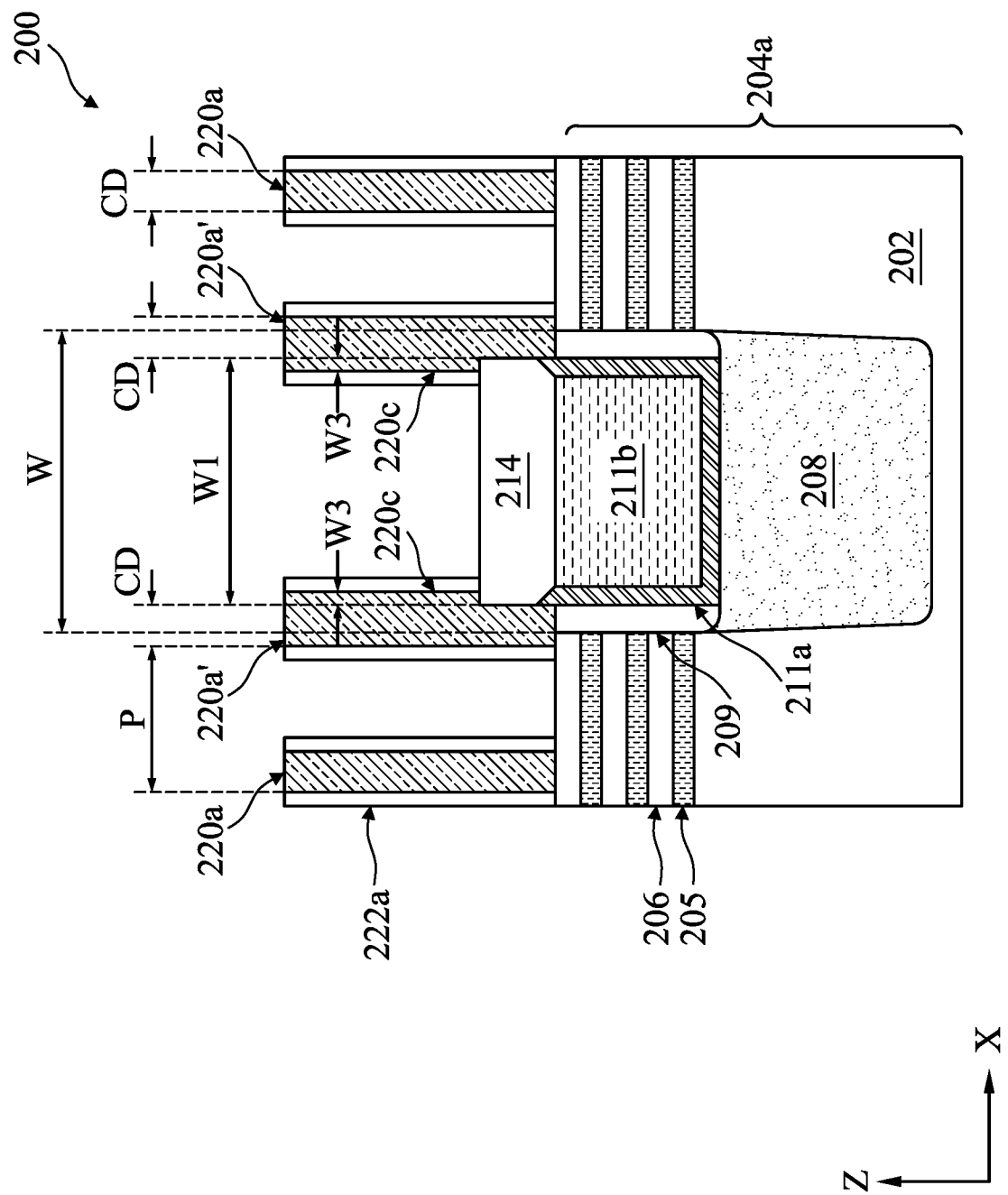

Using FIG. 9A-1 as an example and referring to FIG. 9B, the protruding portion 220c disposed over the top surface of the dielectric helmet 214 is defined by a width W3, which is less than the width CD of the gate stack 220a' as defined previously. In some embodiments, a ratio of the width W3 to the width CD is about 0.1 to about 0.5. For example, if the width CD is about 11 nm, then the width W3 may be about 1 nm to about 5 nm. The width W3 is not limited as such in the present embodiments, so long as the two protruding portions 220c are separated from each other and their separation distance, which is a difference between the width W1 of the dielectric helmet 214 and twice of the width W3 (i.e., W1−2W3), allows removal of the dummy gate structure material during a patterning process for forming the protruding portions 220c.

In some embodiments, referring to FIGS. 9A-1 (or 9A-2) and 9C, each protruding portion 220c extends along the Y axis to cover portions of the cladding layers 209. In some embodiments, the protruding portion 220c does not extend to cover portions of the cladding layers 209 along the Y axis. In some embodiments, referring to FIG. 9D, the bridge structure 220b are not formed along a length of each gate stack 220a'. In other words, comparing FIG. 9B with FIG. 9D, the protruding portions 220c are not formed over the top surface of the dielectric helmet 214 as seen along line DD', which is offset from line CC' along the Y axis.

Embodiments of the dummy gate structure 220 depicted in FIGS. 8A-9D are discussed in reference to the width W of the trench 203b being about twice the pitch P, or W~2P. As provided herein, the width W may be any multiples of the pitch P, or W~nP, where n is a positive integer. In this regard, referring to FIGS. 10A-11D collectively, further example embodiments are provided in which the width W is about one pitch P, or W~P. Accordingly, the dielectric helmet 214 formed between the ends of the fins 204 has a reduced width as discussed in detail below. It is noted that the present embodiments do not limit the dimension of the width W, which may be varied according to specific IC layout design rules.

Figure 8F:
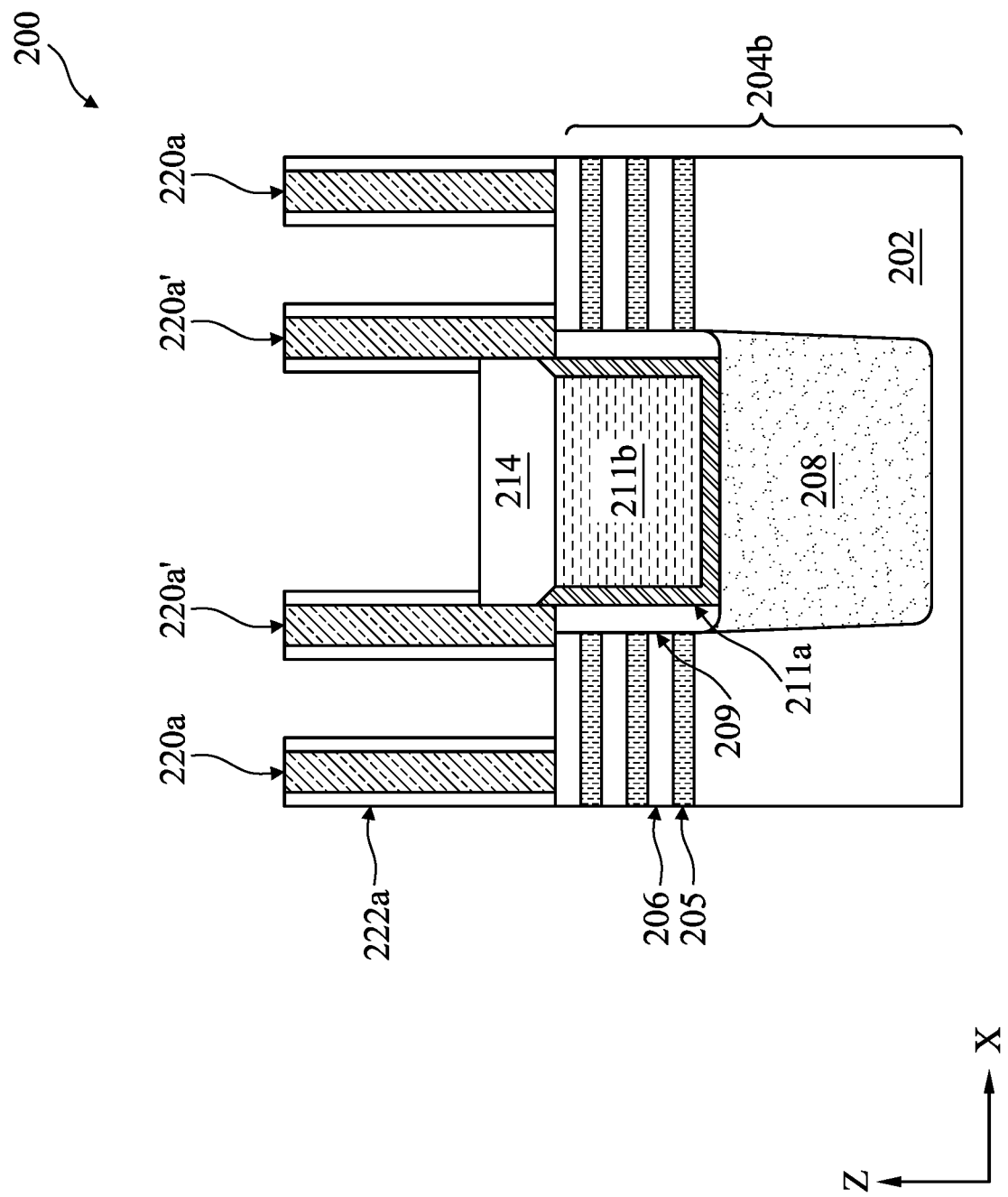
FIGS. 8F, 9D, 10D, and 11D are cross-sectional views of the semiconductor structure taken along line DD' as shown in FIGS. 8A, 9A-1, 10A, and 11A-1, respectively, during intermediate stages of the method shown in FIGS. 1A and/or 1B according to various embodiments of the present disclosure.
Figure 10A:
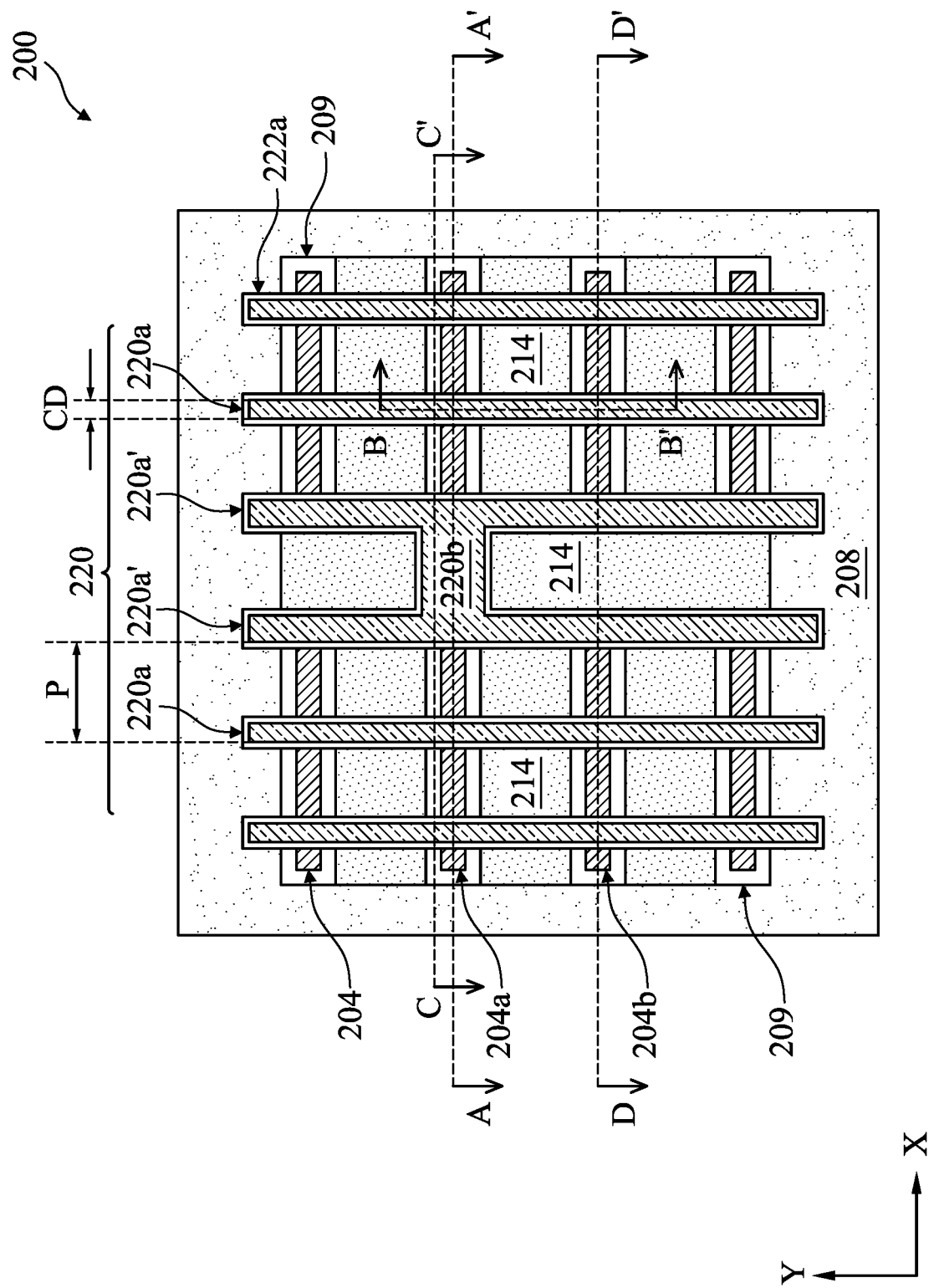
Figure 10B:
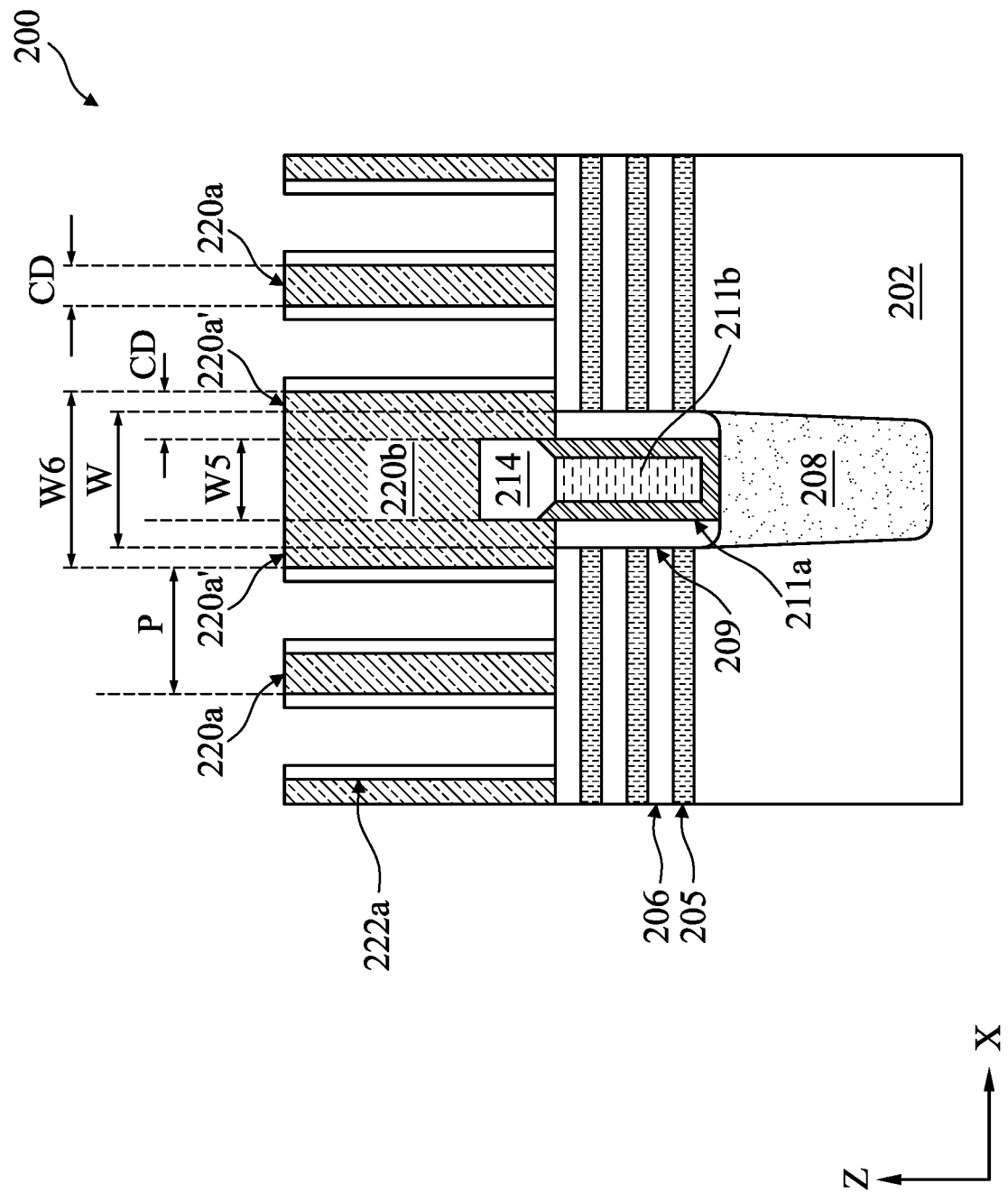
Figure 10C:
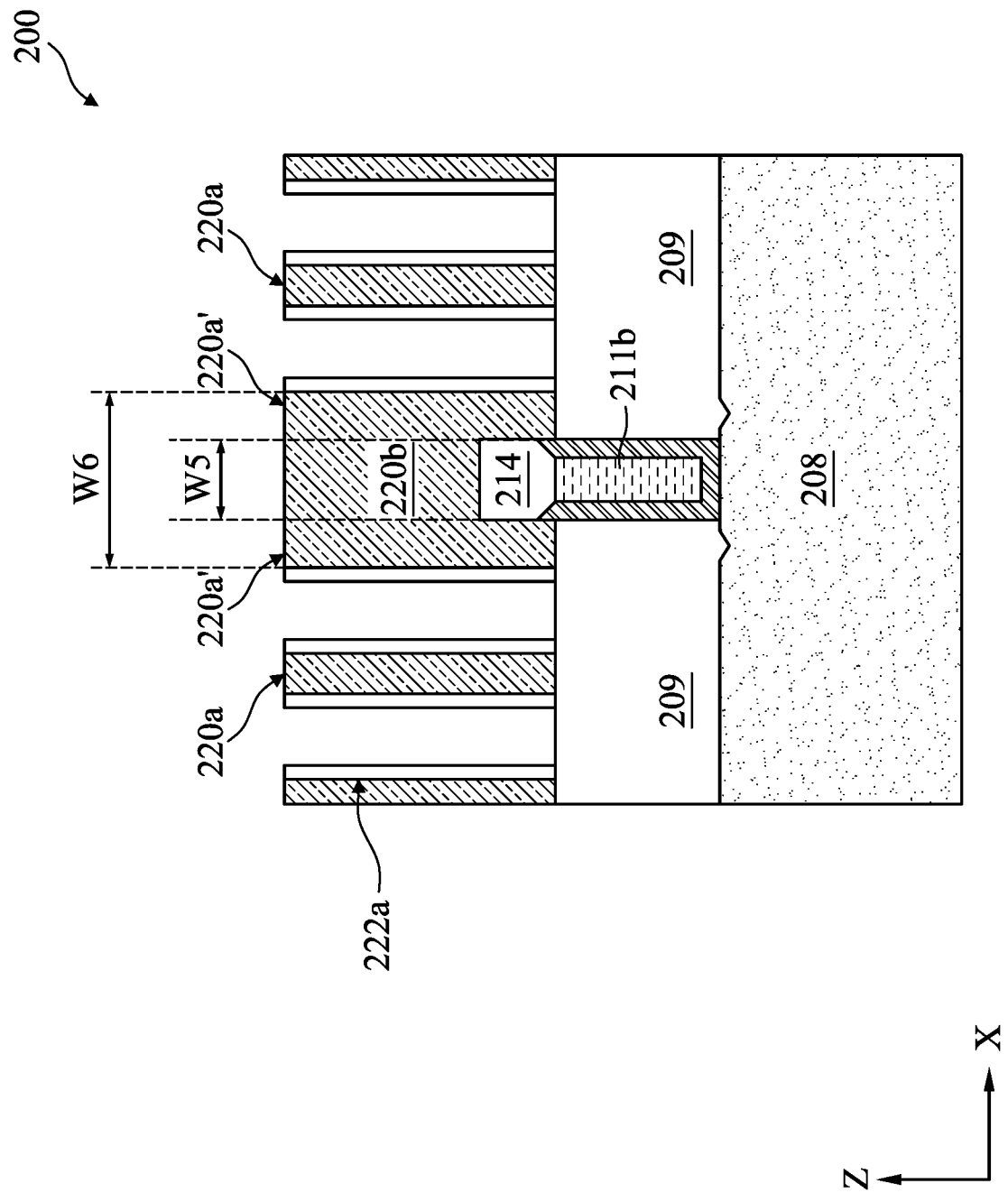
Figure 10D:
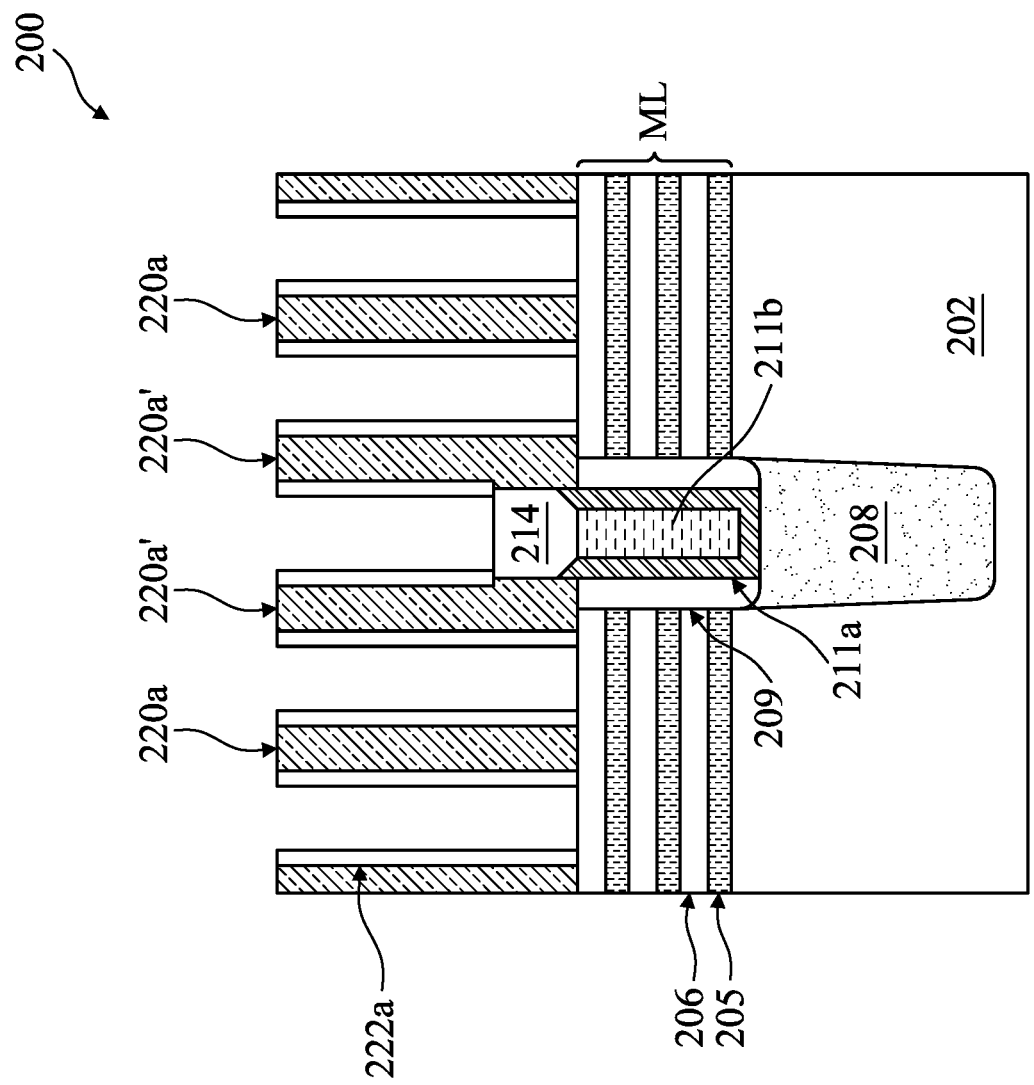

Referring to FIGS. 10A-10D, the dummy gate structure 220 includes the bridge structure 220 formed over the dielectric helmet 214 to join the gate stacks 220a', where FIG. 10A corresponds to FIG. 8A, FIG. 10B corresponds to FIG. 8C, FIG. 10C corresponds to FIG. 8E, and FIG. 10D corresponds to FIG. 8F.

Similar to the embodiment depicted in FIG. 8C, FIG. 10B depicts that width W5 of the dielectric helmet 214 is substantially the same as the width of the dielectric helmet 214 along the X axis, and width W6, which is the distance between two outer sidewalls of the bridge structure 220, is about the sum of the width W5 and twice the width CD, or W6~(W5+2CD). Furthermore, the width W6 is about the sum of the width W and the width CD, or W6~(W+CD). FIG. 10C illustrates the bridge structure 220b extending to cover portions of the cladding layers 209 along the Y axis as depicted in FIG. 8E, while FIG. 10D depicts that the bridge structure 220b is not formed along a length of each gate stack 220a', similar to the embodiment shown in FIG. 8F.

Figure 9C:
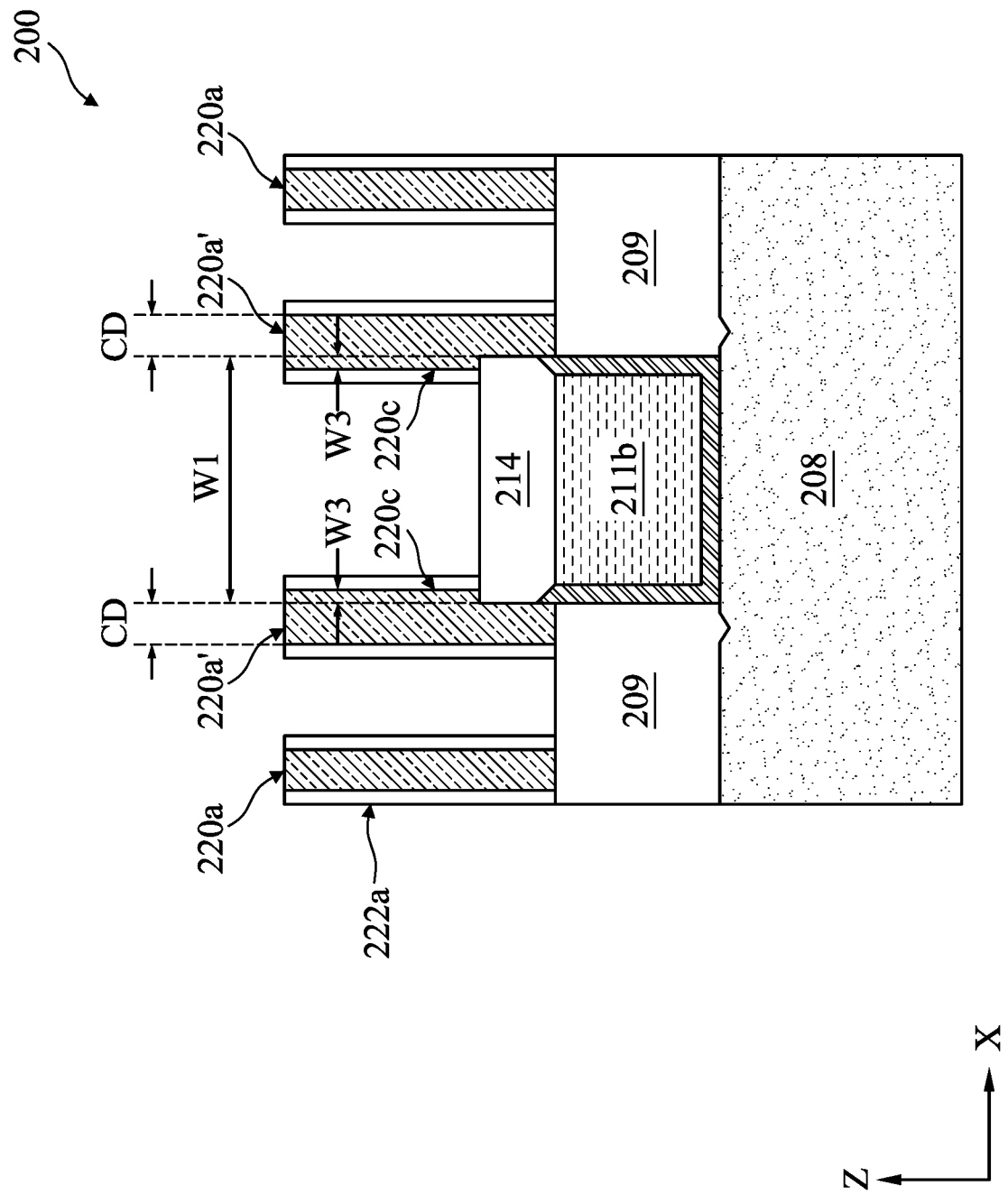
Figure 9D:
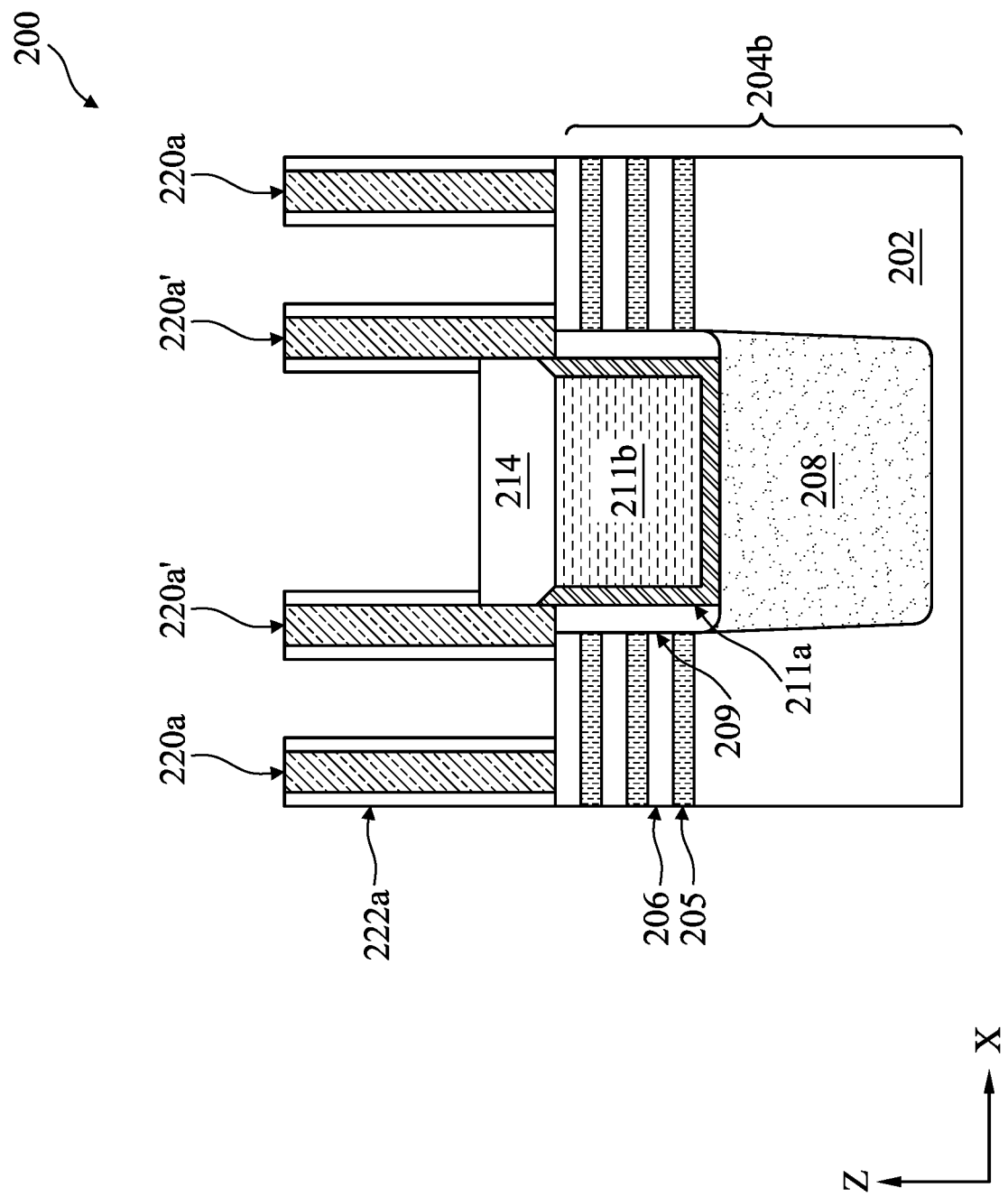
Figures 1, 11A:
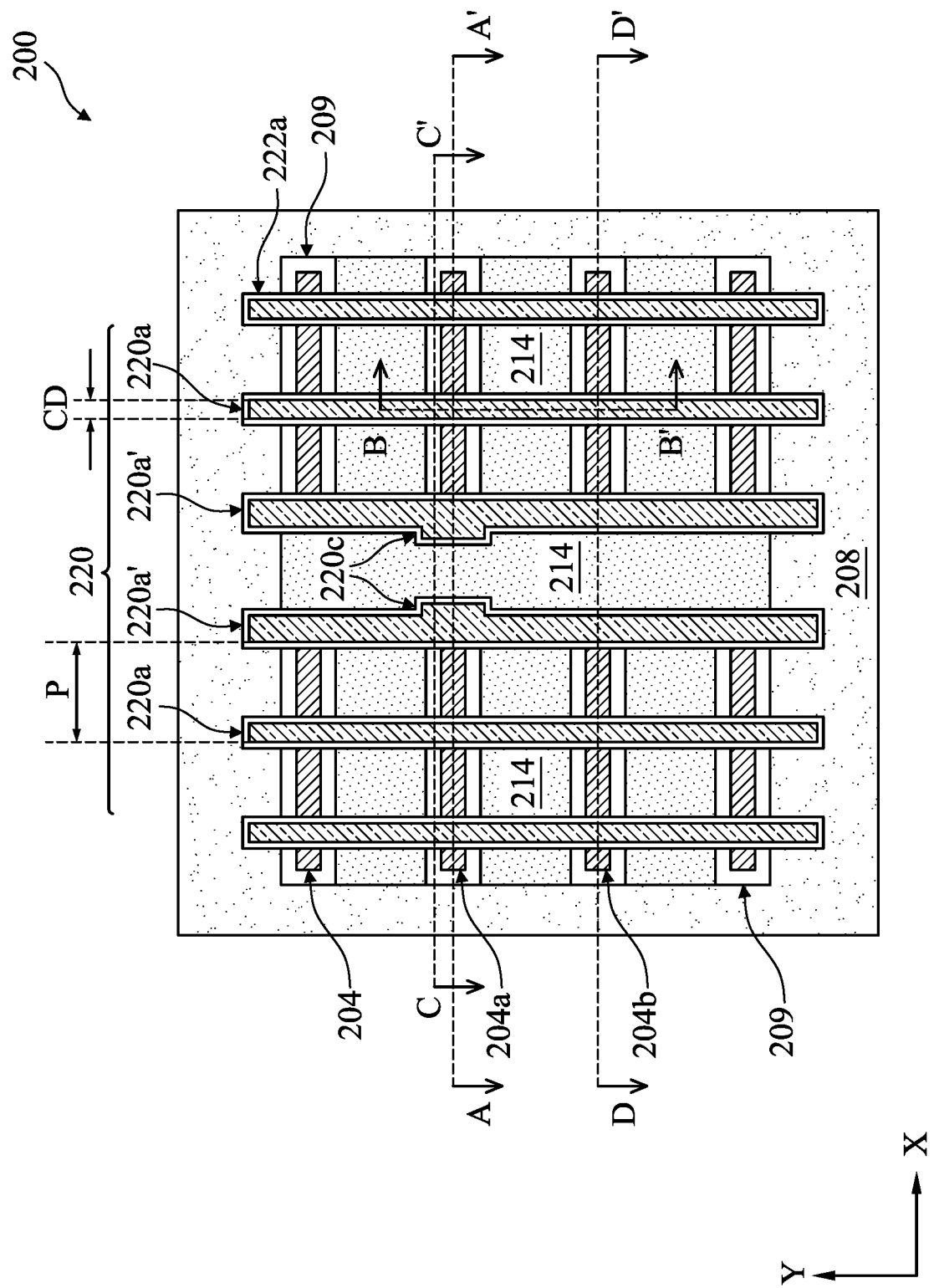
Figures 2, 11A:
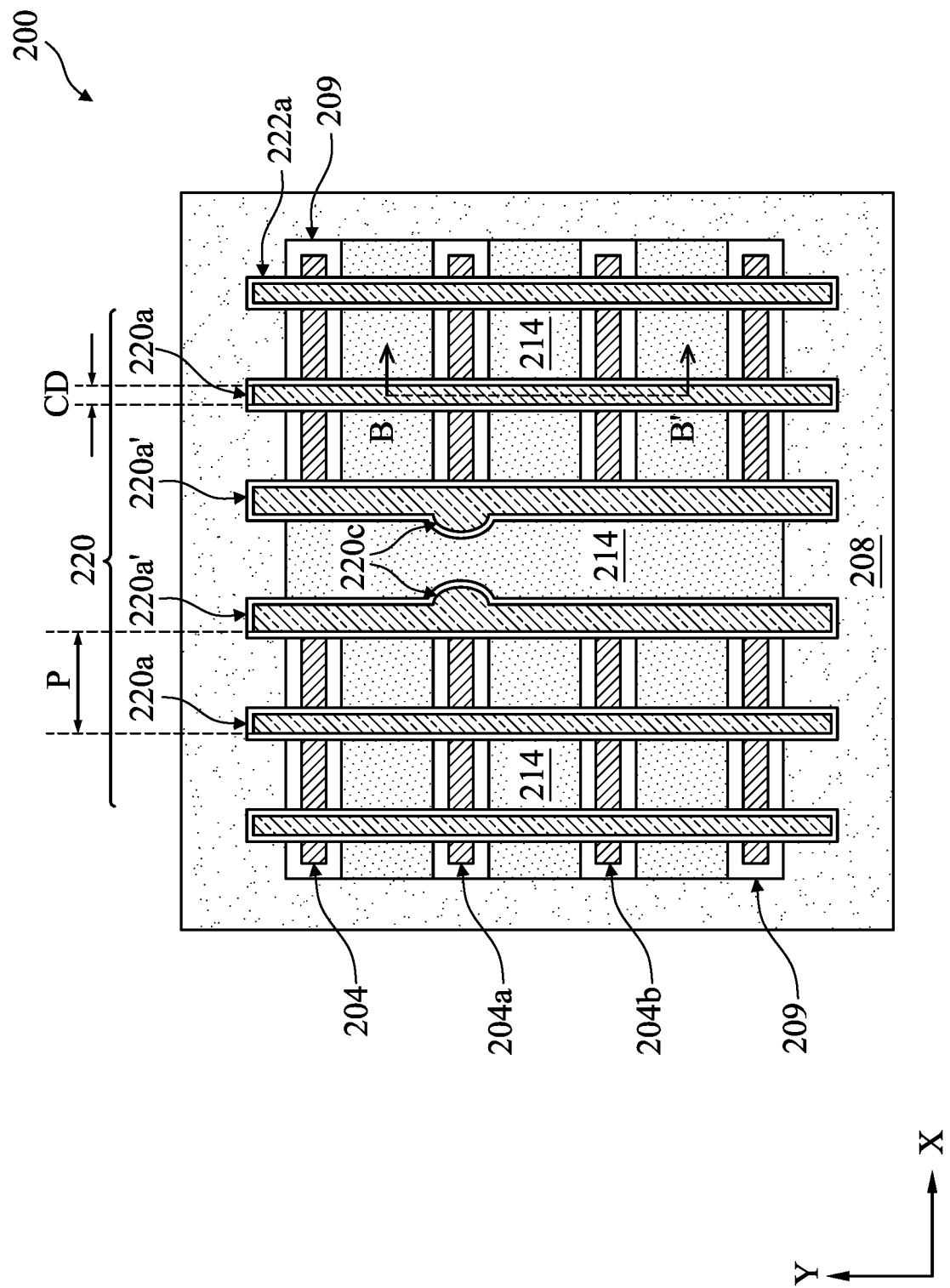
Figure 11B:
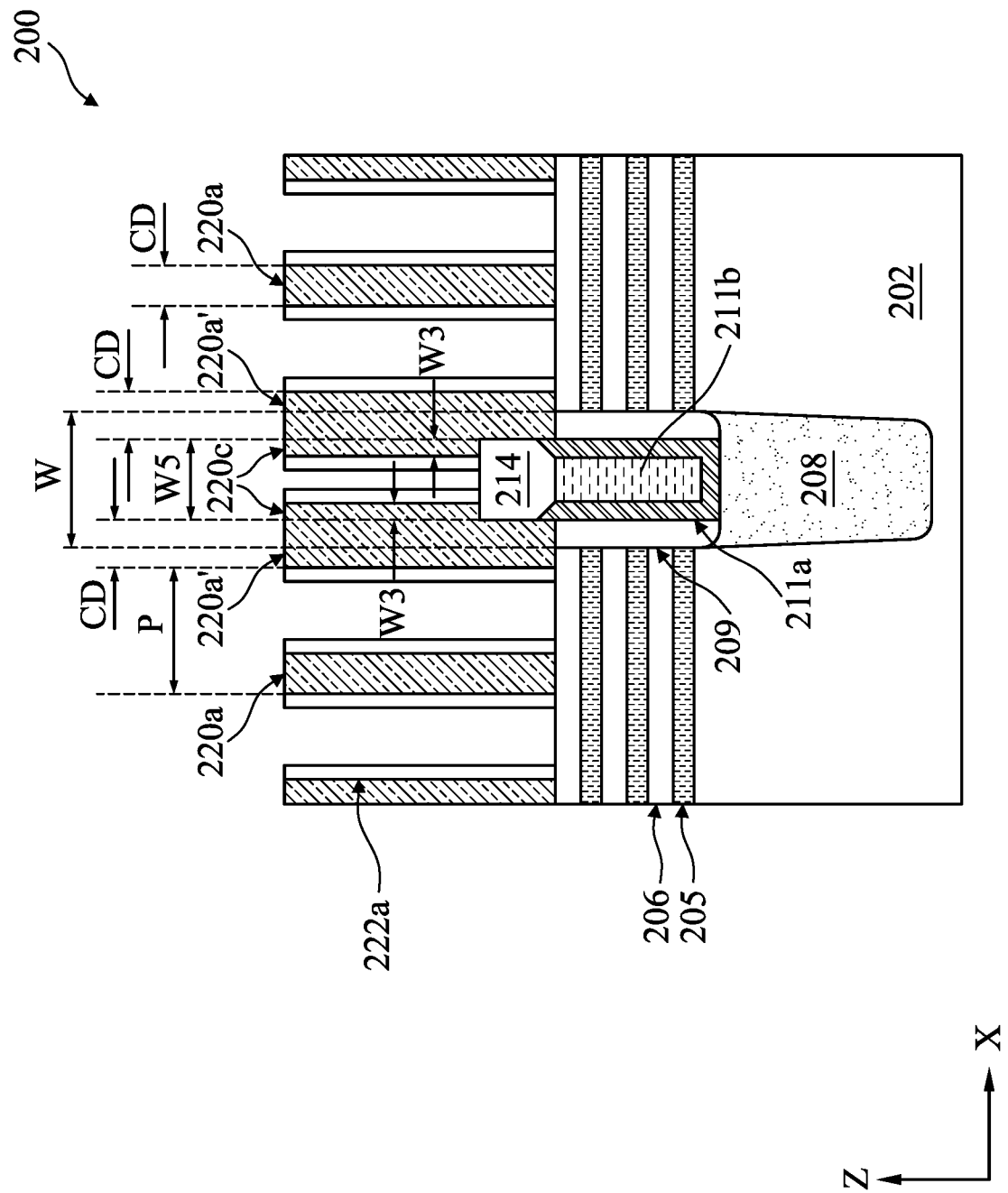
Figure 11C:
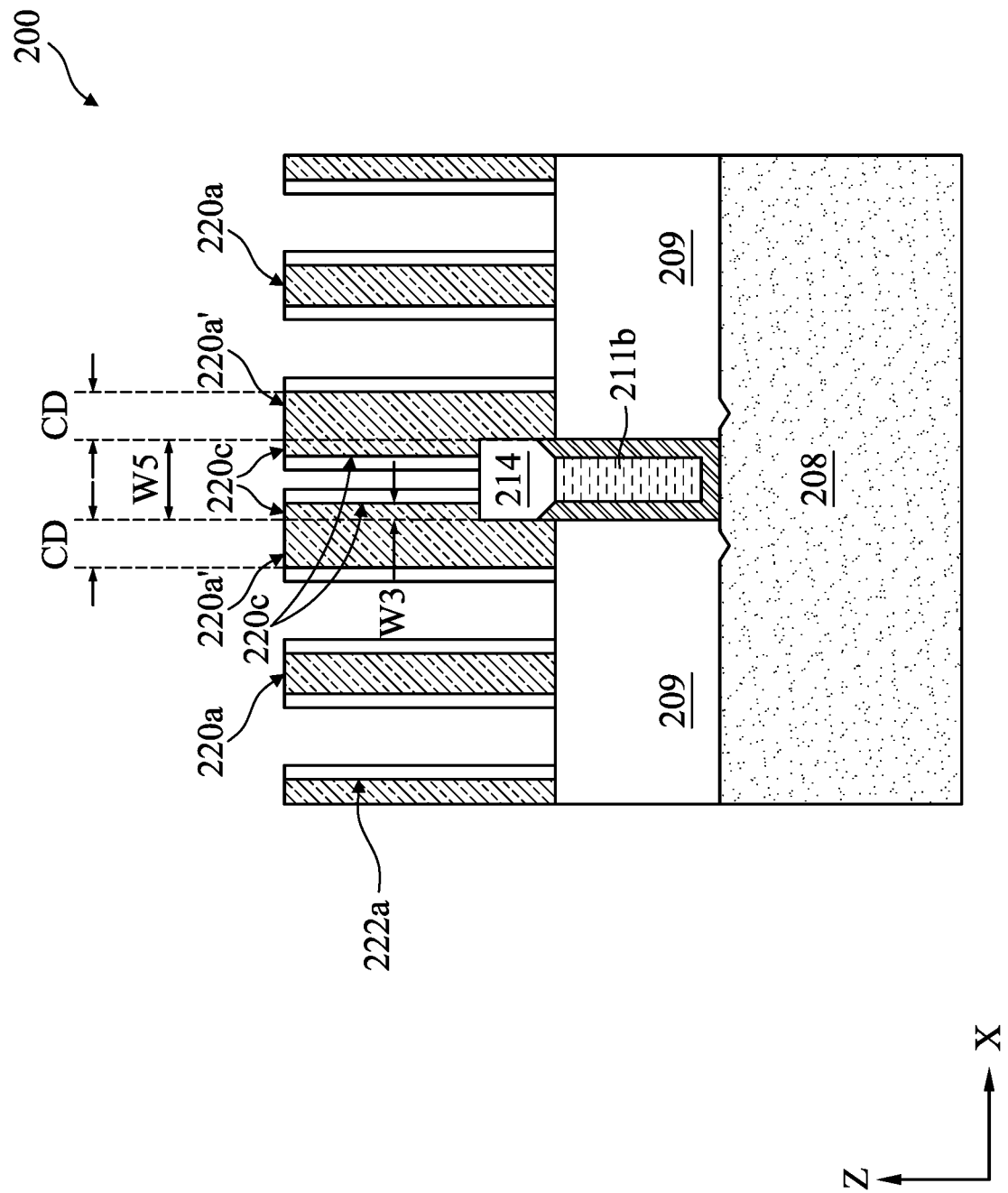
Figure 11D:
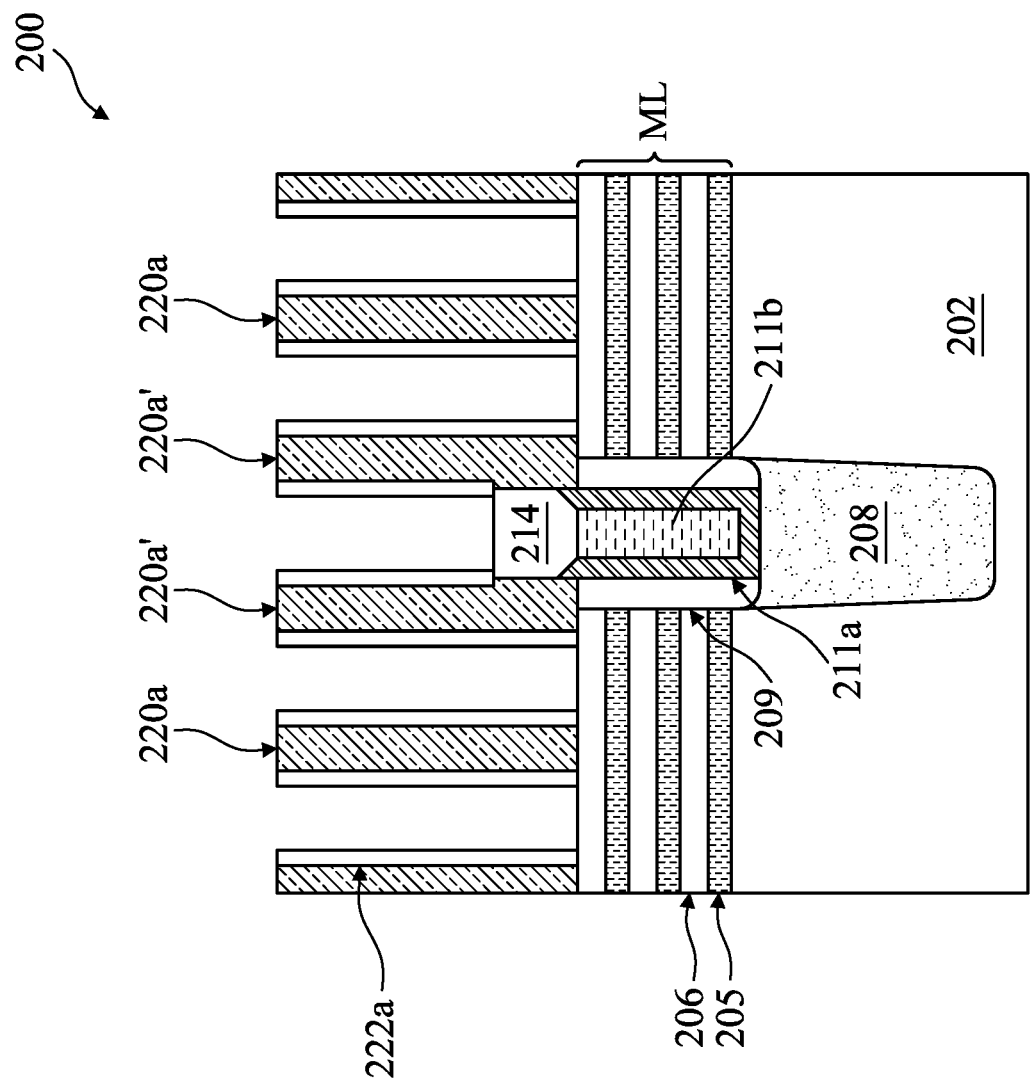

Referring to FIGS. 11A-1, 11A-2, and 11B-11D, the dummy gate structure 220 includes the protruding portions 220c formed over the dielectric helmet 214 without joining the adjacent gate stacks 220a', where FIG. 11A-1 corresponds to FIG. 9A-1, FIG. 11A-2 corresponds to FIG. 9A-2, FIG. 11B corresponds to FIG. 9B, FIG. 11C corresponds to FIG. 9C, and FIG. 11D corresponds to FIG. 9D. FIGS. 11A-1 and 11A-2 depict embodiments in which the protruding portions 220c may be formed to each have a substantially rectangular shape with sharp edges and corners (FIG. 11A-1) or a configuration with rounded corners (FIG. 11A-2).

Similar to the embodiment depicted in FIG. 9B, FIG. 11B depicts that the protruding portion 220c disposed over the top surface of the dielectric helmet 214 is defined by the width W3, which is less than the width CD of the gate stack 220a', and the opposing protruding portions 220c are separated by a distance of about (W5−2W3). Because the width W5 is less than the width W1 and assuming the width CD is constant, the protruding portions 220c depicted in FIG. 11B are disposed closer to each other than those depicted in FIG. 9B. As discussed above, a ratio of the width W3 to the width CD is about 0.1 to about 0.5, though such ratio is not limiting so long as the separation distance of (W5−2W3) can accommodate the patterning process for forming the protruding portions 220c. FIG. 11C illustrates each protruding portion 220c extending along the Y axis to cover portions of the cladding layers 209 as depicted in FIG. 9C, while FIG. 11D depicts that the protruding portions 220c are not formed along a length of each gate stack 220a', similar to the embodiment shown in FIG. 9D.

Figure 12:
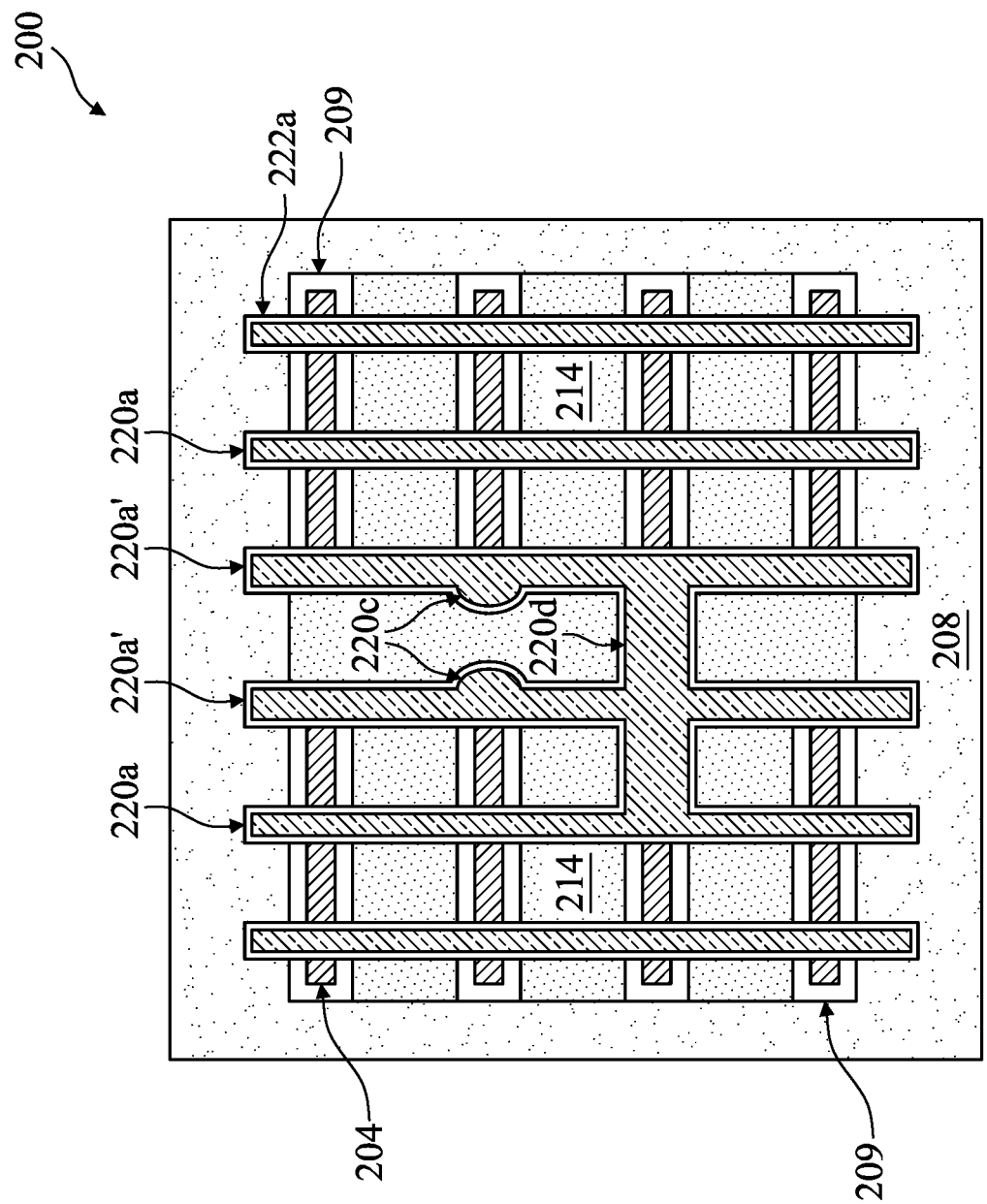
Figure 13:
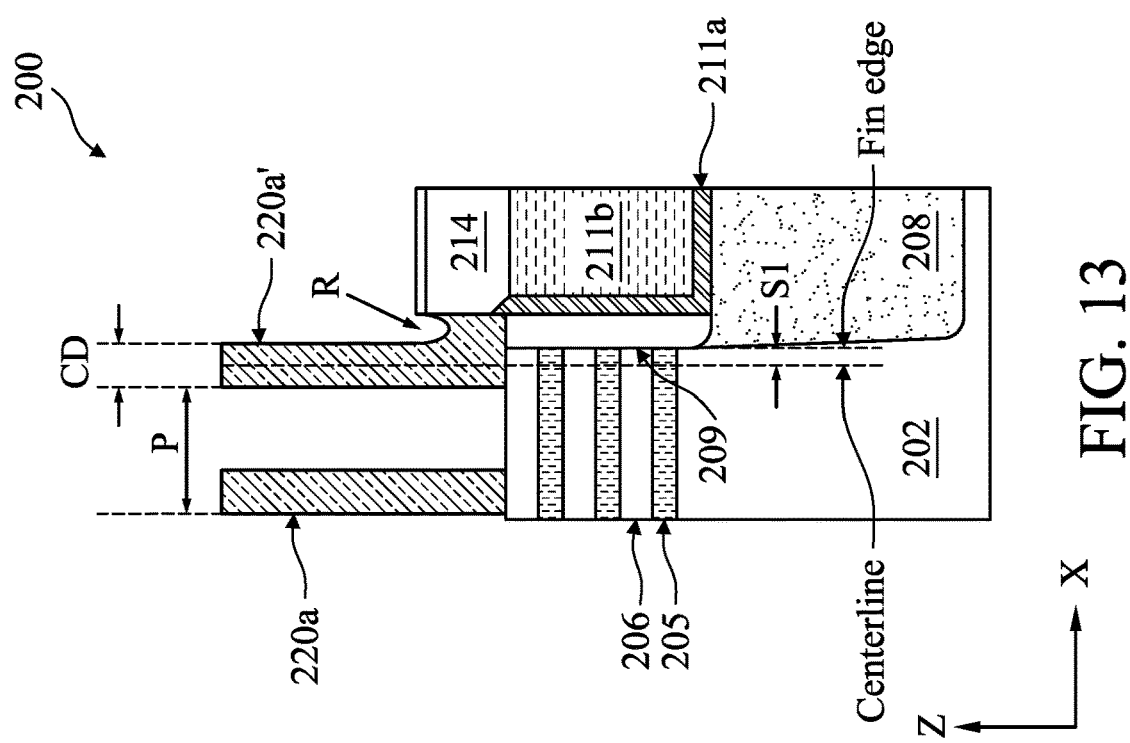

In some embodiments, referring to FIG. 12, the dummy gate structure 220 combines embodiments of both the bridge structure 220b and the protruding portions 220c, collectively referred to as the jog structures, as depicted in FIGS. 8A-11D. In some embodiments, widths of one or more of the jog structures along the X axis are varied independently to accommodate different design requirements. For purposes of illustration, the bridge structure 220b is formed over the dielectric helmet 214 having the width W1 (i.e., W~2P), and the protruding portions 220c are configured to have rounded corners and formed over the dielectric helmet 214 having the width W5 (i.e., W~P). Though not depicted, jog structures of other dimensions are also applicable in the present disclosure.

When forming a dummy gate stack along an edge of a fin, it is generally desirable to align a centerline of the dummy gate stack with the edge of the fin. However, referring to FIG. 13 as an example, overlay shift of a photolithography mask may cause the centerline to move away from the edge of the fin during the photolithography process, leading to an excessive portion of the gate stack material (e.g., polysilicon) to remain between the dummy gate stack and the dielectric helmet. Such residue, denoted by R in FIG. 13, may span a lateral distance S1 that is less than the width CD of the dummy gate stack, a distance too small for effective removal during an etching process that follows the photolithography process to form the dummy gate stack. In some examples, the lateral distance S1 may be less than about half of the width CD. When performing subsequent fabrication processes, such as forming an S/D recess, the residue R may be exposed and provides a substrate over which epitaxial material may grow, resulting in an epitaxial mushroom defect. Such inadvertent growth may negatively impact the performance of the device. In one such example, the epitaxial mushroom defect may not be properly insulated from the subsequently-formed metal gate stack (MG), leading to electrical shorting. On the other hand, referring to FIG. 14, excessive overlay shift in the opposite direction (e.g., moving the centerline toward the dielectric helmet) results in a lateral distance S2 that may be greater than about half of the width CD, and may cause pits (or void) to form within the epitaxial S/D features and/or reduce width of the channel layers adjacent to the epitaxial S/D features, leading to electrical shorting between the subsequently-formed MG and S/D contact (MD).

The present embodiments provide methods of reducing or eliminating the growth of epitaxial mushroom defect, avoiding MG-MD shorting, and/or pitting in epitaxial S/D features by forming jog structures extending from the dummy gate stacks (e.g., the gate stacks 220a') disposed over the edges of the fins. Regardless of whether the jog structure is configured as a bridge structure (e.g., the bridge structure 220b) connecting two dummy gate stacks or as separated, protruding portions (e.g., the protruding portions 220c), the present embodiments ensure that at least portions of the dielectric helmet (e.g., the dielectric helmet 214) are covered by the jog structures to eliminate formation of the residue R, and thus the mushroom defect, on the dummy gate stack, as well as to reduce the occurrence of pitting and/or MG-MD shorting.

Referring to FIGS. 8A-12 collectively, each portion (i.e., the gate stacks 220a, 220a', the bridge structure 220b, and the protruding portions 220c) of the dummy gate structure 220 may include a dummy gate electrode (not depicted) disposed over an optional dummy gate dielectric layer and/or an interfacial layer (not depicted). In the present embodiments, the dummy gate structure 220 is configured to be replaced with a metal gate structure. The dummy gate structure 220 may be formed by a series of deposition and patterning processes. For example, the dummy gate structure 220 may be formed by depositing a polysilicon (poly-Si) layer over the substrate 202 and subsequently patterning the poly-Si layer via a series of photolithography and etching processes (e.g., a dry etching process). In the present embodiments, the photolithography process is configured to form the jog structures (i.e., the bridge structure 220b and/or the protruding portions 220c) in the dummy gate structure 220. This may be accomplished, for example, by designing photolithography masks with one or more of the jog structures having the dimensions relative to the gate stacks as discussed in detail above. To accommodate the patterning process and protect the dummy gate structure 220 during subsequent fabrication processes, one or more hard mask layers (not depicted) may be formed over the dummy gate structure 220.

Still referring to FIGS. 8A-12, method 100 at operation 112 subsequently forms top gate spacers 222a on sidewalls of each portion of the dummy gate structure 220. The top gate spacers 222a may include a single-layer structure or a multi-layer structure and may include SiO and/or $SiO_2$, SiN, SiC, SiON, SiOC, SiCN, air, a low-k dielectric material, a high-k dielectric material (e.g., hafnium oxide ($HfO_2$), lanthanum oxide ($La_2O_3$), etc.), other suitable materials, or combinations thereof. Each spacer layer of the top gate spacers 222a may be formed by first depositing a dielectric layer over the dummy gate structure 220 via a suitable deposition method (e.g., CVD and/or ALD) and subsequently removing portions of the dielectric layer in an anisotropic (e.g., directional) etching process (e.g., a dry etching process), leaving the top gate spacers 222a on the sidewalls of each dummy gate structure 220.

Subsequent operations of method 100 are discussed in reference to FIGS. 15A-16D, where, for purposes of illustration, FIGS. 15A-15D are directed to the embodiment depicted in FIGS. 8A-8E and FIGS. 16A-16D are directed to the embodiment depicted in FIGS. 11A-1, 11A-2, and 11B-11D.

Referring to FIGS. 15B, 15C, 16B, and 16C, method 100 at operation 114 forms epitaxial S/D features 224 in the fins 204 adjacent to the gate stacks 220a and 220a'. In the present embodiments, method 100 forms the epitaxial S/D features 224 by first forming S/D recesses (not depicted) in the S/D regions of the fins 204, forming inner gate spacers 222b on sidewalls of the non-channel layers 205 that are exposed in the S/D recesses, and forming epitaxial S/D features 224 in the S/D recesses.

In the present embodiments, method 100 forms the S/D recesses by implementing an etching process that selectively removes portions of the fins 204 in the S/D regions. In some embodiments, the etching process is a dry etching process employing a suitable etchant capable of removing the channel layers 206 (e.g., Si) and the non-channel layers 205 (e.g., SiGe) of the ML. In some examples, the dry etchant may be a chlorine-containing etchant including $Cl_2$, $SiCl_4$, $BCl_3$, other chlorine-containing gas, or combinations thereof. A cleaning process may subsequently be performed to clean the S/D recesses with a hydrofluoric acid (HF) solution or other suitable solution.

The inner gate spacers 222b may be a single-layer structure or a multi-layer structure and may include silicon oxide, SiN, SiCN, SiOC, SION, SiOCN, a low-k dielectric material, air, a high-k dielectric material (e.g., $HfO_2$, $La_2O_3$, etc.), other suitable dielectric material, or combination thereof. In some embodiments, the inner gate spacers 222b have a composition different from that of the top gate spacers 222a. Forming the inner gate spacers 222b may include selectively removing portions of the non-channel layers 205 exposed in the S/D recesses without removing, or substantially removing, portions of the channel layers 206 to form trenches (not depicted). The non-channel layers 205 may be etched by a dry etching process. Subsequently, one or more dielectric layers are formed in the trenches, followed by one or more etching processes to remove (i.e., etch back) excess dielectric layer(s) deposited on surfaces of the channel layers 206, thereby forming the inner gate spacers 222b. The one or more dielectric layers may be deposited by any suitable method, such as ALD, CVD, physical vapor deposition (PVD), other suitable methods, or combinations thereof.

Each of the epitaxial S/D features 224 may be suitable for forming a p-type FET device (i.e., including a p-type epitaxial material) or, alternatively, an n-type FET device (i.e., including an n-type epitaxial material). The p-type epitaxial material may include one or more epitaxial layers of silicon germanium (epi SiGe) each doped with a p-type dopant such as boron, germanium, indium, gallium, other p-type dopants, or combinations thereof. The n-type epitaxial material may include one or more epitaxial layers of silicon (epi Si) or silicon carbon (epi SiC) each doped with an n-type dopant such as arsenic, phosphorus, other n-type dopants, or combinations thereof. In some embodiments, one or more epitaxy growth processes are performed to grow an epitaxial material in each S/D recess and over the inner gate spacers 222b. For example, method 100 may implement an epitaxy growth process similar to that discussed above with respect to forming the ML. In some embodiments, the epitaxial material is doped in-situ by adding a dopant to a source material during the epitaxial growth process. In some embodiments, the epitaxial material is doped by an ion implantation process after performing the deposition process. In some embodiments, an annealing process is subsequently performed to activate the dopants in the epitaxial S/D features 224.

Thereafter, method 100 at operation 114 forms an etch-stop layer (ESL) 230 over the structure 200 to protect the underlying components, such as the epitaxial S/D features 224, during subsequent fabrication processes. The ESL 230 may include any suitable dielectric material, such as SiN, SiCN, $Al_2O_3$, other suitable materials, or combinations thereof, and may be formed by CVD, ALD, PVD, other suitable methods, or combinations thereof. In the present embodiments, the ESL 230 provides etching selectivity with respect to its surrounding dielectric components to ensure protection against inadvertent damage to these components. Method 100 then forms an interlayer dielectric (ILD) layer 232 over the ESL 230 to fill the space between portions of the dummy gate structure 220. The ILD layer 232 may include SiO and/or $SiO_2$, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Method 100 subsequently performs one or more CMP process to expose top surfaces of the dummy gate structure 220.

In some embodiments, method 100 at operation 116 patterns the dielectric helmet 214, such that some portions of the dielectric helmet 214 remain as gate isolation features for separating the subsequently-formed metal gate structure and other portions of the dielectric helmet 214 are removed from the structure 200. For example, FIGS. 15A-15D depict an embodiment in which the portion of the dielectric helmet 214 under the bridge structure 220b is removed during the patterning process at operation 116, while FIGS. 16A-16D depict an embodiment in which the portion of the dielectric helmet 214 formed under the protruding portions 220c is not removed and remains to become a gate isolation feature for the subsequently-formed metal gate structure.

In some embodiments, method 100 patterns the dielectric helmet 214 by forming a patterned masking element (not depicted) to expose portions of the dummy gate structure 220 engaged with portions of the dielectric helmet 214 to be removed. The patterned masking element includes at least a photoresist layer capable of being patterned by a series of photolithography and etching processes discussed in detail above with respect to patterning the fins 204. Thereafter, method 100 removes portions of the dummy gate structure 220 exposed by the patterned masking element to expose portions of the dielectric helmet 214 in an etching process (e.g., a dry etching process). In some embodiments, the etching process needs not to completely remove the exposed portions of the dummy gate stacks 220, and the extent of such removal is controlled by adjusting the duration of the etching process. After implementing the etching process, the patterned masking element is removed from the structure 200 by any suitable method, such as resist stripping and/or plasma ashing. The exposed portions of the dielectric helmet 214 are then selectively removed with respect to the dummy gate stacks 220 in a suitable etching process (e.g., a dry etching process) to form the patterned dielectric helmet 214. In some embodiments, operation 116 is optional and the dielectric helmet 214 is patterned at a subsequent operation.

Referring to FIGS. 15A-16D collectively, method 100 at operation 118 replaces the dummy gate structure 220, the non-channel layers 205, and the cladding layers 209 with a metal gate structure 260, where the metal gate structure 260 includes metal gate stacks 260a, metal gate stacks 260a', a bridge structure 260b, and protruding portions 260c, which correspond to gate stacks 220a, gate stacks 220a', the bridge structure 220b, and the protruding portions 220c, respectively. In the present embodiments, a portion of the metal gate stacks 260a' extends along the sidewall of the fin 204 and along the sidewall of the dielectric structure 211. To illustrate with clarity the metal gate structure 260 in a planar top view, additional features formed over the metal gate structure 260 are omitted in FIGS. 15A and 16A.

In the present embodiments, method 100 first performs an etching process to remove the dummy gate structure 220 (or remaining portions thereof after patterning the dielectric helmet 214), thereby forming gate trenches (not depicted) between the top gate spacers 222a. The etching process may be a dry etching process, a wet etching process, an RIE process, other suitable processes, or combinations thereof. In some embodiments, removing the dummy gate structure 220 removes portions of the dielectric helmet 214 disposed under the dummy gate structure 220, such as under the bridge structure 220b and/or the protruding portions 220c.

Subsequently, method 100 removes the cladding layers 209 and the non-channel layers 205 to form openings interleaved with and along the sidewalls of the channel layers 206. In some embodiments, method 100 implements separate etching processes to remove the cladding layers 209 and the non-channel layer 205. For example, method 100 may perform a first etching process to remove the cladding layers 209, resulting in vertical openings along the sidewalls of each fin 204, and then perform a second etching process to remove the non-channel layers 205, resulting in horizontal openings interleaved with the channel layers 206. For embodiments in which the non-channel layers 205 and the cladding layers 209 have the same composition (e.g., SiGe), the first and the second etching processes may be implemented using the same etchant, such as a fluorine-containing etchant including hydrofluoric acid (HF), $F_2$, other fluorine-containing etchants (e.g., $CF_4$, $CHF_3$, $CH_3F$, etc.), or combinations thereof.

Still referring to FIGS. 15A-16D, method 100 then forms a metal gate structure 260 in the gate trenches, the vertical openings, and the horizontal openings. Accordingly, portions of the metal gate structure 260 wraps around (or interleaved with) each channel layer 206 and extends along the sidewalls of the fins 204. For embodiments in which portions of the dielectric helmet 214 are removed by, for example, the patterning of the dielectric helmet 214 at operation 116 and/or the recessing of the dummy gate structure 220 at operation 118, the metal gate structure 260 is formed to directly contact the top surface of the dielectric structure 211 (see the bridge structure 260b of FIG. 15C and the protruding portions 260c of 16C).

Figure 15A:
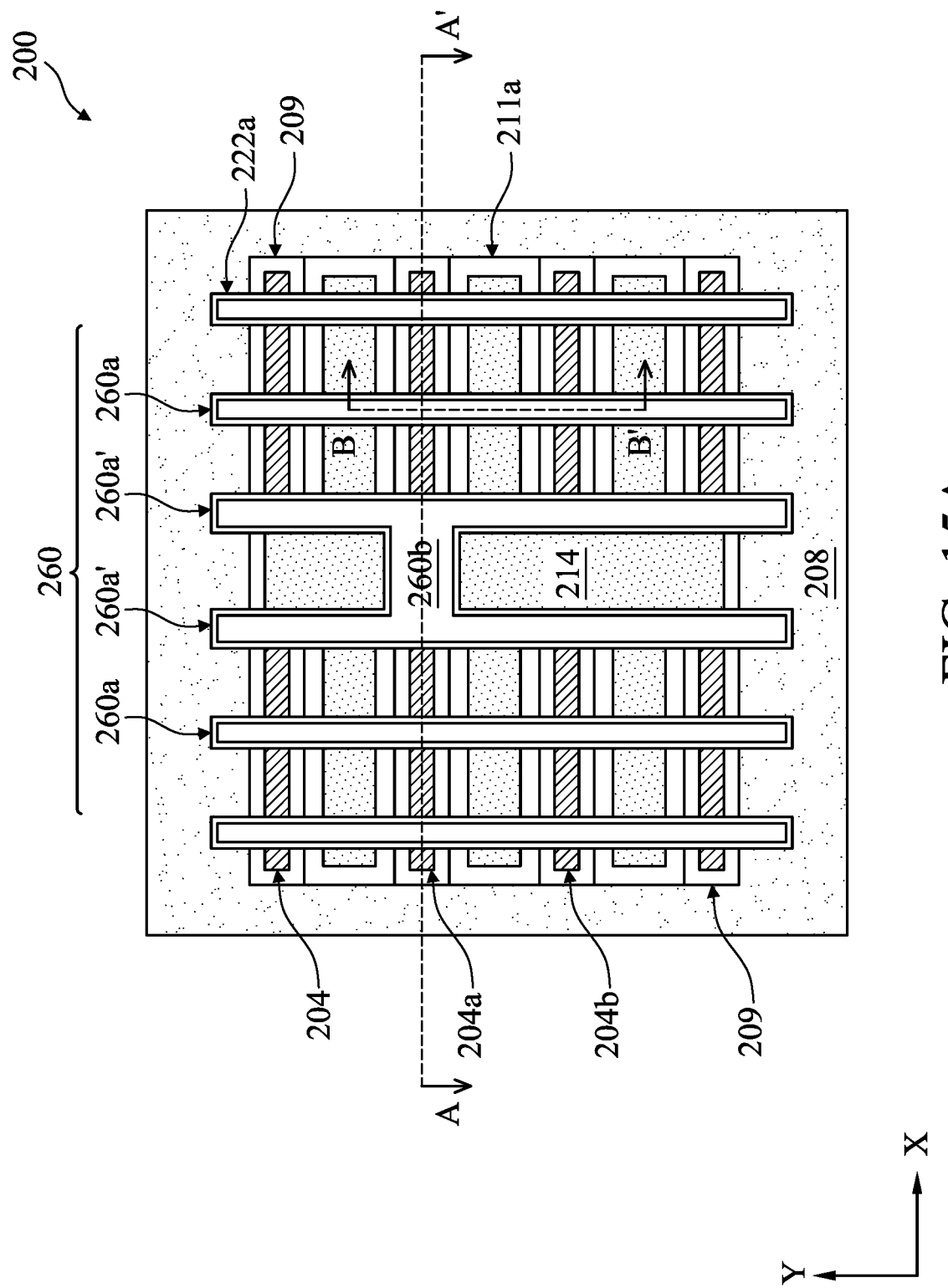
Figure 15B:
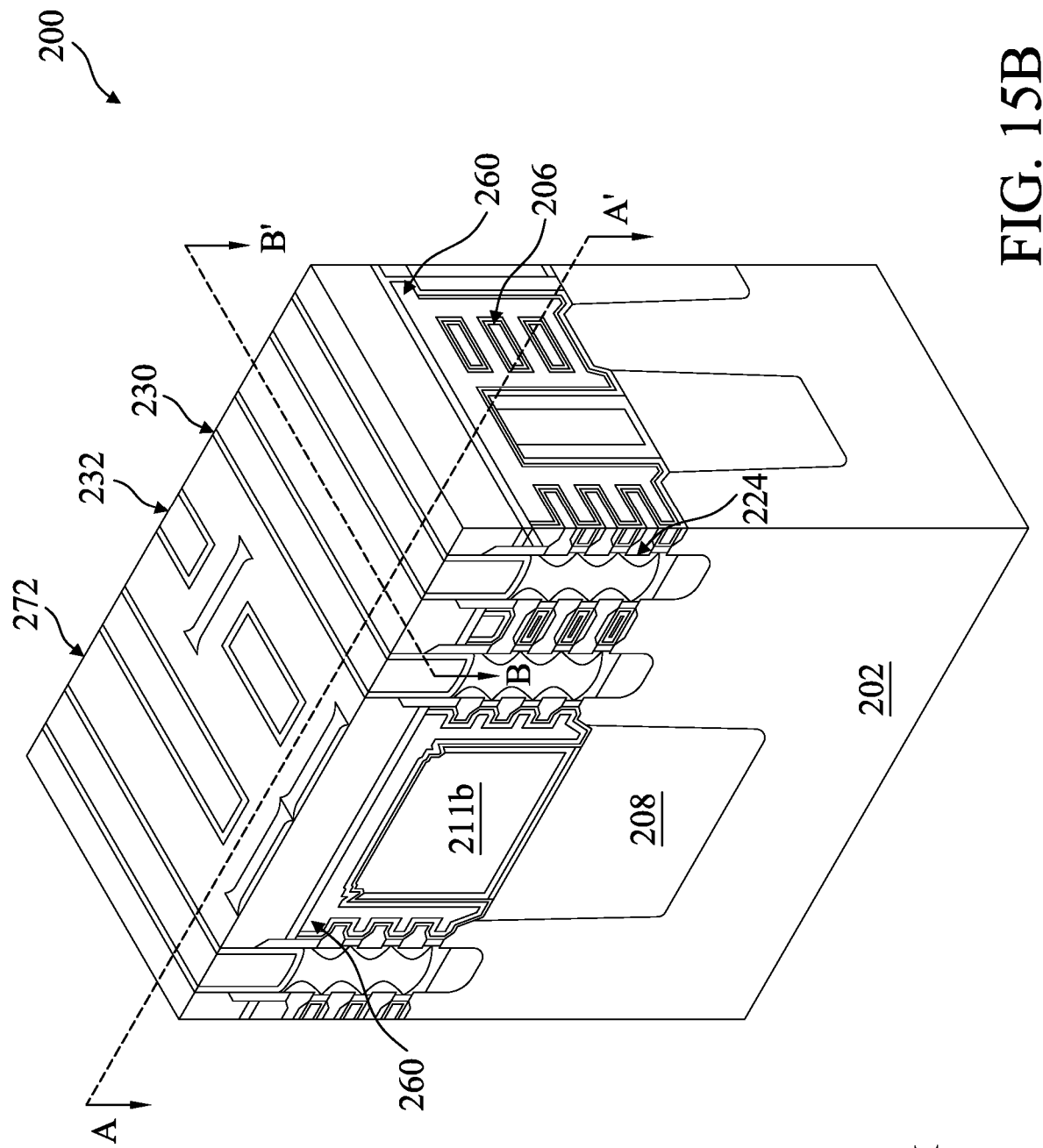
Figure 15C:
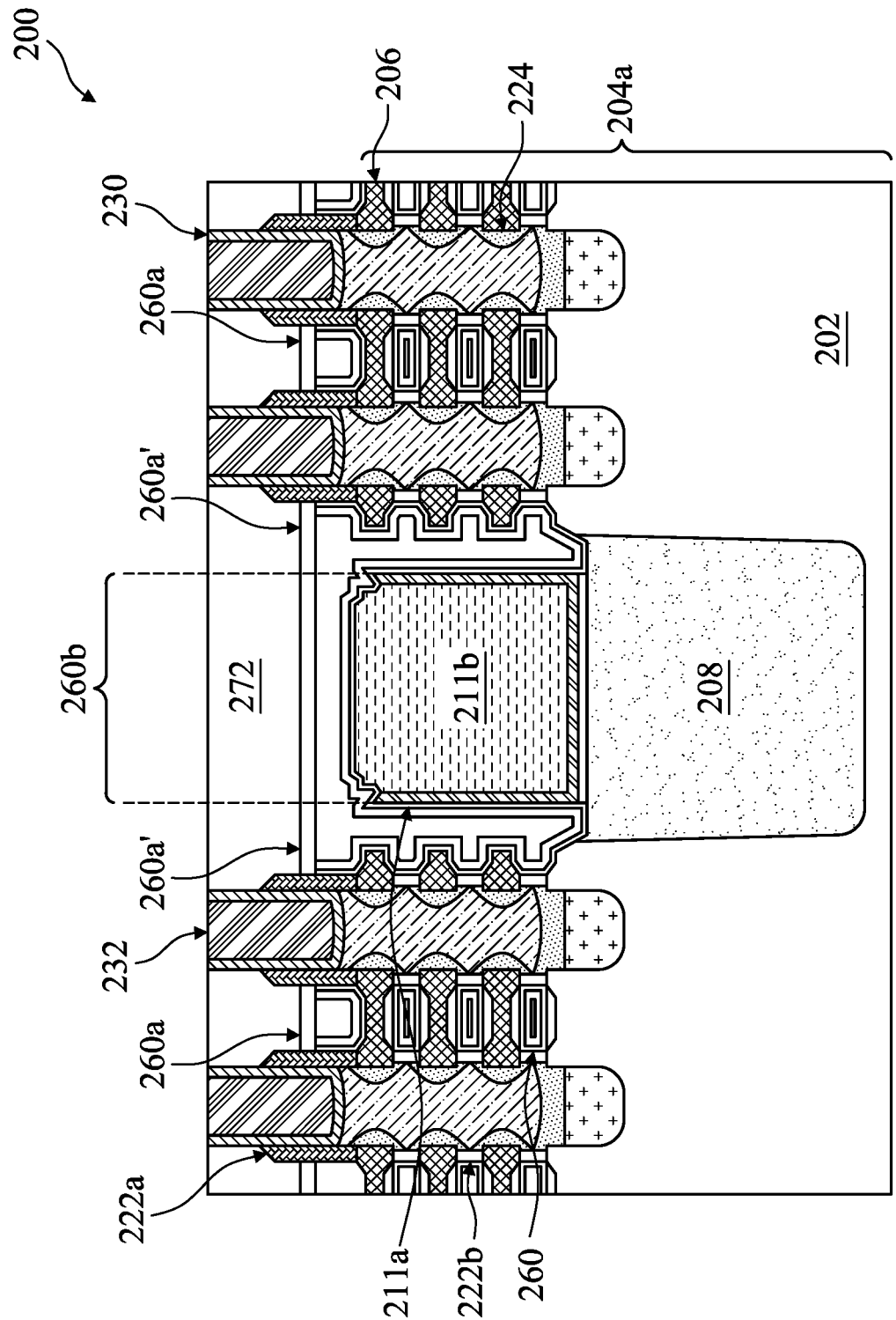
Figure 15D:
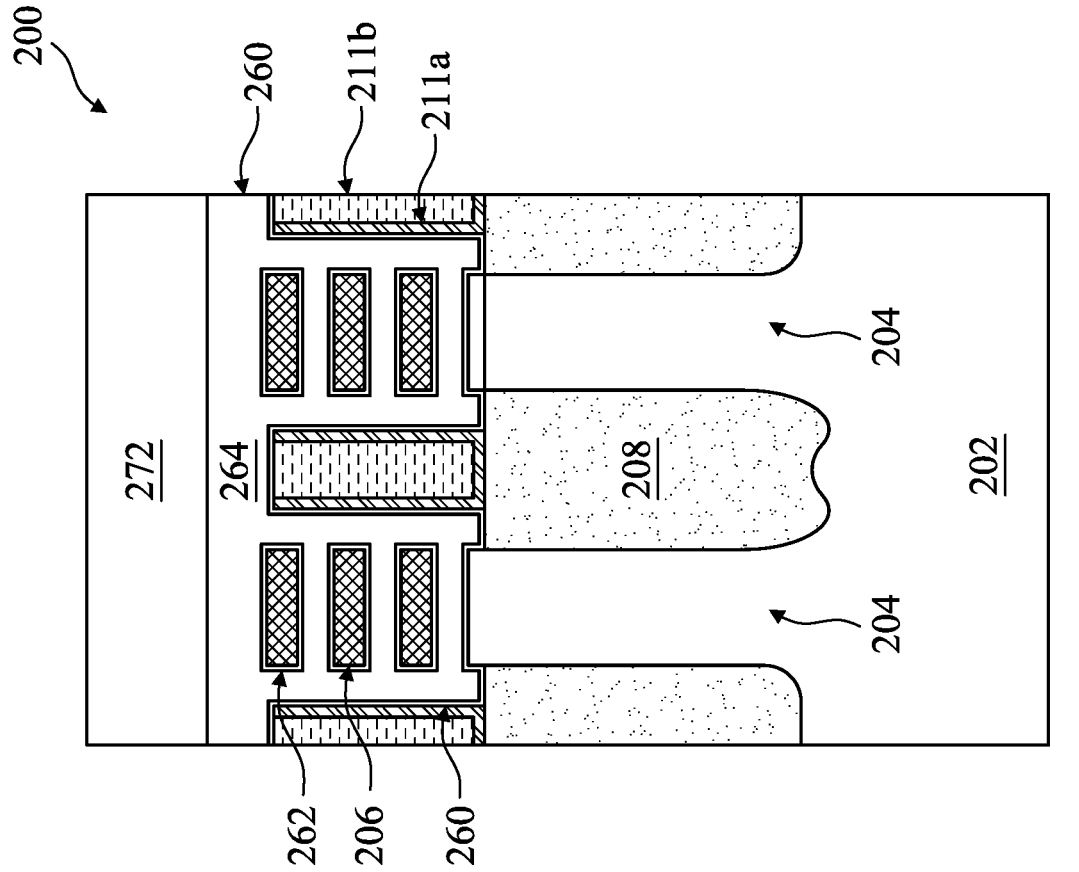
Figure 16A:
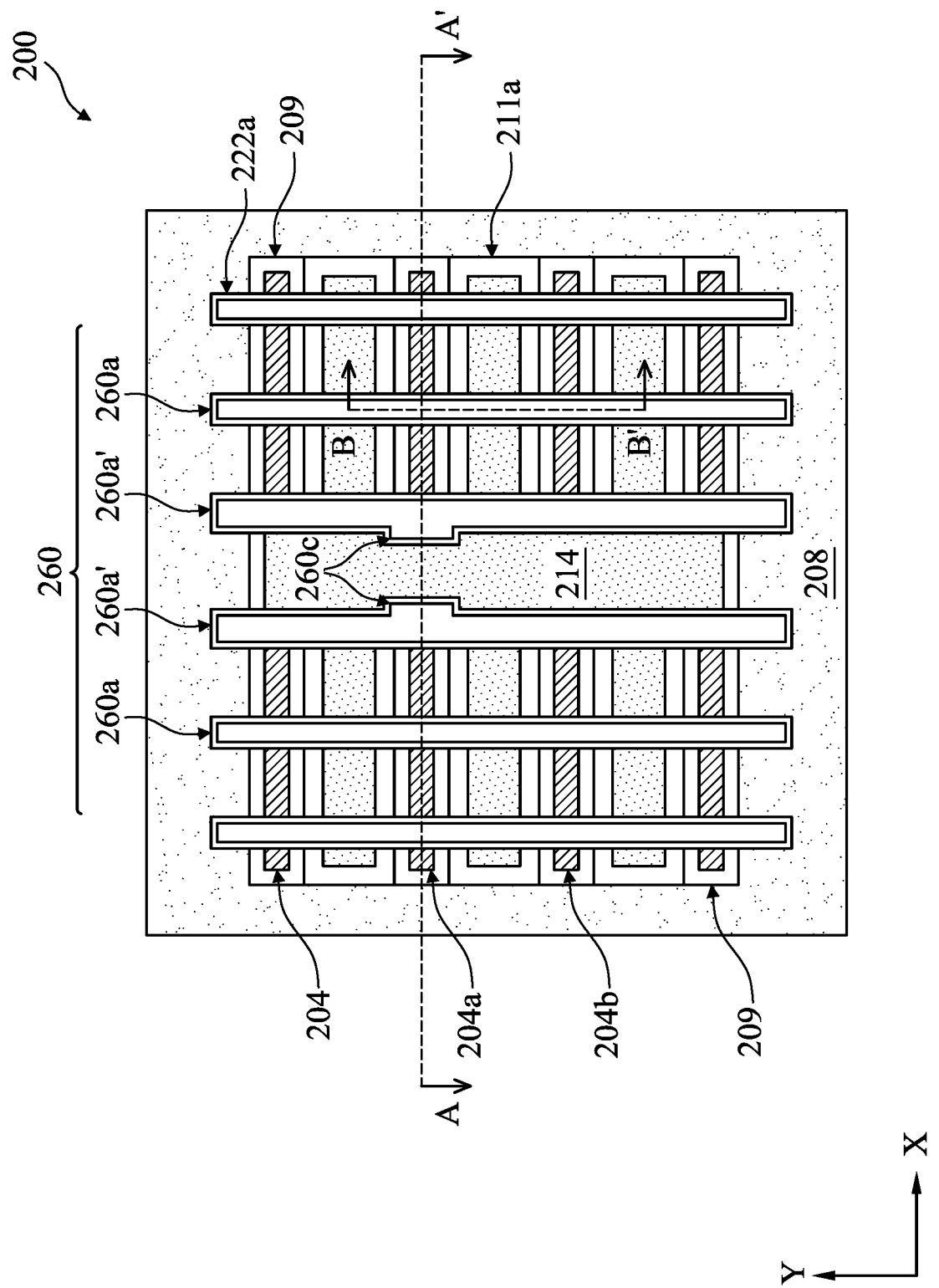
Figure 16B:
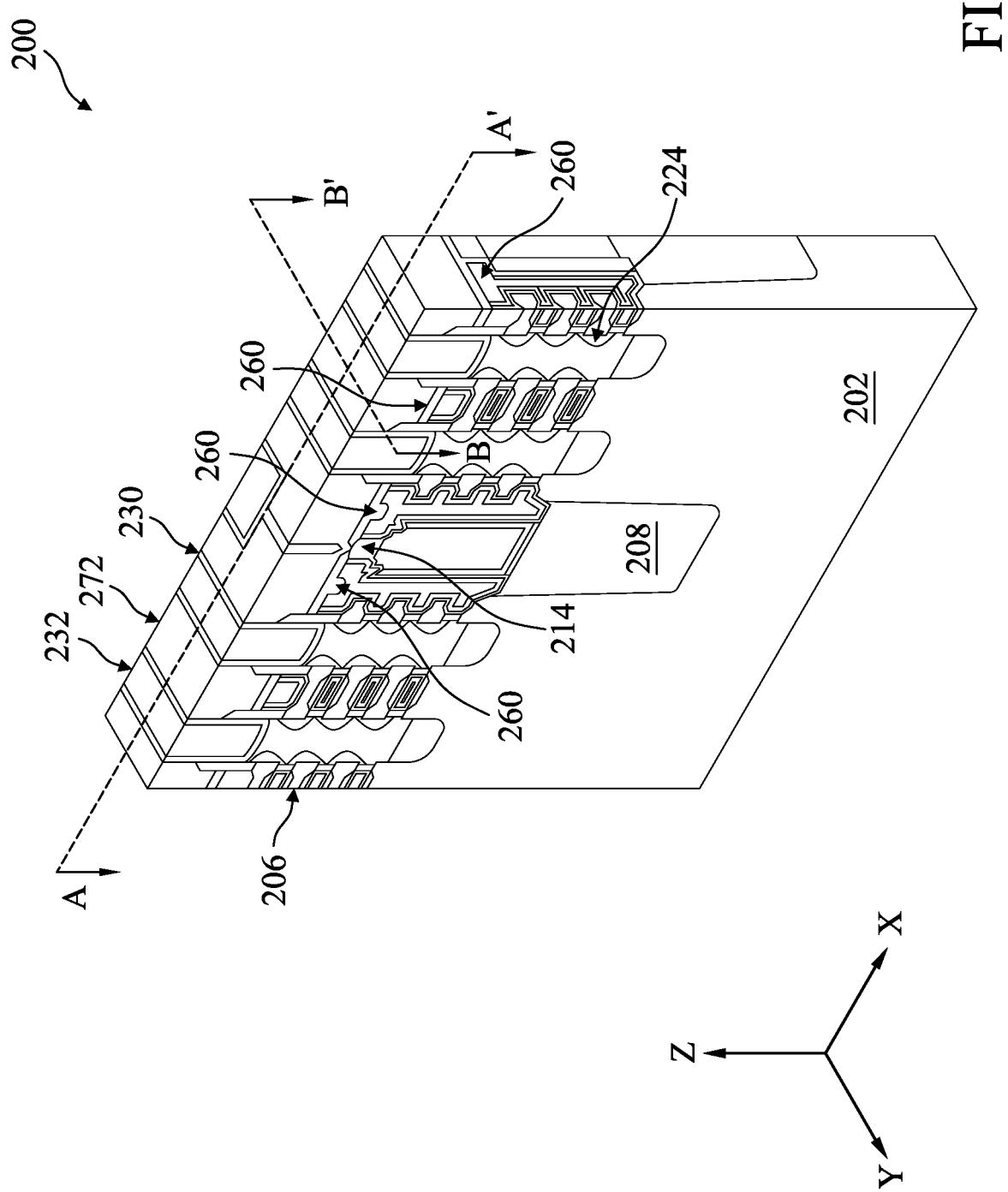
Figure 16C:
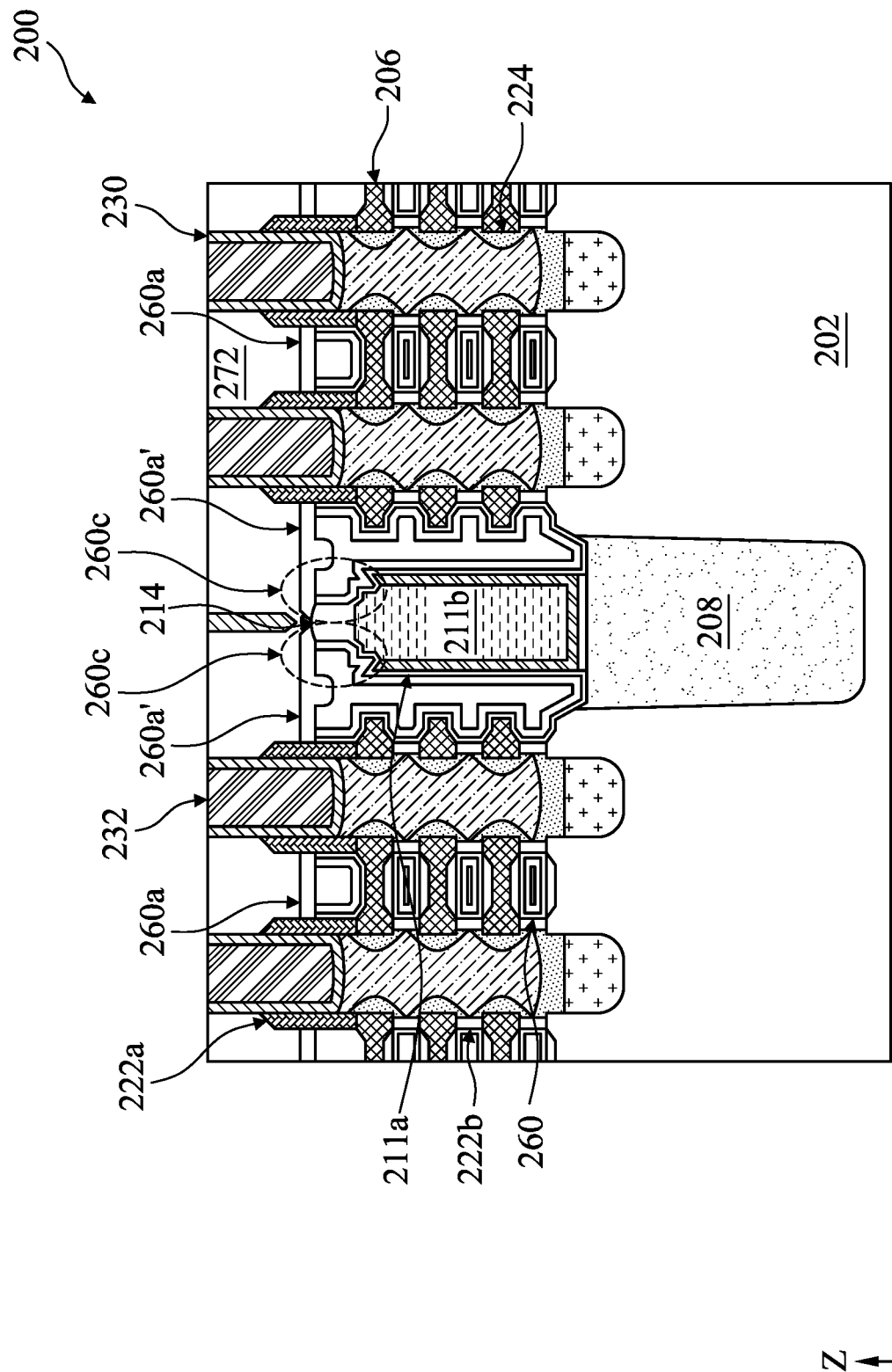
Figure 16D:
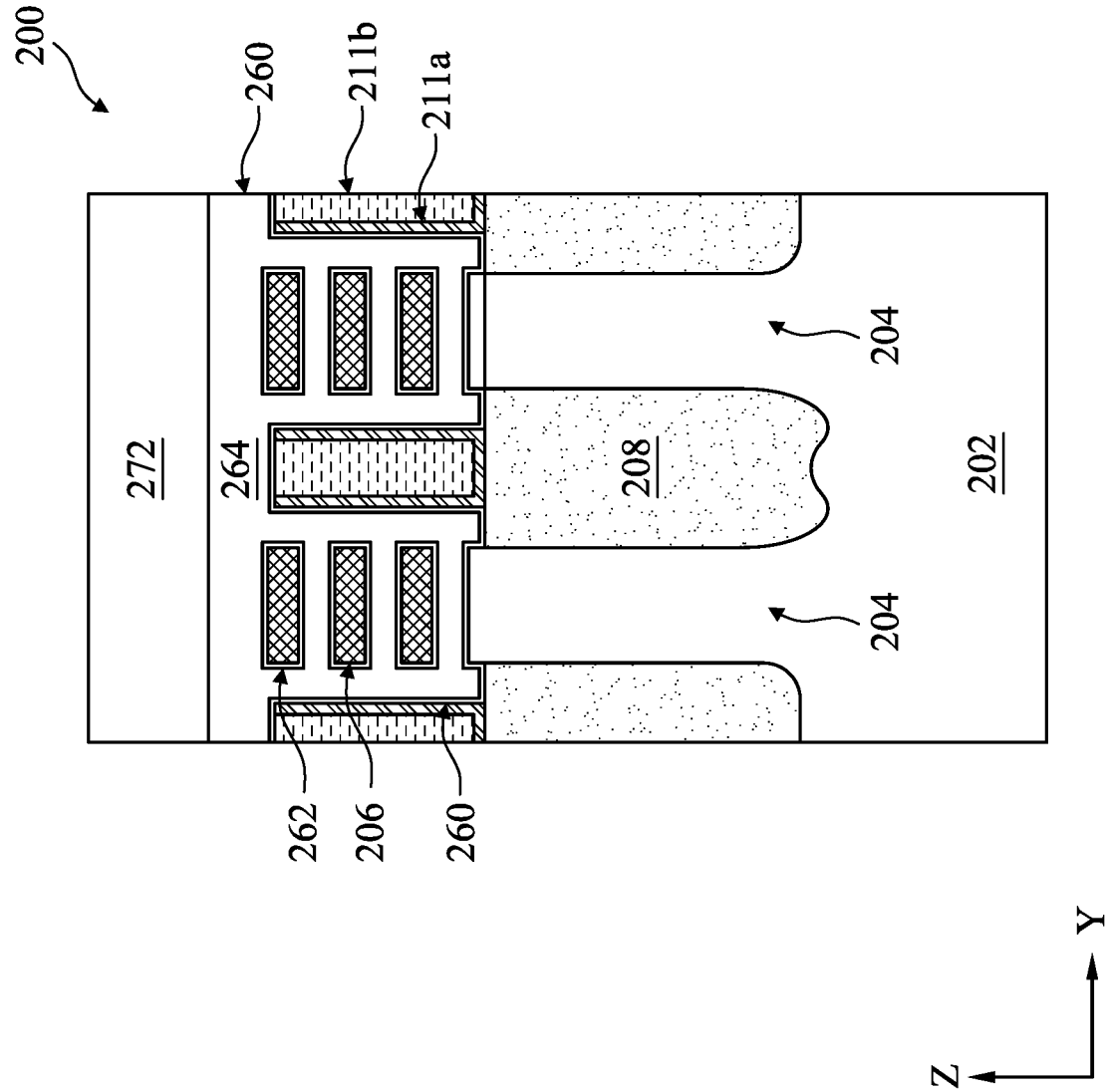

In some embodiments, referring to FIGS. 15D and 16D, the metal gate structure 260 includes a gate dielectric layer 262 and a metal gate electrode 264 over the gate dielectric layer. The gate dielectric layer 262 may include a high-k dielectric material, such as $HfO_2$, $La_2O_3$, other suitable materials, or combinations thereof. The metal gate electrode 264 includes at least one work function metal layer and a bulk conductive layer disposed thereover. The work function metal layer may be a p-type or an n-type work function metal layer. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, other suitable work function metals, or combinations thereof. The bulk conductive layer may include Co, W, Ru, Cu, Al, Ti, Ni, Au, Pt, Pd, other suitable materials, or combinations thereof. The metal gate structure 260 may further include other material layers (not depicted), such as an interfacial layer disposed on surfaces of the channel layers 206, a capping layer, a barrier layer, other suitable layers, or combinations thereof. Various layers of the metal gate structure 260 may be formed by various methods including, for example, ALD, CVD, PVD, plating, other suitable methods, or combinations thereof. After forming the bulk conductive layer, one or more CMP processes are performed to remove excessive material formed on top surface of the ILD layer 232, thereby planarizing the structure 200.

In some embodiments, still referring to FIGS. 15A-16D, method 100 subsequently recesses the metal gate structure 260 to form a trench (not depicted), such that any remaining portions of the dielectric helmet 214 protrude from and separate (or cut) the recessed metal gate structure 260 into multiple portions. Thereafter, method 100 deposits a dielectric layer 272 over the structure 200 to fill the trench. In some embodiments, the dielectric layer 272 is configured to provide self-alignment capability and etching selectivity during subsequent fabrication processes including, for example, patterning the ILD layer 232 to form S/D contact openings (not depicted) over the epitaxial S/D features 224. Accordingly, in the present embodiments, the dielectric layer 272 has a composition different from that of the ILD layer 232. In some embodiments, the dielectric layer 272 includes SiN, SiCN, SiOC, SION, SiOCN, SiO and/or $SiO_2$, other suitable materials, or combinations thereof. The dielectric layer 272 may be deposited by any suitable method, such as ALD, CVD, PVD, other suitable methods, or combinations thereof. Subsequently, method 100 removes portions of the dielectric layer 272 formed over the ILD layer 232 in one or more CMP process, thereby planarizing the top surface of the structure 200.

Thereafter, method 100 at operation 120 performs additional fabrication processes to the structure 200, such as forming a multi-layer interconnect (MLI) structure (not depicted) thereover. The MLI may include various interconnect features, such as vias and conductive lines, disposed in dielectric layers, such as ESLs and ILD layers. In some embodiments, the vias are vertical interconnect features configured to interconnect a device-level contact, such as an S/D contact (not depicted) or a gate contact (not depicted), with a conductive line or interconnect different conductive lines, which are horizontal interconnect features. The ESLs and the ILD layers of the MLI may have substantially same compositions as those discussed above with respect to the ESL 230 and the ILD layer 232, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Although not intended to be limiting, one or more embodiments of the present disclosure provide many benefits to a semiconductor device and the formation thereof. For example, the present disclosure provides methods of reducing or eliminating the growth of epitaxial mushroom defect, avoiding MG-MD shorting, and/or pitting in epitaxial S/D features by forming jog structures extending from dummy gate stacks disposed over edges of semiconductor fins. In some embodiments, the jog structures bridge two adjacent dummy gate stacks over a dielectric helmet, which is disposed along the edges of the semiconductor fins. In some embodiments, the jog structures include two protruding portions each extending from two adjacent dummy gate stacks in opposite directions without coalescing together to completely cover the dielectric helmet. In the present embodiments, the jog structures at least partially remain over the semiconductor fins as portions of a metal gate structure after preforming a gate replacement process. Embodiments of the present disclosure ensure that at least portions of the dielectric helmet are covered by the jog structures to offset adverse effects caused by inadvertent overlay shift when patterning to form the dummy gate stacks.

In one aspect, the present disclosure provides a method that includes forming a fin protruding from a semiconductor substrate, where the fin is oriented lengthwise along a first direction and includes a stack of alternating first semiconductor layers and second semiconductor layers, forming a trench to separate the fin, where the trench is oriented lengthwise along a second direction perpendicular to the first direction, forming a dielectric helmet in the trench, forming a dummy gate structure over the dielectric helmet, forming source/drain (S/D) features in the fin, and forming a metal gate structure in place of the dummy gate structure and the second semiconductor layers. In the present embodiments, the dummy gate structure includes a first portion disposed over the fin and oriented lengthwise along the second direction, a second portion disposed parallel to the first portion and adjacent to a sidewall of the isolation structure, and a third portion extending from the second portion and over a top surface of the dielectric helmet.

In another aspect, the present disclosure provides a method that includes forming fins protruding from a substrate and separated by a first trench, where each fin includes a stack of alternating channel layers and non-channel layers, patterning the fins to form a second trench that is oriented lengthwise perpendicular to the fins, forming a cladding layer along a sidewall of each fin exposed in the first trench and the second trench, forming an isolation structure over the cladding layer to fill the first trench and the second trench, forming a dielectric feature over the isolation structure, where the dielectric feature protrudes from the fins, forming a dummy gate structure, forming a source/drain feature adjacent to the first portion of the dummy gate structure, and replacing the dummy gate structure, the non-channel layers, and the cladding layer with a metal gate structure. In the present embodiments, forming the dummy gate structure includes forming a first portion disposed over the cladding layer and adjacent to a first sidewall of the dielectric feature and forming a second portion connected to the second portion and disposed over a top surface of the dielectric feature.

In yet another aspect, the present disclosure provides a semiconductor structure that includes a fin extending from a substrate and oriented lengthwise in a first direction, where the fin includes a stack of semiconductor layers, an isolation feature disposed over the substrate and oriented lengthwise in a second direction perpendicular to the first direction, where the isolation feature is disposed adjacent to the fin, and a metal gate structure having a top portion disposed over the stack of semiconductor layers and a bottom portion interleaved with the stack of semiconductor layers. In the present embodiments, a sidewall of the bottom portion of the metal gate structure is defined by a sidewall of the isolation feature, and the top portion of the metal gate structure laterally extends over a top surface of the isolation feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a fin extending from a substrate and oriented lengthwise in a first direction, wherein the fin includes a stack of semiconductor layers;
   an isolation feature disposed over the substrate and oriented lengthwise in a second direction perpendicular to the first direction, wherein the isolation feature is disposed adjacent to the fin;
   a metal gate structure having a top portion disposed over the stack of semiconductor layers and a bottom portion interleaved with the stack of semiconductor layers, wherein a sidewall of the bottom portion of the metal gate structure is defined by a first sidewall of the isolation feature, and wherein the top portion of the metal gate structure laterally extends over a top surface of the isolation feature along the first direction; and
   a source/drain feature over the fin and adjacent to the bottom portion of the metal gate structure, wherein the bottom portion of the metal gate structure is interposed between the source/drain feature and the isolation feature along the first direction.

2. The semiconductor structure of claim 1, wherein the metal gate structure is a first metal gate structure, the semiconductor structure further comprising a second metal gate structure having a sidewall defined by a second sidewall of the isolation feature that is opposite to the first sidewall, and wherein the top portion of the first metal gate structure completely extends over the top surface of the isolation feature along the first direction to connect with a top portion of the second metal gate structure.

3. The semiconductor structure of claim 1, further comprising a dielectric helmet disposed over the isolation feature, wherein the dielectric helmet defines a sidewall of the top portion of the metal gate structure.

4. The semiconductor structure of claim 3, wherein a dielectric constant of the isolation feature is less than a dielectric constant of the dielectric helmet.

5. The semiconductor structure of claim 1, wherein the isolation feature includes a bottom portion embedded in the substrate and a top portion disposed over the bottom portion, and wherein the top portion differs from the bottom portion in composition.

6. The semiconductor structure of claim 5, wherein the top portion of the isolation feature includes a first sublayer and a second sublayer having different compositions, wherein the first sublayer is embedded in the second sublayer and spaced apart from the bottom portion of the isolation feature by the second sublayer.

7. A method, comprising:
   forming a fin protruding from a semiconductor substrate, wherein the fin is oriented lengthwise along a first direction, and wherein the fin includes a stack of alternating first semiconductor layers and second semiconductor layers;
   forming a trench to separate the fin, wherein the trench is oriented lengthwise along a second direction perpendicular to the first direction;
   forming an isolation structure in the trench;
   forming a dielectric helmet over the isolation structure;
   forming a dummy gate structure over the dielectric helmet, wherein a first portion of the dummy gate structure is disposed over the fin and oriented lengthwise along the second direction, wherein a second portion of the dummy gate structure is disposed parallel to and spaced apart from the first portion and adjacent to a sidewall of the isolation structure, and wherein a third portion of the dummy gate structure extends from the second portion along the first direction and is disposed over a top surface of the dielectric helmet;
   forming source/drain (S/D) features in the fin; and
   forming a metal gate structure in place of the dummy gate structure and the second semiconductor layers.

8. The method of claim 7, wherein the first portion and the second portion of the dummy gate structure are separated by a pitch P, and wherein the trench is formed to a width W that is about nP, n being a positive integer.

9. The method of claim 7, wherein the third portion of the dummy gate structure extends to completely cover the top surface of the dielectric helmet.

10. The method of claim 7, wherein the isolation structure is a first isolation structure, the method further comprising, before forming the first isolation structure:
    forming a second isolation structure to partially fill the trench; and
    forming a cladding layer along a sidewall of the fin exposed in the trench and over the second isolation structure, such that the first isolation structure is formed over the cladding layer.

11. The method of claim 7, wherein the fin is a first fin and the trench is a first trench, wherein forming the first fin also forms a second fin oriented along the first direction and separated from the first fin by a second trench that is oriented along the first direction, and wherein the isolation structure is formed in both the first trench and the second trench.

12. The method of claim 7, wherein the third portion of the dummy gate structure extends to partially cover the top surface of the dielectric helmet, wherein the second portion of the dummy gate structure is interposed between the S/D features and the isolation structure along the first direction.

13. The method of claim 12, wherein each of the first portion and the second portion of the dummy gate structure spans along the first direction a width CD, and wherein the third portion spans along the first direction a width W3 that is less than the width CD.

14. A method, comprising:
    forming fins protruding from a substrate and separated by a first trench, wherein each fin includes a stack of alternating channel layers and non-channel layers;
    patterning the fins to form a second trench that is oriented lengthwise perpendicular to the fins;
    forming a cladding layer along a sidewall of each fin exposed in the first trench and the second trench;
    forming an isolation structure over the cladding layer to fill the first trench and the second trench;
    forming a dielectric feature over the isolation structure, wherein the dielectric feature protrudes from the fins;
    forming a dummy gate structure, including:
       forming a first portion disposed over the cladding layer and adjacent to a first sidewall of the dielectric feature; and
       forming a second portion protruding from the first portion along a direction parallel to the fins and disposed over a top surface of the dielectric feature;
    forming a source/drain feature adjacent to the first portion of the dummy gate structure; and
    replacing the dummy gate structure, the non-channel layers, and the cladding layer with a metal gate structure.

15. The method of claim 14, wherein the isolation structure is a first isolation structure, the method further comprising forming a second isolation structure to partially fill the first trench and the second trench before forming the cladding layer.

16. The method of claim 14, wherein the dielectric feature has a first width and the second portion of the dummy gate structure has a second width, and wherein the second width is the same as the first width.

17. The method of claim 14, wherein the dummy gate structure includes a third portion disposed adjacent to a second sidewall of the dielectric feature that is opposite to the first sidewall, and wherein the second portion extends over the dielectric feature to connect with the third portion of the dummy gate structure.

18. The method of claim 14, wherein the second portion is formed to have rounded edges in a planar top view.

19. The method of claim 14, wherein the dielectric feature has a first width and the second portion of the dummy gate structure has a second width, and wherein the first width is greater than the second width.

20. The method of claim 19, wherein the first portion of the dummy gate structure has a third width, and wherein the second width is less than the third width.

\* \* \* \* \*